United States Patent
Augusto

(10) Patent No.: US 7,023,030 B2
(45) Date of Patent: *Apr. 4, 2006

(54) MISFET

(75) Inventor: Carlos Augusto, Lisboa (PT)

(73) Assignee: Quantum Semiconductor, LLC, San Jose, CA (US)

(*) Notice: Subject to any disclaimer, the term of this patent is extended or adjusted under 35 U.S.C. 154(b) by 33 days.

This patent is subject to a terminal disclaimer.

(21) Appl. No.: 10/725,830

(22) Filed: Dec. 1, 2003

(65) Prior Publication Data

US 2005/0072988 A1    Apr. 7, 2005

Related U.S. Application Data

(63) Continuation-in-part of application No. 09/889,815, filed as application No. PCT/IB00/00235 on Feb. 24, 2000, now Pat. No. 6,674,099.

(60) Provisional application No. 60/121,473, filed on Feb. 24, 1999.

(51) Int. Cl.
*H01L 31/0328* (2006.01)

(52) U.S. Cl. .................. 257/192; 257/19; 257/329; 257/330; 257/331; 257/334; 257/369; 257/382; 257/412; 257/471; 257/485; 257/616; 257/741; 257/744

(58) Field of Classification Search ............ 257/19, 257/20, 192, 329–331, 334, 369, 471, 485, 257/616

See application file for complete search history.

(56) References Cited

U.S. PATENT DOCUMENTS 4,319,263 A * 3/1982 Rao ............................ 257/365
4,665,414 A   5/1987 Koeneke et al. ............. 357/15
5,663,584 A * 9/1997 Welch ......................... 257/288
5,801,398 A   9/1998 Hebiguchi .................... 257/66

(Continued)

FOREIGN PATENT DOCUMENTS

EP    0749162 A2    12/1996

OTHER PUBLICATIONS

Chowdhury R. et al.; "Pulsed Laser"; Mar. 7, 1994; Applied Physics Letters, vol. 64, pp. 1236-1238.

*Primary Examiner*—Gene M. Munson
(74) *Attorney, Agent, or Firm*—Rutan & Tucker, LLP

(57) ABSTRACT

A metal insulator semiconductor field effect transistor (MISFET) is disclosed comprising a source layer being made with a material having a source band-gap (EG2) and a source mid-gap value (EGM2), the source layer having a source Fermi-Level (EF2). A drain layer has a drain Fermi-Level (EF4). A channel layer is provided between the source layer and the drain layer, the channel layer being made with a material having a channel band-gap (EG3) and a channel mid-gap value (EGM3), the channel layer having a channel Fermi-Level (EF3). A source contact layer is connected to the source layer opposite the channel layer, the source contact layer having a source contact Fermi-Level (EF1). A gate electrode has a gate electrode Fermi-Level (EF6). The source band-gap is substantially narrower (EG2) than the channel band-gap (EG3). The source contact Fermi-Level (EF1), the source Fermi-Level (EF2), the channel Fermi-Level (EF3), the drain Fermi-Level (EF4) and the gate electrode Fermi-Level (EF6) are equal to the source mid-gap value (EGM2) and the channel mid-gap value (EGM3), within a predetermined tolerance value, when no voltage is applied to the device.

17 Claims, 72 Drawing Sheets

U.S. PATENT DOCUMENTS 6,207,977 B1 * 3/2001 Augusto ............... 257/192
6,268,636 B1 * 7/2001 Welch ................ 257/476
6,403,976 B1 * 6/2002 Saitoh et al. ............ 257/19
6,674,099 B1 * 1/2004 Augusto ............... 257/192

* cited by examiner

Figure 9: 4-Input CMOS "NOR" Logic Gates

Figur 9a:
Static Source Voltage Supply (separate "NMOS" and "PMOS")

Dynamic Source Voltage Supply (single device as "NMOS" and "PMOS")

MISFET

This is a continuation-in-part of U.S. application Ser. No. 09/889815, filed Aug. 27, 2001, U.S. Pat. No. 6674099, which was the National Stage of International Application No. PCT/IB00/00235 (WO0051165), filed Feb. 24, 2000, which claimed the benefit of U.S. Provisional Application No. 60/121473 filed Feb. 24, 1999, each of which is incorporated herein by reference in its entirety.

FIELD OF THE INVENTION

The field of the invention is metal insulator semiconductor field effect transistors (MISFETs).

BACKGROUND OF THE INVENTION

Complementary Metal-Oxide Semiconductor (CMOS) has been the semiconductor technology of choice since the late 1970's, and in 1998 the 0.25 micron CMOS technology generation is in production. There are many reasons to choose CMOS over other technologies. The most important is the reduced power consumption, because the basic building block of circuits for binary logic, the CMOS "Inverter", only consumes power when changing logic states.

The fundamental factors determining the performance of standard "Planar Technology" are the channel length of the MOSFETs, and the parasitic capacitances. For deep sub-micron CMOS, as the gate lengths get shorter, leakage current tends to get higher, and the overall process technology becomes more complex. Not only the number of processing steps increases, but the complexity and difficulty of some of those steps is also increased. Since to make CMOS circuits, NMOS and PMOS devices are needed, many Front-End processing steps have to be made twice, separately for each device type.

However, CMOS circuits can also be made with other MOSFET architectures, such as Vertical MOSFETs (see reference [1]). The perspectives opened by Vertical MOSFETs are very attractive. That is especially true when considering the technological and fundamental physical limitations facing conventional (Planar) MOSFETs for gate lengths below 100 nm. For Vertical MOSFETs the channel length is defined by the doping and/or heterojunction profiles, made by low temperature epitaxy. Lithography defines the cross section of the devices (channel width), and therefore the density of integration.

The present invention pertains to the field of Complementary Metal-Insulator-Semiconductor Field-Effect Transistors (C-MISFETs). Since the most common insulator is an oxide (silicon dioxide), these devices are almost always designated by Complementary Metal-Oxide-Semiconductor Field-Effect Transistors (C-MOSFETs). More specifically, it pertains to CMOS circuits made with a new kind of Vertical MOSFETs.

The present invention, introduces a MOSFET device that behaves as N- or P-type transistor, depending only on the applied bias. Setting of the source voltage supply, determines if the device will behave as a NMOS or as a PMOS. For positive drain to source (VDS) and gate to source (VGS) voltages, the device behaves as NMOS. For negative drain to source (VDS) and gate to source (VGS) voltages, the same device acts like a PMOS. Therefore, with the device of the present invention it is possible to make complementary circuits (CMOS), even though only a single device type is fabricated, which "a priori" is neither N- or P-type.

The subject of this invention will hereafter be designated by "Single Device Complementary Metal Oxide Semiconductor Field Effect Transistor", or SD-CMOS.

The independence of channel length from lithography, and the kind of doping and/or heterojunction profiles possible with low temperature epitaxy, enables the fabrication of Vertical MOSFETs with channels only tens of nanometers long, and with atomic layer control across the entire wafer. The limitations to make Vertical MOSFETs with very short channel lengths will no longer be technological, but related to device physics.

Vertical MOSFETs have an intrinsic advantage over horizontal MOSFETs: it is straightforward to build an asymmetry of the source to channel junction, versus the channel to drain junction. With horizontal MOSFETs, it is also possible to introduce asymmetry, but that comes at a cost in terms of process complexity (extra masks to differentiate source from drain for each type of device). And in any case, the doping and/or heterojunction profiles (made by ion implantation) can never come close to what low temperature epitaxy has demonstrated.

Like with Horizontal homojunction MOSFETs, Vertical homojunction MOSFETs suffer from Short Channel Effect (SCE), albeit at shorter channel lengths due to the ability to have sharper doping profiles, and therefore reduced depletion widths. Numerical simulations of a "Planar-Doped" Vertical MOSFET with a 50 nm channel length, predict very high performance levels (see reference [2]). But as channel length is further reduced, higher doping levels are needed to keep the electrostatic barrier between source and channel. In the limit, even without any bias (at the drain or gate), the built-in electric field, induces band to band tunneling through the source to channel barrier. Naturally, the necessity of applying drain bias, leads to even stronger scaling limitations due to Drain Induced Barrier Lowering (DIBL). For these reasons, it has been predicted (see reference [1]), that due to SCE and DIBL, the practical limit for how short channels can be, is around 80 nm.

An alternative type of Vertical MOSFETs, the Vertical Heterojunction MOSFETs (VH-MOSFETs), uses heterojunctions instead of homojunctions to build the source to channel electrostatic barrier (see reference [3]). Because the potential barrier is originated by a heterojunction, there is no need to introduce doping in the channel to make the barrier, and therefore the device is, by definition "fully depleted". Also the heterojunction barrier exists across the entire channel thickness, and therefore removes any restriction on the distance between gates. With this device architecture, simulations show that ultra-short channels are possible (down to 10 nm), without suffering from SCE or DIBL (see reference [3]). The device type (NMOS or PMOS) is defined by what type of dopant is incorporated in the source and drain regions.

Numerical simulations of Double-Gate SOI CMOS with 30 nm gate/channel lengths (see reference [4]), predict extraordinary performance levels. A very illustrative parameter is the CMOS ring oscillator delay being less than 1 picosecond. Equal or better performance levels should be expected for the VH-MOSFET with channel lengths like 20 nm for example.

CMOS integration schemes have been proposed (see reference [3]), where the device layers of one device type are stacked on the device layers of the other device type, thereby enabling a single epitaxial growth step, and a common gate stack (gate insulator and gate electrode). Such integration schemes offer the perspective of significant overall front-end process simplification, and area gains, over configurations where NMOS and PMOS transistors would be made "side by side".

Vertical MOSFETs have yet other attractive features. It has been shown how Vertical MOSFETs make possible memory cells, with a quarter of the area of cells made with planar MOSFETs, for the same generation of lithography equipment (see references [5, 6, 7]). For decades, DRAM has driven the progress in process technology. When optical lithography finds its ultimate limitations (believed to be around 100 nm), it is very likely that cells made with Vertical MOSFETs will be seriously considered as viable alternatives to increase the bit density.

However, and assuming that the capability of making Vertical MOSFETs with very short channels is to be fully exploited, it is required to have very low temperature processing (typically, below the temperature at which dopants will start to significantly diffuse and/or strained layers relax). Vertical MOSFETs, regardless of their channel length and particular device layer composition/profile, different device regions like gate, have source and drain lying on different planes. Therefore contacts to these regions (and to gate electrode) must be made by separate sequences of contact hole formation and contact hole filling with a metal.

Recently there has been renewed interest in the use of germanium as the semiconductor material for the fabrication of Complementary Metal-Oxide-Semiconductor (CMOS) devices and circuits [19, 20, 21]. This renewed interest was sparked by the realization that the conventional methods of improving the performance of CMOS devices and circuits are fast approaching insurmountable barriers. These barriers are the scaling limits of silicon-based CMOS, now thought to be at 20 nm gate lengths, using gate insulators with high dielectric constant, also known as "high-k dielectrics", and metal gate electrodes.

It is perceived that in order to increase performance, it is necessary to switch from silicon to germanium, which is very attractive due to its much higher electron mobility (3900 cm2V-1s-1 versus 1500 cm2V-1s-1) and hole mobility (1900 cm2V-1s-1 versus 450 cm2V-1s-1). Germanium is also very attractive due to being a very well known material, in fact used for microelectronics applications before silicon became the material of choice, and to its seamless integration in conventional silicon CMOS processing, as proven by the now widely deployed Silicon-Germanium BiCMOS process technology. Furthermore, some of the technological difficulties faced by silicon-based CMOS for scaling to the 20 nm gate length generation may be easier to overcome with germanium-based CMOS.

One of these difficulties is to achieve and maintain a silicon surface free of the native oxide, with low temperature processing only. This inherent characteristic of silicon was quite useful while silicon-oxide was the gate insulator of choice. It has always been one of the major problems that must to be solved in order to perform epitaxial deposition of silicon-related alloys and/or superlattices, such as silicon-germanium (Sil-xGex), silicon-carbon (Sil-yCy), silicon-germanium-carbon (Sil-x-yGexCy), etc. This has also been a problem for other epitaxially compatible materials such as insulators and conductors. Examples of these materials are: CaF2, CdF2, AlN, Al2O3, CeO2, SrRuO3, BaRuO3, TiN, etc.

Since the times before silicon became the material of choice for CMOS, it has been known that the native germanium-oxide is not stable and can be simply rinsed away. Also, germanium melts at a much lower temperature than silicon (937° C. versus 1415° C.), the electrical activation of ion-implanted dopant species takes place at much lower temperatures (400° C. versus the typical 900° C.), epitaxial growth can also be done at much lower temperatures (300° C. versus the typical 650° C.), formation of metal-germanides takes place at significant lower temperatures than metal-silicides, etc. The overall ability to perform the most critical steps of CMOS processing at much lower temperatures than silicon, enables the incorporation of other materials that presently cannot be integrated during CMOS processing. This opens a new field in monolithic integration with very large potential for added functionality at low cost.

The benefits of a straightforward very low temperature surface preparation suitable for epitaxy of Germanium-based alloys and/or superlattices of for example Gel-xSix, Gel-ySny, Gel-x-ySixSny, and non Germanium-based materials such as BaTiO3 [22], can bring radical changes to device processing and overall CMOS process flow. One of the limitations to fabricating multiple epitaxial devices on silicon substrates, each requiring its separate surface cleaning and layer deposition, is the fact that the high temperature annealing needed to insure good epitaxial growth on the silicon surface, disrupts the "as deposited" heterojunction and doping profiles that had been formed for the previous epitaxial device.

A substrate material that allows good epitaxial growth on surfaces pre-cleaned and/or annealed at very low temperature, enables process flows consisting of multiple sequential epitaxial deposition steps, that can be used to fabricate different devices and/or different portions of a single device, without any impact to any previous heterojunction and/or doping profiles that may already exist on that substrate. This capability is a key element to fabricate multiple epitaxial layers, belonging to one or more devices, having atomically sharp interfaces between homojunctions and/or heterojunctions, and to preserve compositional and/or impurity gradients inside such layers.

In conclusion, switching the CMOS semiconductor material from silicon to germanium substrates brings the following advantages: higher electron mobility, higher hole mobility, very low temperature for annealing ion-implanted doping impurities, and straightforward preparation of surfaces free from native-oxide. This last point has extraordinary benefits for very low temperature surface preparation before epitaxy (selective or non-selective), direct interface between germanium surface and high-k gate insulator, formation of metal-germanides (for Schottky or Ohmic contacts), and for process flows with multiple epitaxial deposition steps.

SUMMARY OF THE INVENTION

It is an object of the present invention to improve the manufacturing process of MISFET's.

This object is achieved by providing a metal insulator semiconductor field effect transistor (MISFET) comprising:
- a source layer being made with a material having a source band-gap (EG2) and a source mid-gap value (EGM2), said source layer having a source Fermi-Level (EF2);
- a drain layer having a drain Fermi-Level (EF4);
- a channel layer between the source layer and the drain layer, said channel layer being made with a material having a channel band-gap (EG3) and a channel mid-gap value (EGM3), said channel layer having a channel Fermi level (EF3);
- a source contact layer connected to the source layer opposite the channel layer, said source contact layer having a source contact Fermi-Level (EF1); and a gate electrode having a gate electrode Fermi-Level (EF6)

wherein:

said source band-gap is substantially narrower (EG2) than said channel band-gap (EG3);

said source contact Fermi-Level (EF1), said source Fermi-Level (EF2), said channel Fermi-Level (EF3), said drain Fermi-Level (EF4) and said gate electrode Fermi-Level (EF6) are equal to said source mid-gap value (EGM2) and said channel mid-gap value (EGM3), within a predetermined tolerance value, when no voltage is applied to the device.

By providing that the Fermi-Levels are substantially equal to the source and the channel mid-gap values, symmetric paths from source to drain for electrons and for holes are created. This allows the device to behave as an NMOS or PMOS, depending on the voltage applied. It substantially improves the manufacturing process of MISFET's, since it is no longer necessary to decide, contrary to known devices hitherto, upon fabrication if the device should behave as NMOS or as PMOS.

The present invention also describes the implementation MISFETs, as described herein, using Germanium substrates. The Germanium substrates can be Germanium bulk wafers, Germanium-On-Insulator (GeOI) wafers, or pure Germanium relaxed layers, also known as "virtual substrates", formed on silicon wafers.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 9a illustrates an implementation of a "NOR" logic gate, where SD-CMOS devices to behave as NMOS and PMOS are made on opposite sides of the "Drain Contact".

DETAILED DESCRIPTION

Figure 1:
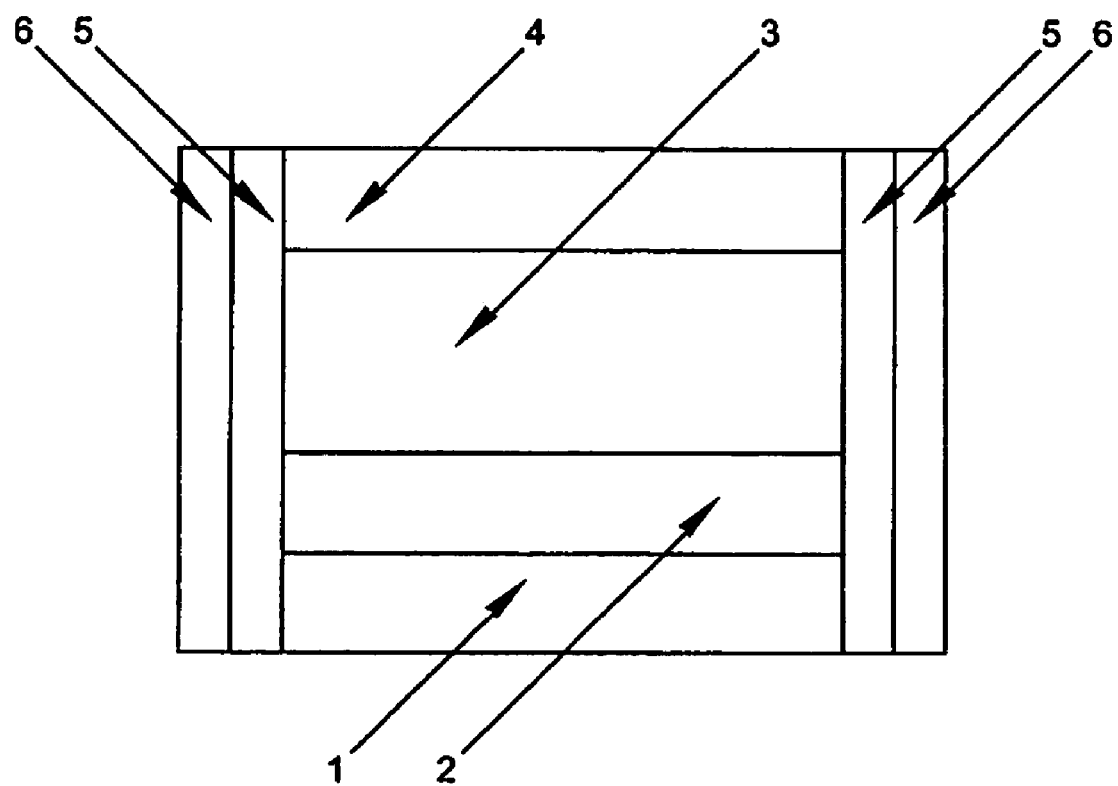
FIG. 1 is a schematic cross section through the layers of one preferred embodiment of the device according to the invention.

In FIG. 1, showing a schematic cross section of the device, the following layers may be distinguished:

Layer 1 is the contact to the Source: metal with work-function or Fermi-Level in the middle of the band-gap of the Source material.

Layer 2 is the Source: "narrow" band-gap material, with its mid-gap point aligned with the mid-gap point of the channel material, resulting in similar offsets in the conduction and valence bands, with respect to the channel material.

Layer 3 is the channel: "wide" band-gap material.

Layer 4 is the Drain: metal with a work-function or Fermi-Level in the middle of the gap of the channel material.

Layer 5 is the Gate insulator.

Layer 6 is the Gate electrode: conductor with Fermi-Level in the middle of the gap of the channel material.

Layers 1, 4, and 6, can be of the same material.

Figure 2A:
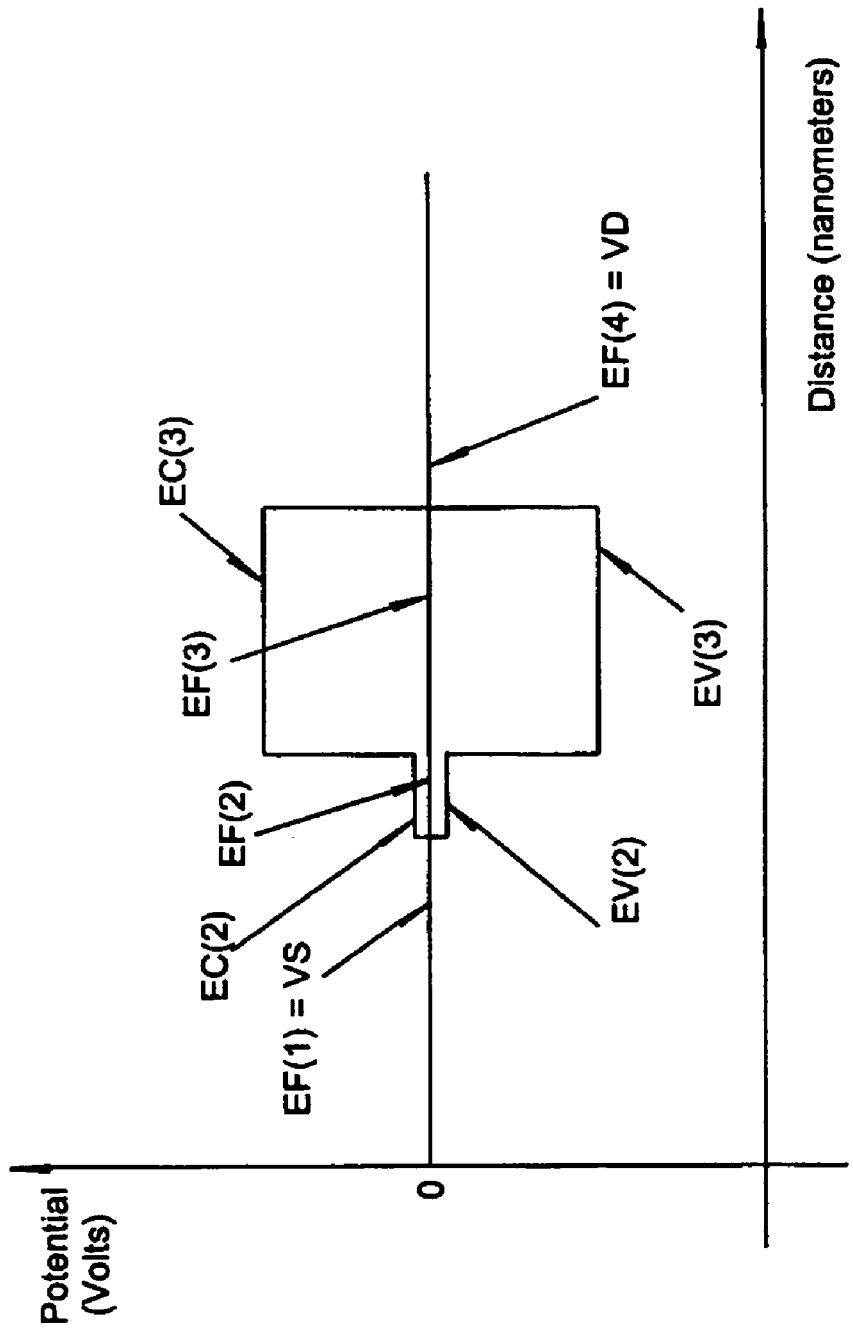
FIGS. 2a, 2b and 2c are schematic band alignments, along a vertical section from Source to Drain in the device of FIG. 1, near the interface with the Gate insulator, for different Drain and Gate bias conditions, when the device is used as an N-MOS.

In FIG. 2a, a band diagram of the device is shown when no voltage is applied, in other words the drain to source voltage and the gate to source voltage are both equal to zero.

FIG. 2a

EF(1) is the Fermi-Level in material 1.
EF(2) is the Fermi-Level in material 2.
EC(2) is the conduction band edge of material 2.
EV(2) is the valence band edge of material 2.
EF(3) is the Fermi-Level in material 3.
EC(3) is the conduction band edge of material 3.
EV(3) is the valence band edge of material 3.
EF(4) is the Fermi-Level in material 4.
VS is the potential at the Source.
VD is the potential at the Drain.

FIG. 2b

VDS>0, VGS=0
EF(1) is the Fermi-Level in material 1
EF(2) is the Fermi-Level in material 2
EC(2) is the conduction band edge of material 2
EV(2) is the valence band edge of material 2
EF(3) is the Fermi-Level in material 3
EC(3) is the conduction band edge of material 3
EV(3) is the valence band edge of material 3
EF(4) is the Fermi-Level in material 4
VS is the potential at the Source.
VD is the potential at the Drain.
VDS (=VS−VD) is the difference of potential between Source and Drain.
VGS (=VS−VG) is the difference of potential between Source and Gate.

FIG. 2c

VDS>0, VGS>0
EF(1) is the Fermi-Level in material 1
EF(2) is the Fermi-Level in material 2
EC(2) is the conduction band edge of material 2
EV(2) is the valence band edge of material 2
EF(3) is the Fermi-Level in material 3
EC(3) is the conduction band edge of material 3
EV(3) is the valence band edge of material 3
EF(4) is the Fermi-Level in material 4
VS is the potential at the Source.
VD is the potential at the Drain.
VDS (=VS−VD) is the difference of potential between Source and Drain.
VGS (=VS−VG) is the difference of potential between Source and Gate.
ECn(2) is the region of the conduction band of material 2, that is below the EF(2), as an effect of positive Gate to Source voltage (VGS>0).

FIG. 3a

VDS=0, VGS=0.
EF(1) is the Fermi-Level in material 1
EF(2) is the Fermi-Level in material 2
EC(2) is the conduction band edge of material 2
EV(2) is the valence band edge of material 2
EF(3) is the Fermi-Level in material 3
EC(3) is the conduction band edge of material 3
EV(3) is the valence band edge of material 3
EF(4) is the Fermi-Level in material 4 VS is the potential at the Source.
VD is the potential at the Drain.
VDS (=VS−VD) is the difference of potential between Source and Drain.
VGS (=VS−VG) is the difference of potential between Source and Gate.

FIG. 3b

VDS<0, VGS=0.
EF(1) is the Fermi-Level in material 1
EF(2) is the Fermi-Level in material 2
EC(2) is the conduction band edge of material 2
EV(2) is the valence band edge of material 2
EF(3) is the Fermi-Level in material 3
EC(3) is the conduction band edge of material 3
EV(3) is the valence band edge of material 3
EF(4) is the Fermi-Level in material 4
VS is the potential at the Source.
VD is the potential at the Drain.
VDS (=VS−VD) is the difference of potential between Source and Drain.
VGS (=VS−VG) is the difference of potential between Source and Gate.

FIG. 3c

VDS<0, VGS<0.
EF(1) is the Fermi-Level in material 1
EF(2) is the Fermi-Level in material 2
EC(2) is the conduction band edge of material 2
EV(2) is the valence band edge of material 2
EF(3) is the Fermi-Level in material 3
EC(3) is the conduction band edge of material 3
EV(3) is the valence band edge of material 3
EF(4) is the Fermi-Level in material 4
VS is the potential at the Source.
VD is the potential at the Drain.
VDS (=VS−VD) is the difference of potential between Source and Drain.
VGS (=VS−VG) is the difference of potential between Source and Gate.
ECn(2) is the region of the valence band of material 2, that is above the EF(2), as an effect of negative Gate to Source voltage (VGS<0).

Figure 2B:
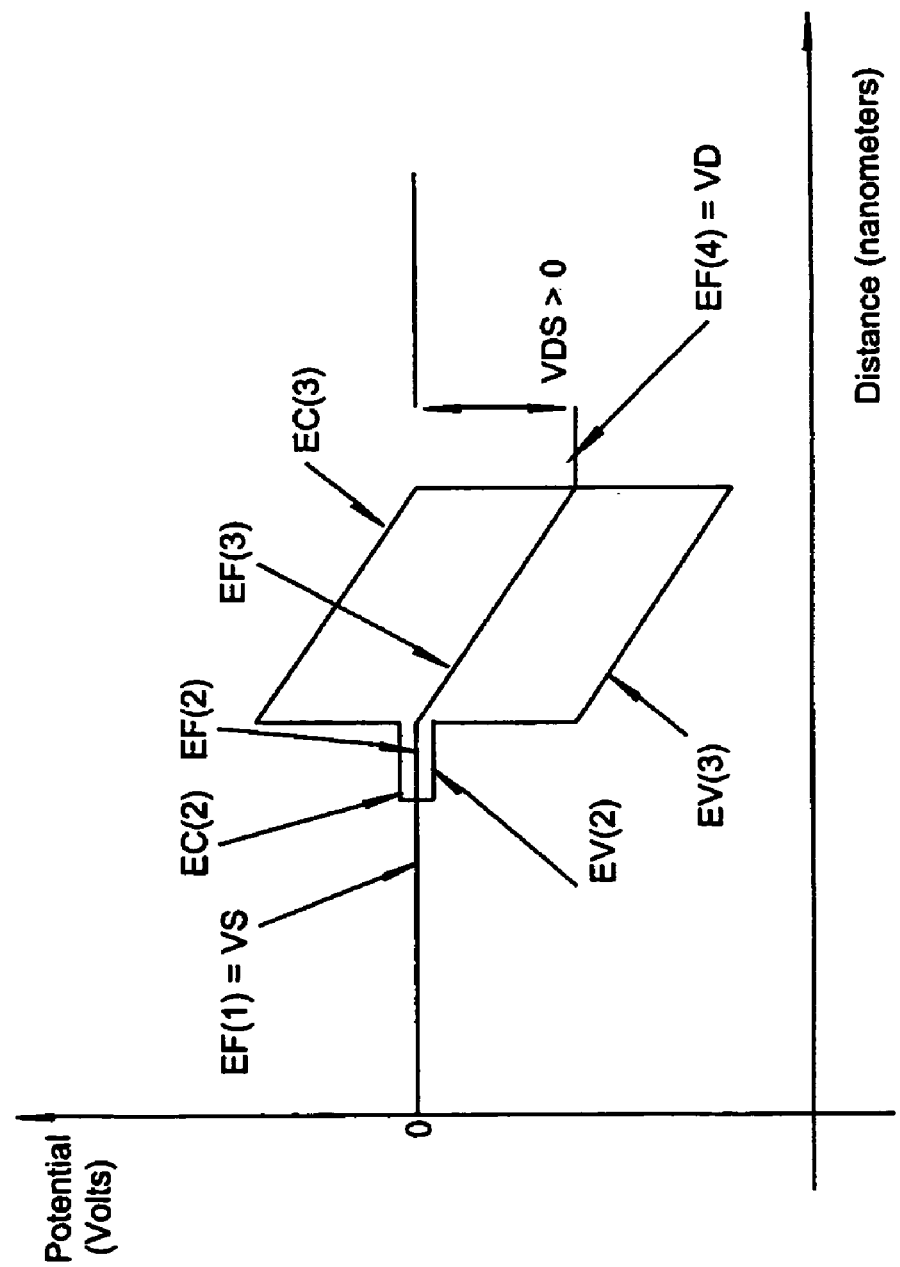
Figure 2C:
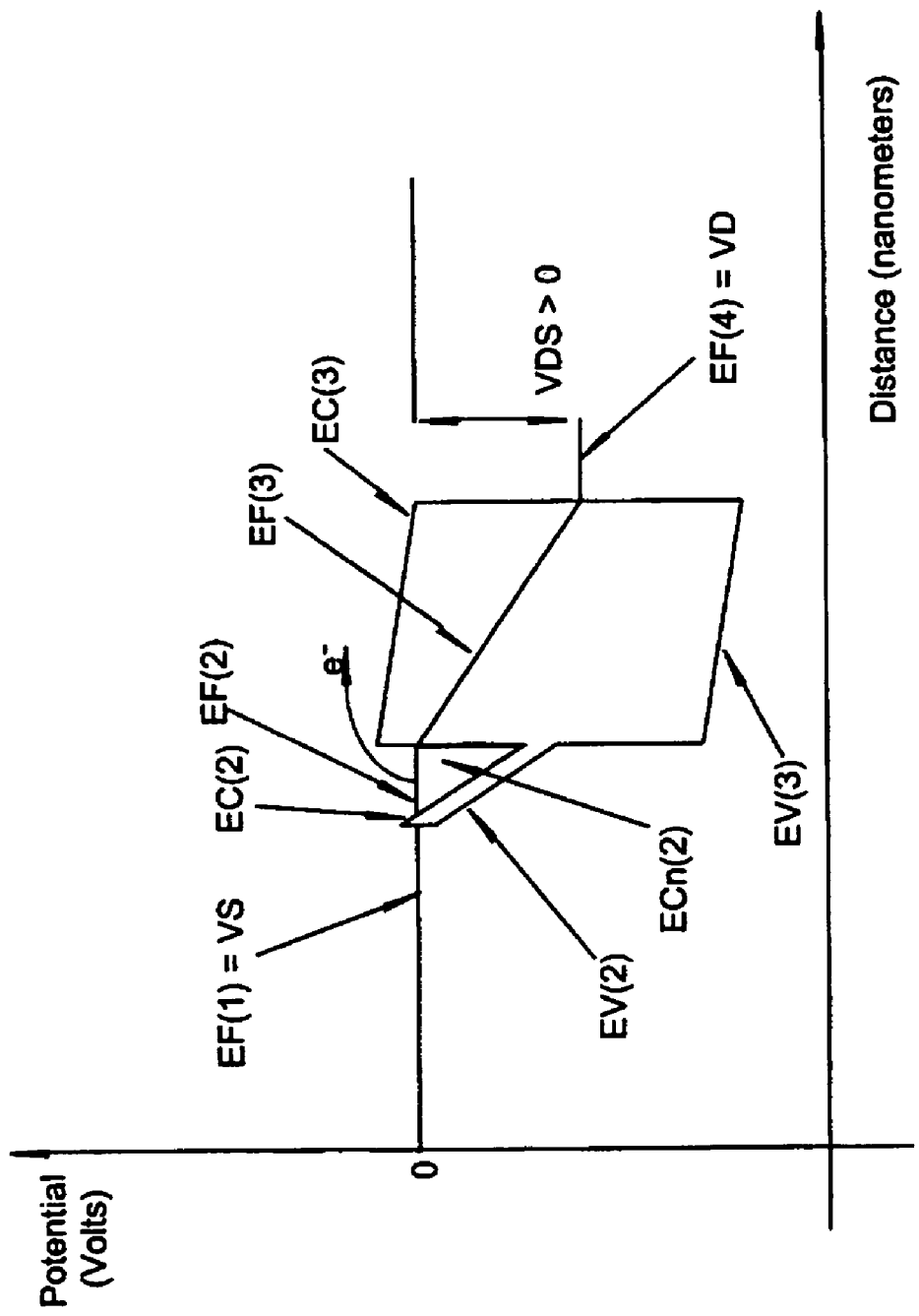
Figure 3A:
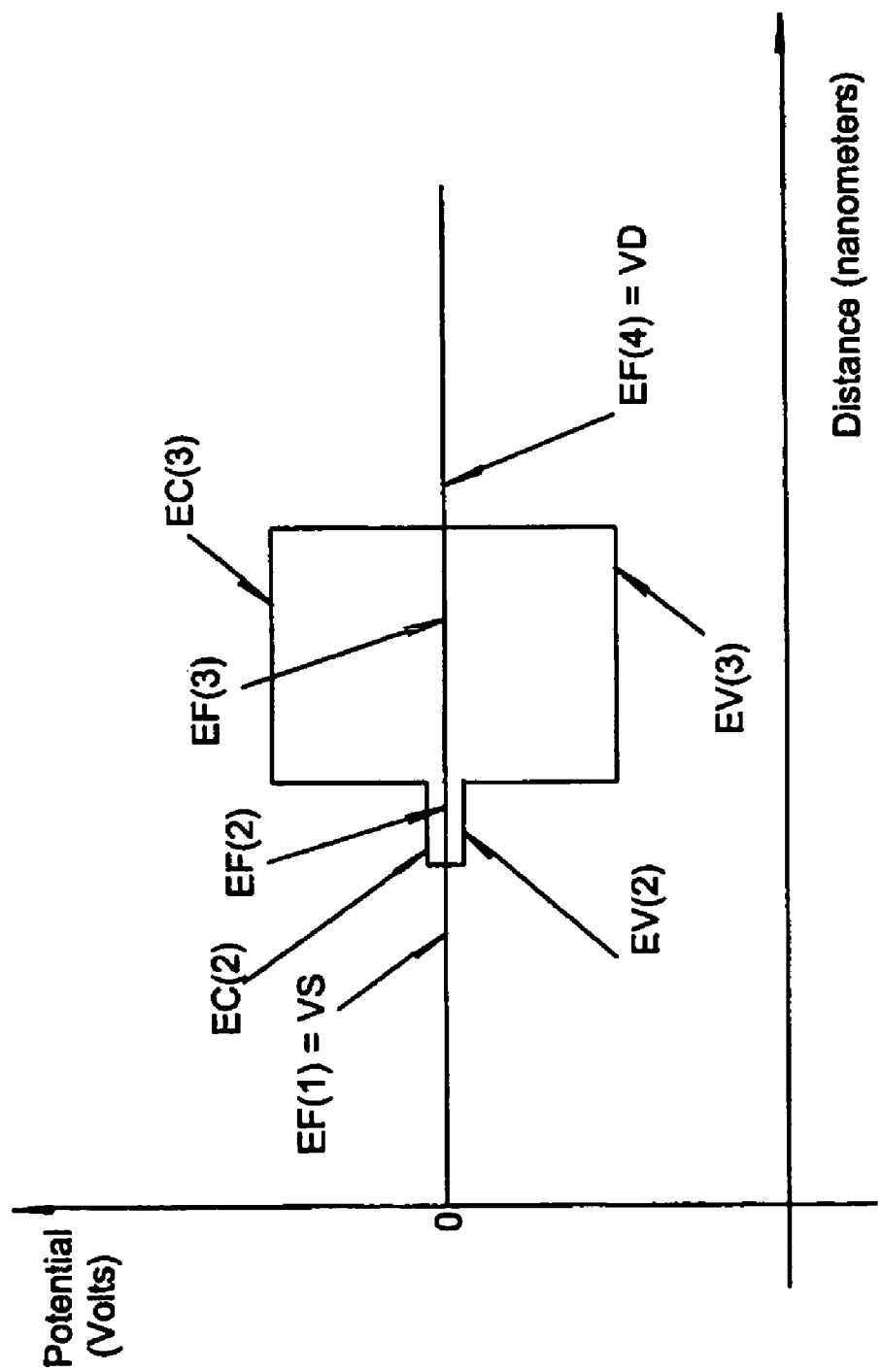
FIGS. 3a, 3b and 3c are schematic band alignments, along a vertical section from Source to Drain in the device of FIG. 1, near the interface with the Gate insulator, for different Drain and Gate bias conditions, when the device is used as a P-MOS.
Figure 3B:
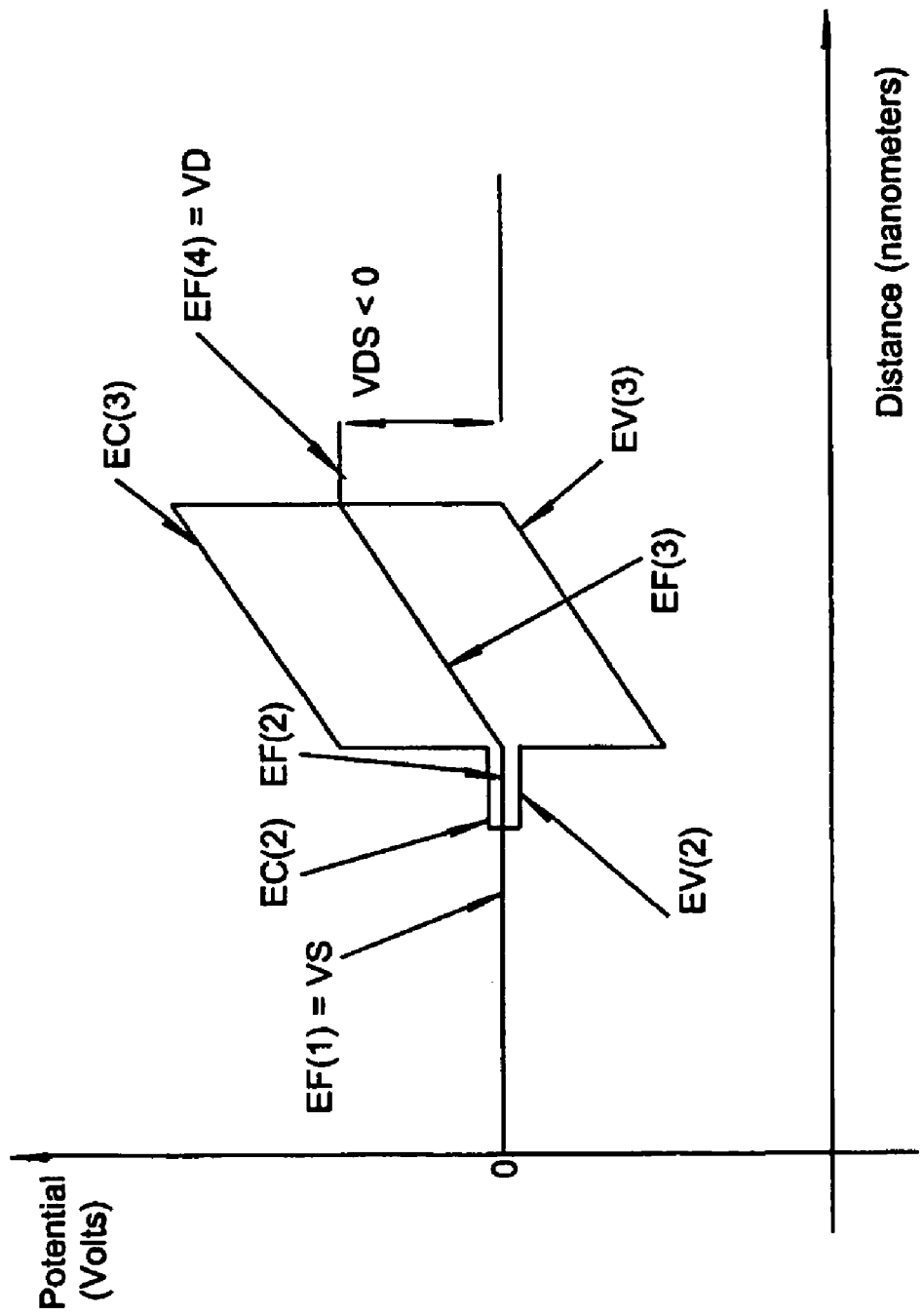
Figure 3C:
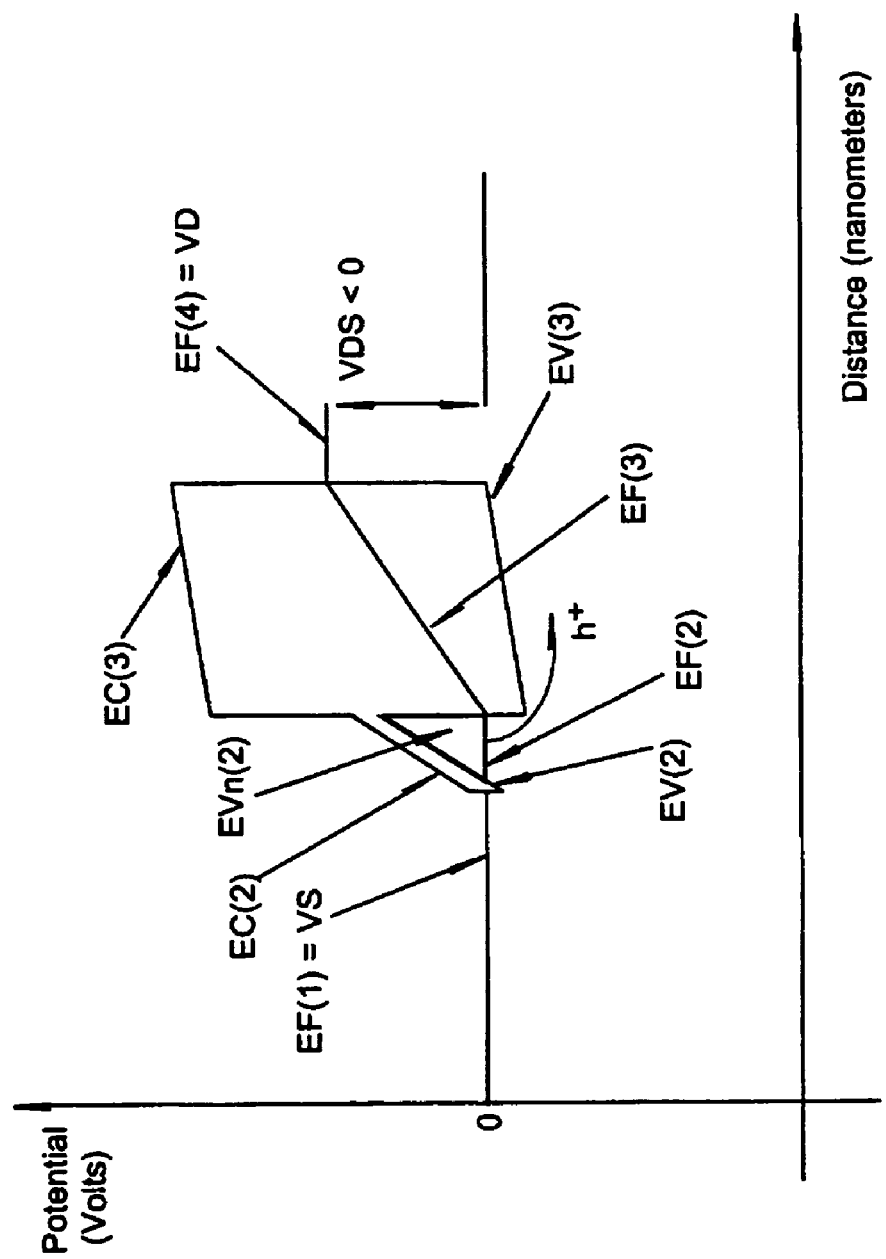

When comparing FIGS. 2a and 3a, it can be noted that the device is identical for both cases. The device will however behave as an N-MOS (FIGS. 2b and 2c) or a P-MOS (FIGS. 3b and 3c) in function of the voltage applied. It should be noted that the vertical axis in FIGS. 2 and 3 is expressed as potential in Volts. It could also be expressed as potential energy in electron-volts. The same applies to other figures where potential is indicated.

FIGS. 4a, 4b, 4c, 4d

Schematic band alignments of two identical SD-CMOS devices, along a cut from Source to Drain, near the interface with the Gate insulator, for different Drain and Gate bias conditions.

The devices are connected together in a "CMOS Inverter" arrangement:

The Drains are connected together.
The Gates are connected together.
The Source of the device, on the left hand side of the figure, is connected to the ground potential. This device will behave as a NMOS.
The Source of the device, on the right hand side of the figure, is connected to a negative potential. This device will behave as a PMOS.

FIG. 4a

Initial condition.
VG=GND.
VD=GND.
The device on the left has just been switched "Off".
The device on the right has just been switched "On", and current starts to flow.

FIG. 4b

Steady state.
VG=GND.
VD=−VSS.

Figure 4C:
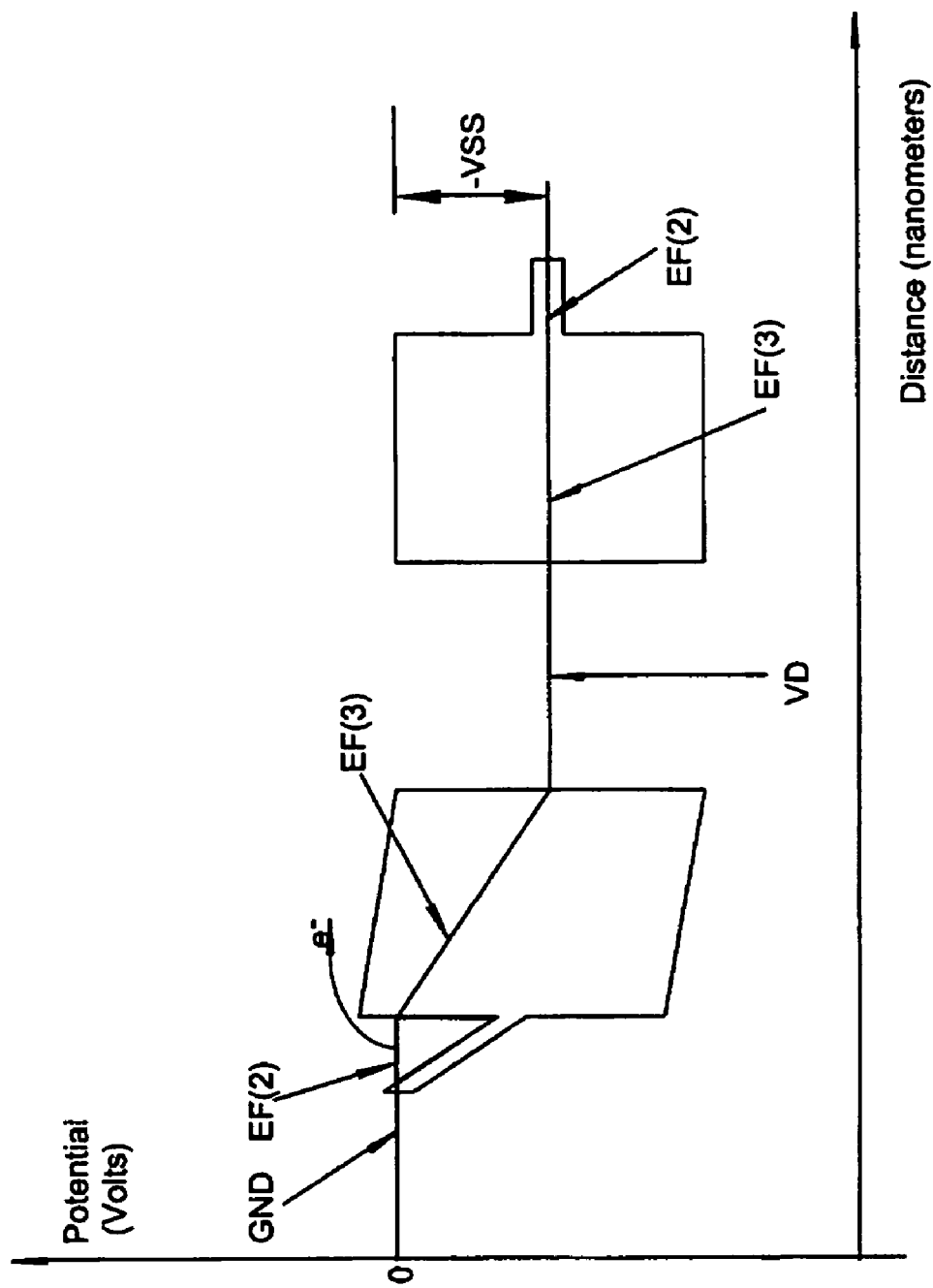
Figure 4D:
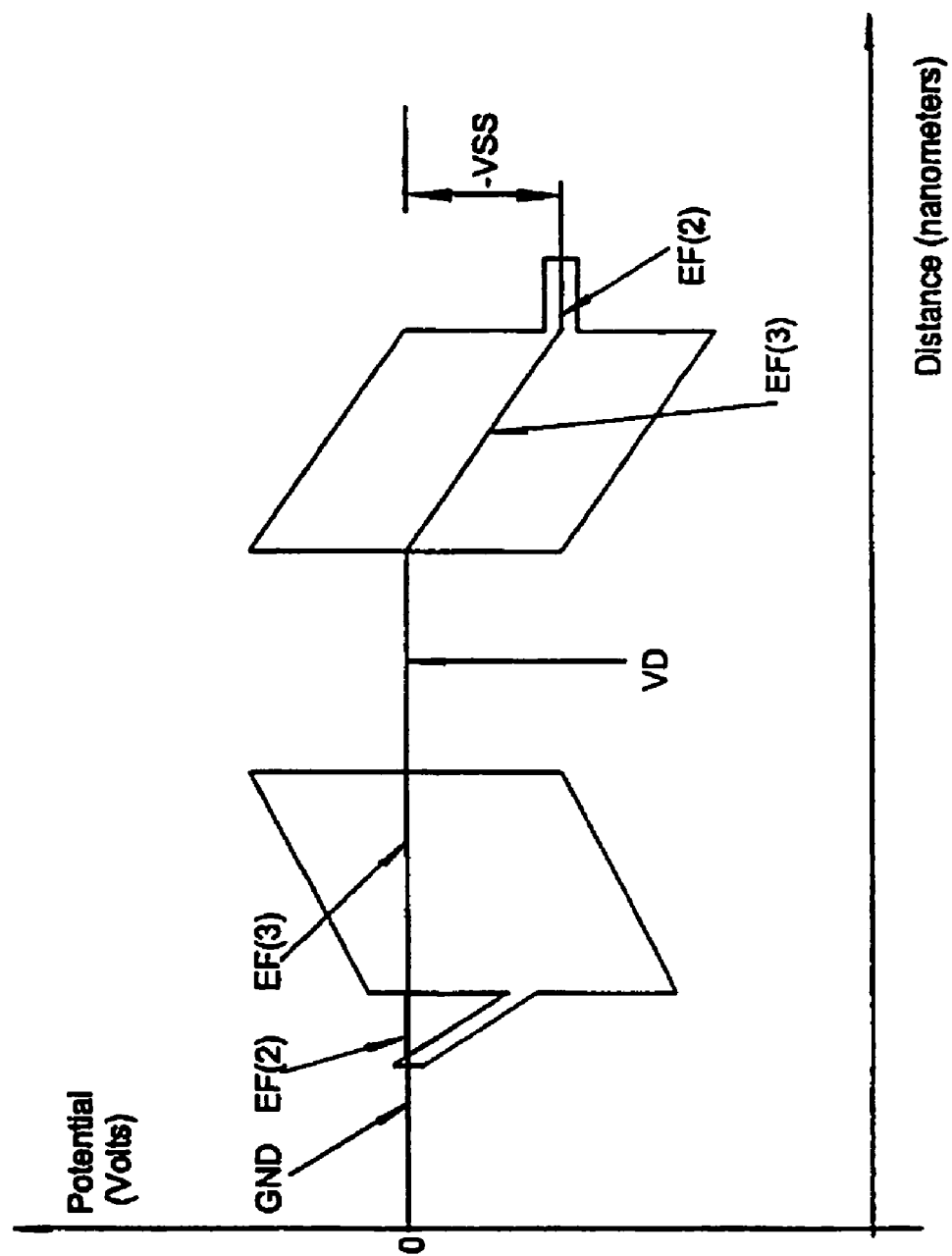
Figure 5A:
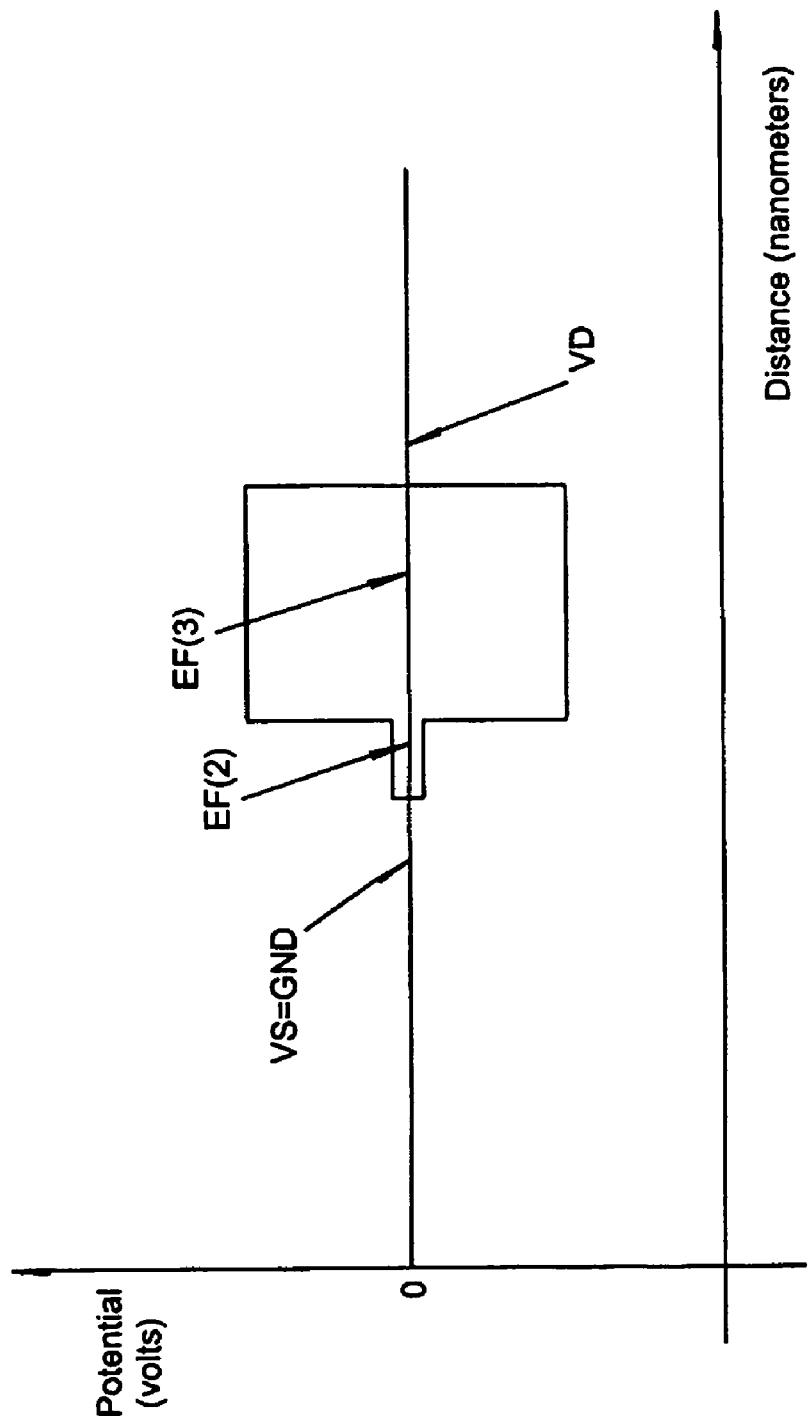
FIGS. 5a, 5b, 5c, 5d, 5e and 5f are schematic band alignments of one SD-CMOS device, along a vertical section from Source to Drain, near the interface with the Gate insulator, for different Drain and Gate bias conditions.
Figure 5B:
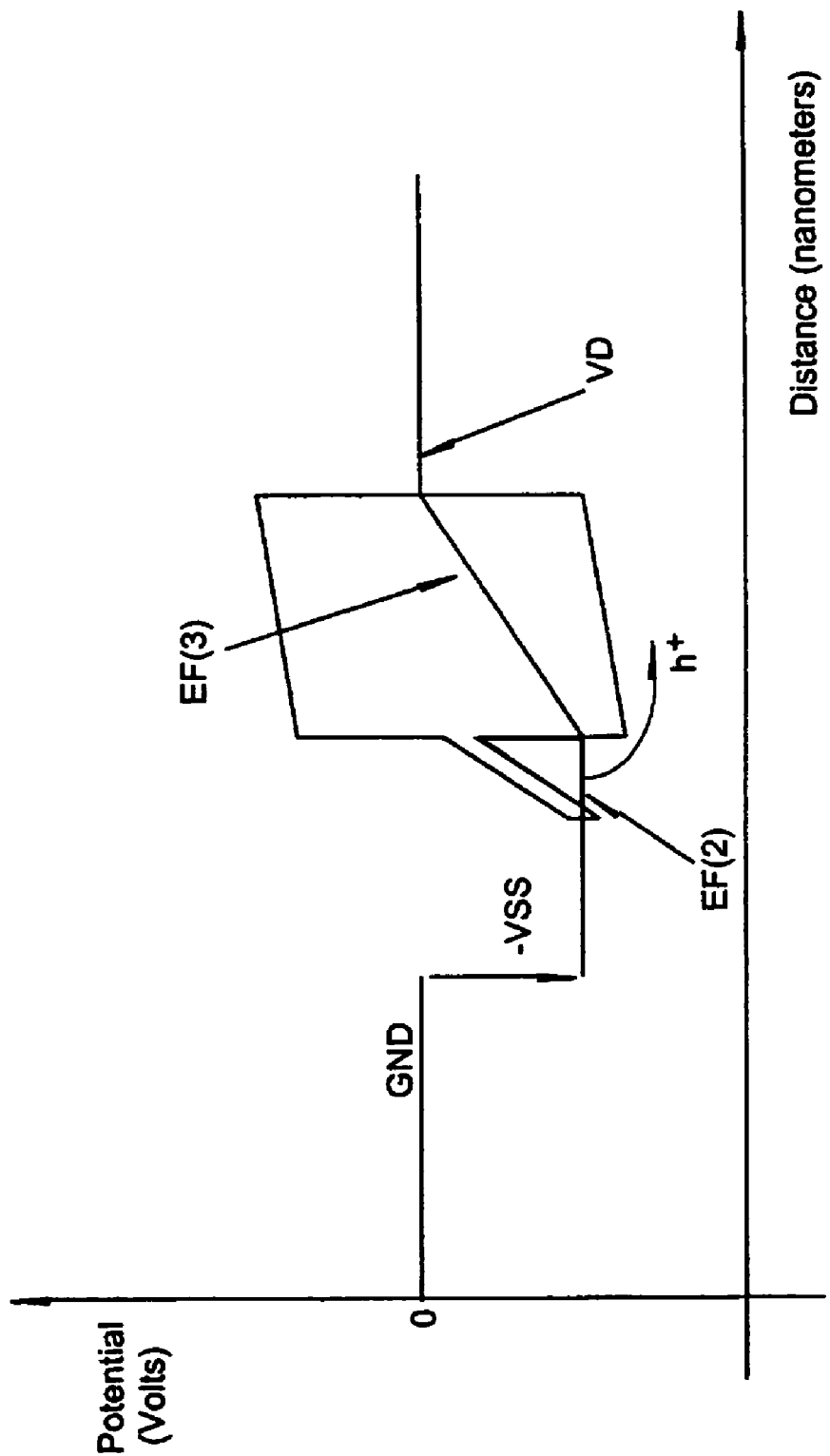
Figure 5C:
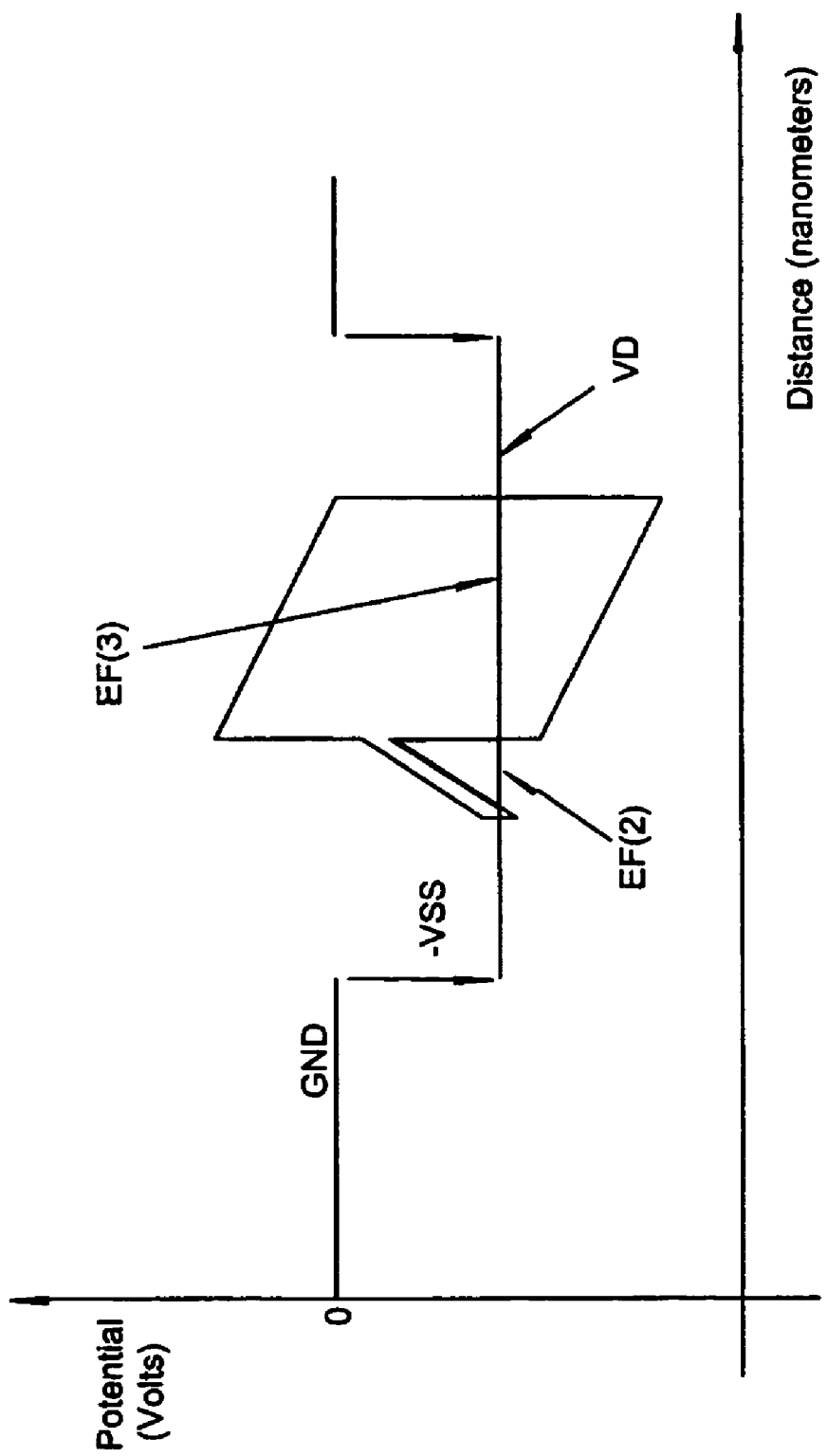
Figure 5D:
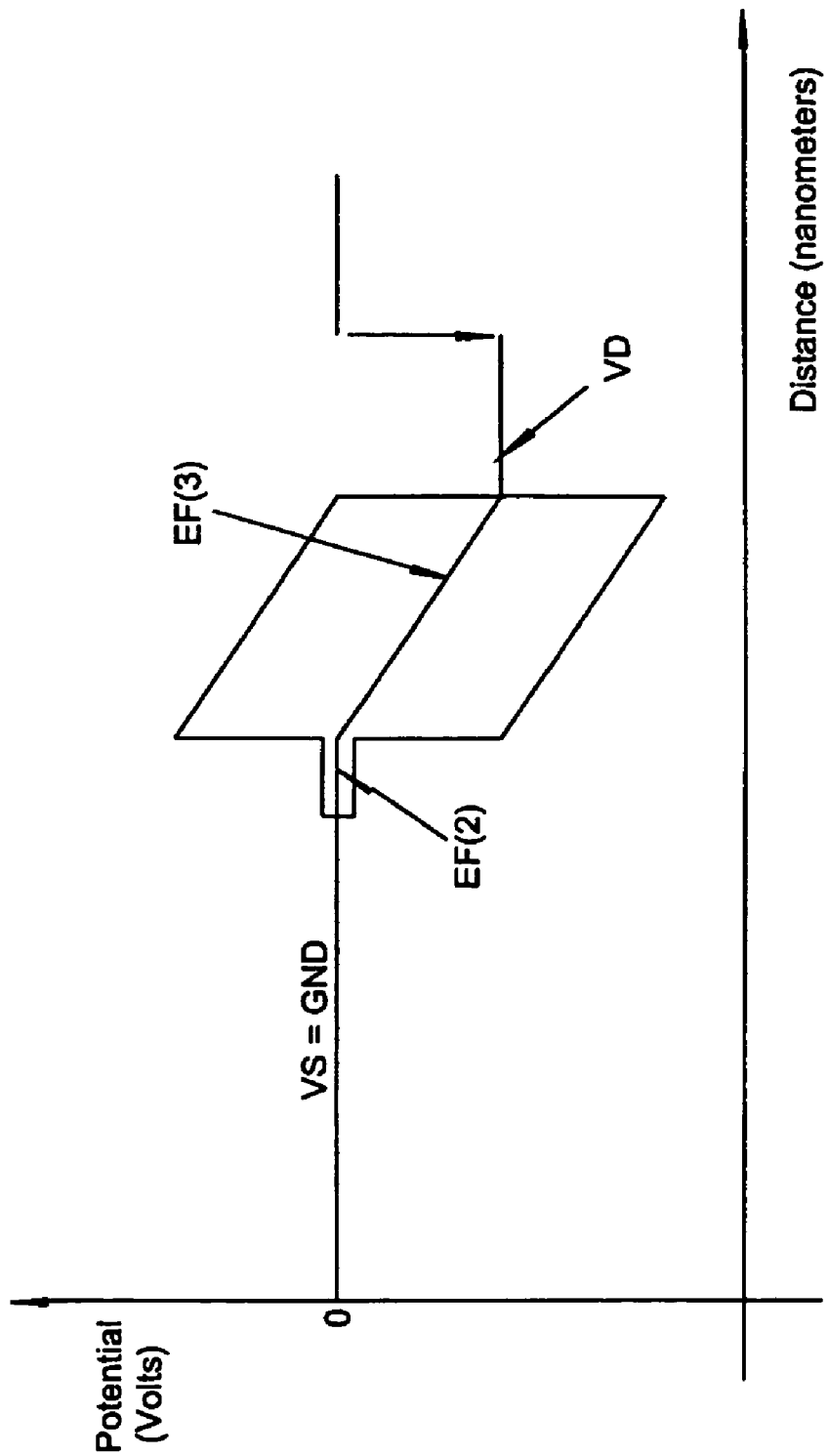
Figure 5E:
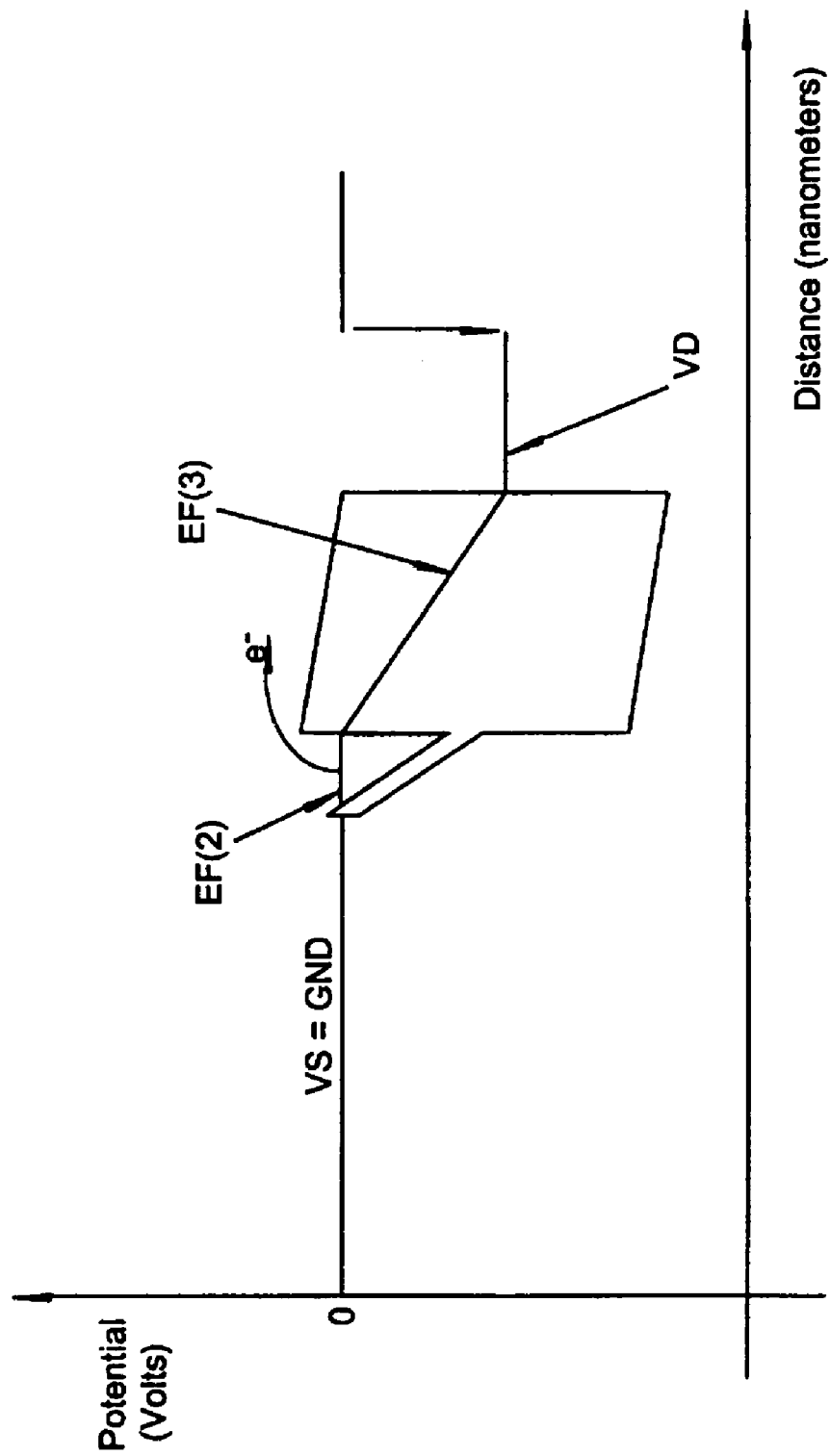
Figure 5F:
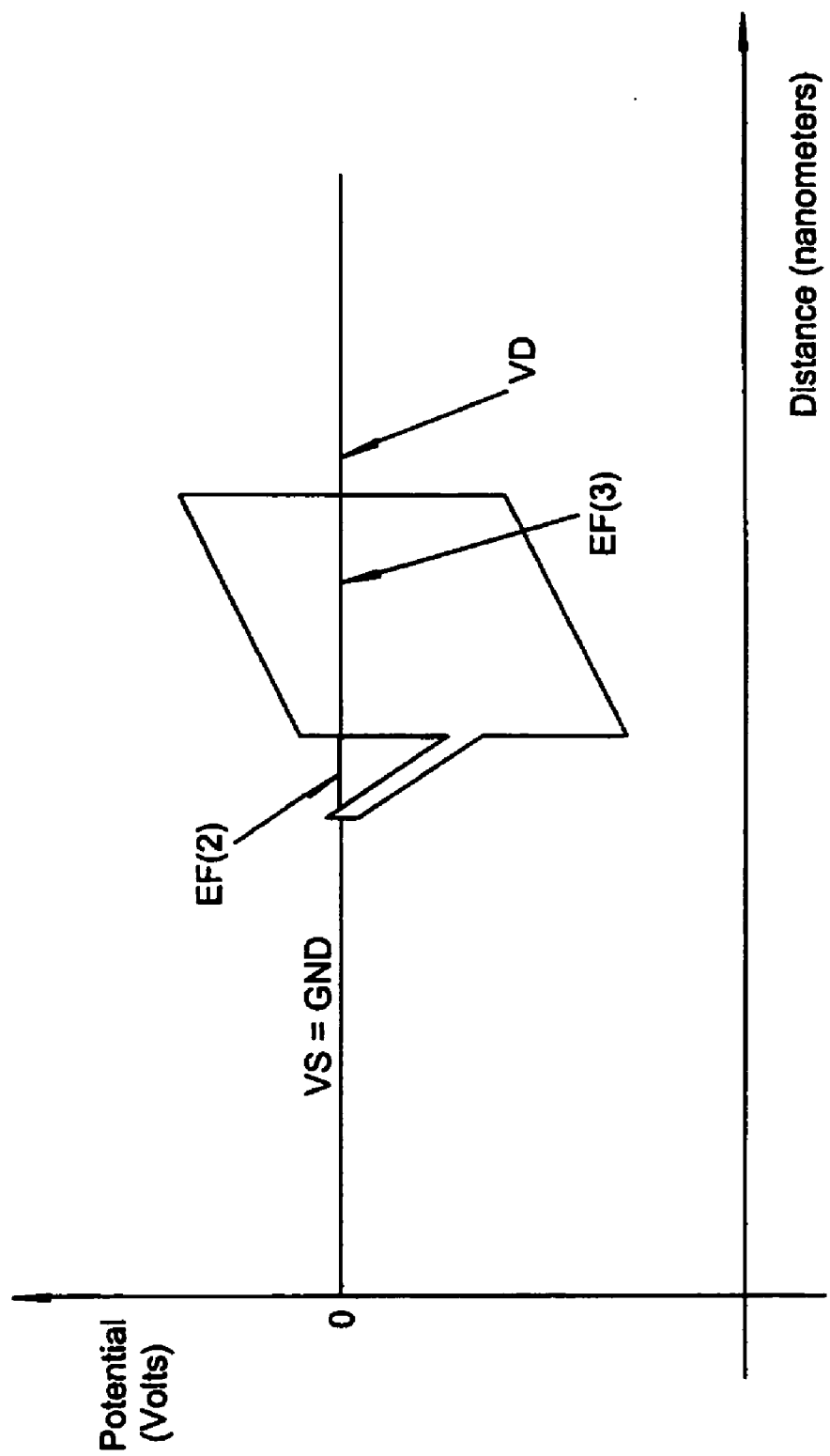

The device on the left is still "Off".
The device on the right is "On", but VDS=0, and therefore current=0.
FIG. 4c
Transient when VG is switched to −VSS.
VG=−VSS.
VD=−VSS.
The device on the left has just been turned On. VDS>0, current flows.
The device on the right has just been turned "Off".
FIG. 4d
Steady state.
VG=−VSS.
VG=GND.
The device on the left is "On", but VDS=0, and therefore current=0.
The device on the right is "Off".
FIGS. 5a, 5b, 5c, 5d, 5e, 5f
Schematic band alignments of one SD-CMOS device, along a cut from Source to Drain, near the interface with the Gate insulator, for different Drain and Gate bias conditions.
The Source of the device is going to be changed between GND and −VSS potentials.
When VS=GND, the device behaves as a NMOS transistor.
When VS=−VSS, the device behaves as a PMOS transistor.
The Gate of the device switches between GND and −VSS potentials.
FIG. 5a
Initial condition:
VS=GND.
VG=GND.
VD=GND.
Therefore:
VDS=0.
VGS=0
The device is "Off" as NMOS. No electron current flows.
FIG. 5b
Transient when VS is switched to −VSS (setting the device to work as PMOS), and VG is kept at GND.
VS=−VSS.
VG=GND.
VD=GND.
Therefore:
VDS=−VSS.
VGS=−VSS.
The device has just been turned "On" as PMOS, and hole current starts to flow.
FIG. 5c
Steady state when VS=−VSS, and VG=GND.
VS=−VSS.
VG=GND.
VD=−VSS.
Therefore:
VDS=0.
VGS=−VSS.
The device is "On" as PMOS, but VDS=0 and no hole current flows.
FIG. 5d
Transient when VS is switched to GND (setting the device to work as NMOS), and VG is kept at GND.
VS=GND.
VG=GND.
VD=−VSS.
Therefore:
VDS=+VSS.
VGS=0.
The device has just been switched from a "On-state" PMOS, to a "Off-state" NMOS. No electron current flows.
FIG. 5e
Transient when VS is kept at GND, and VG is switched to −VSS.
VS=GND.
VG=−VSS.
VD=−VSS.
Therefore:
VDS=+VSS.
VGS=+VSS.
The device has just been turned "On" as NMOS, and "electron current" starts to flow.
FIG. 5f
Steady state when VS=GND, and VG=−VSS.
VS=GND.
VG=−VSS.
VD=GND.
Therefore:
VDS=0.
VGS=+VSS.
The device is "On" as NMOS, but VDS=0 and no electron current flows.

"Single-Device CMOS" Concept

The device concept of the present invention is independent of any particular implementation. It can be implemented in different materials systems, like Si-based and GaAs-based alloys, for example. Independently of the materials system, it can also be implemented with different "Process Flows" or "Process Integration Architectures".

Exploiting the unique ability of defining asymmetric Vertical MOSFETs, it is possible to make an "Universal MOSFET" device, that behaves as NMOS or as PMOS depending only on the applied bias.

It is only possible to conceive and fabricate such device if there is no doping in any region of the device. The fundamental point is to have symmetric paths from source to drain for electrons and for holes. If doping was introduced, this symmetry would brake immediately.

When drawing a straight line along the middle of the band-gap of the several materials/regions of the device (source, channel, drain), the shape of the conduction band should mirror the shape of the valence band (or vice-versa), the middle of the band-gap being the mirror line.

The Source material is made of an undoped semiconductor, with a very narrow band-gap, which is much narrower, in particular 9 to 10 times narrower, than the band-gap of the channel material. The band-alignment must be such that the band-gap of the source material is fully nested in the band-gap of the channel material. The offsets in the conduction and valence bands should be of the same magnitude. Actually, due to the differences in effective masse, the conduction and valence band offsets may in fact be slightly different.

The Channel material is made of an undoped semiconductor, with a band-gap wide enough to comprise the barrier height for electrons and for holes, and the very small band-gap of the source material. An elemental semiconductor might also have the advantage of no alloy scattering. The barrier height for electrons and holes, determines off-state current (for electrons and holes respectively), and therefore should be large enough to enable room-temperature operation with negligible "off-state" currents. Ideally the barrier heights ought to be engineering parameters, which should be possible to continuously vary across a wide range of values (for example by variation of alloy compositions of the source layer).

The Drain is defined by a Schottky junction, between the channel and a metal with a work-function or Fermi-Level in the middle of the band-gap of the channel material.

The Gate electrode also needs to have a Fermi-Level in the middle of the band-gap of the channel material: metal with work-function in the middle of the band-gap of the source and channel materials.

Referring to FIGS. 1, 2a, 3a and 13a, the metal-insulator-semiconductor field-effect transistor (MISFET) according to the invention comprises a source layer 2 being made with a material having a source band-gap (EG2) and a source mid-gap value (EGM2), said source layer having a source Fermi-Level (EF2). A drain layer 4 has a drain Fermi-Level (EF4). A channel layer 3 is provided between the source layer and the drain layer. The channel layer is made with a material having a channel band-gap (EG3) and a channel mid-gap value (EGM3). The channel layer further has a channel Fermi level (EF3). A source contact layer 1 is connected to the source layer opposite the channel layer, said source contact layer having a source contact Fermi-Level (EF1). A gate electrode 6 has a gate electrode Fermi-Level (EF6). According to the invention, the source band-gap is substantially narrower (EG2) than said channel band-gap (EG3), in particular at least 9 to 10 times. The source contact Fermi-Level (EF1), the source Fermi-Level (EF2), the channel Fermi-Level (EF3), the drain Fermi-Level (EF4) and the gate electrode Fermi-Level (EF6) are equal to the source mid-gap value (EGM2) and the channel mid-gap value (EGM3), within a predetermined tolerance value, when no voltage is applied to the device.

The source band-gap (EG2) is the difference between the conduction band edge (EC2) and the valence band edge (EV2) for the source. It can be equated as follows:

$$EG2=EC2-EV2$$

The channel band-gap (EG3) is the difference between the conduction band edge (EC3) and the valence band edge (EV3) for the channel. It can be equated as follows:

$$EG3=EC3-EV3$$

The source mid-gap value can be equated as follows:

$$EGM2=(EC2-EV2)/2;$$

The channel mid-gap value can be equated as follows:

$$EGM3=(EC3-EV3)/2$$

The band-gap of the source material EG2 could be for example around 0.11 eV, with a tolerance of plus or minus (±) 5% on this value (total of 10%), resulting in the range of 0.1 to 0.12 eV.

The band-gap of the channel material EG3 should be around 1.1 eV, with a tolerance of plus or minus (±) 5% on this value (total of 10%), resulting in the range of 1.0 to 1.2 eV.

The tolerance on the barrier heights for electrons and holes (conduction and valence band offsets respectively):

EC3−EC2=0.5 eV (±)5% (total of 10%), resulting in a range from 0.475 eV to 0.525 eV EV3−EV2=0.5 eV (±)5% (total of 10%), resulting in a range from 0.475 eV to 0.525 eV The tolerance value as indicated in claim 1 can be expressed in different ways.

For example, in the absence of applied voltage to any of the terminals of the device, the Fermi-Levels in the source and channel regions should be close to the following values:

For the source, EF3=EV3+EGM3, plus or minus (±)5% (total of 10%), with EGM3=(EC3−EV3)/2=EG3/2.

Taking EGM3 to be the reference (i.e. zero value) and EG3=1.1 eV, then EF3=0(±)0.05 eV or will range from −0.05 eV to +0.05 eV. In that case the 0.05 eV tolerance is approximately 0.05/1.1 or +/−5% of the channel band-gap (EG3). A person skilled in the art will understand that the tolerance value can be expressed differently.

In particular, the device according to the invention has the following layers with the following characteristics:

layer 1 is the contact to the Source: metal with Fermi-Level in the middle of the band-gap of the Source material, and therefore also in the middle of the band-gap of the channel material;

layer 2 is the Source: "narrow" band-gap material, with its mid-gap point aligned with the mid-gap point of the channel material, resulting in similar offsets in the conduction and valence bands, with respect to the channel material;

layer 3 is the channel: "wide" band-gap material;

layer 4 is the Drain: metal with a Fermi-Level in the middle of the gap of the channel material;

layer 5 is the Gate insulator; and layer 6 is the Gate electrode: conductor with Fermi-Level in the middle of the gap of the channel material.

Layers 1, 4, and 6, can be the same material.

FIGS. 2a, 2b, 2c, show schematics of the band-diagrams for positive bias conditions, when the device behaves as a NMOS transistor.

FIGS. 3a, 3b, 3c, show schematics of the band-diagrams for negative bias conditions, when the device behaves as a PMOS transistor.

Embodiment of the Invention in the Silicon Materials System

Because of its economic relevance, silicon-based technology is very important. The embodiment of the SD-CMOS with silicon-compatible materials will make use of silicon-based alloys such as Si1-xGex, Si1-yCy, Si1-x-yGexCy, etc. Due to layer formation difficulties, it is less likely that alloys with Sn can be used. However if the perceived and/or anticipated technological issues are overcome, compounds with this element could also be used.

In FIG. 1, the layer description for a possible implementation in the silicon materials system, would read:

1 Epitaxial Titanium Nitride (TiN) on silicon.

2 Undoped Si1-x-yGexCy random alloy or Si1-xGex/Si1-yCy superlattices, grown pseudomorphically on silicon.

3 Undoped Silicon.

4 Epitaxial Titanium Nitride (TiN) on silicon.

5 Typically can be SiO2, or SiON/Si3N4, etc.

6 Titanium Nitride (TiN).

The Source is a very narrow (for example 5 KT, which at room temperature is about 130 mili-electron-Volts) band-gap material pseudomorphically grown on silicon. The band-alignment with silicon is such that the band offsets in the conduction and valence bands must be symmetric (for example 0.5 volts for each band discontinuity). Examples of possible materials providing such requirements, are a combination of Si1-xGex, Si1-yCy, Si1-x-yGexCy, either as random alloys or as short-period superlattices of alternating layers of Si1-yCy, and Si1-xGex, for example. The exact composition and thickness of these layers is an engineering question, not a conceptual one. Enough data is already known about these alloys (see reference [8]), to be able to predict that some combination will deliver the band-alignment necessary for this concept.

The Source is contacted by a metal electrode with a Fermi-Level in the middle of the silicon bad-gap. Since the band-gap of the source material is very narrow, and centered (with equal discontinuities for the conduction and valence bands) in the band-gap of silicon, it means that the Fermi-Level of the metal at the source is also in the middle its band-gap. Therefore it is possible to have good Ohmic contacts without any rectifying properties (for both electrons and holes) between the source metal and the very narrow semiconductor at the source, even though there is no doping involved.

TiN (titanium nitride) is an example of a metal with such properties (see reference [9]).

The Channel, is made of non-doped pure silicon.

The Channel/Drain interface is a Schottky junction, between the silicon channel, and a metal drain with a Fermi-Level near the mid-gap of silicon. Again TiN (titanium nitride) is an example of a metal with such properties.

The Gate electrode is a conductor with the Fermi-Level in the middle of the band-gap of silicon. Once more, TiN (titanium nitride) is an example of a metal with such properties.

Because of the mid-gap values of the Fermi-Level of the metals in the source, drain, and gate electrode, and also because of the symmetry of the band offsets, the Fermi-Level (or Chemical Potential) will be in the middle of the band-gaps of the source (narrow band-gap material) and channel regions. For the same reasons, a "flat band condition" exists across the gate to channel interface.

From the shape of the electrostatic potential (band edges), the physical picture for electrons and holes is very symmetric. However, in real space, there is an asymmetry between the source/channel and the channel/drain interfaces.

With a Schottky junction at the drain, the reverse "Off-state" current, is the thermionic current over the barrier. For a metal with mid-gap Fermi-Level on non-doped silicon, that current is indeed very low. Therefore, the drain of these devices is not able to inject current over the barrier, thereby preventing it from acting as the source of the complementary device-type.

The concept for the "On/Off switching mechanism", that is the process to modulate the barrier height at the source/channel interface, was introduced with Vertical Heterojunction MOSFETS, and is described in reference [3]. That mechanism was verified by numerical simulation for PMOS devices.

In the present invention, that mechanism was adapted to a device requiring symmetry for electrons and holes. Therefore, for the present invention, the required band-alignments (and consequently alloy composition) of that region in the source, are different than those for the Vertical Heterojunction MOSFET (PMOS or NMOS).

The very narrow band-gap material is positioned between the metal contact and the silicon channel, in order to enable a "switch-On/Off" effect mentioned before. If the metal contact was positioned directly on the silicon channel (Schottky junction), that switch "On/Off" mechanism would not be possible.

The presence of the very narrow band-gap film in the source layer is the key enabler of this mechanism, which makes possible the lowering of the effective barrier height (distance between band edge in the channel and the Fermi-Level in the source), for either electrons or holes. The presence of that film, also breaks the symmetry between source and drain interfaces with the channel material.

That film enables drift-diffusion or ballistic current across the source to channel heterojunction. If a Schottky junction was made directly on silicon (at the source), the barrier height could not be changed, and the only turn-on current mechanism possible would be tunneling (see references [10, 11]).

The issue of asymmetry between source to channel and channel to drain interfaces is of utmost importance. If the device was symmetric, CMOS would not be possible, because there would be no difference between a NMOS in the "On-state" and a PMOS in the "Off-state" and vice-versa. Therefore, no transistor would ever block current, and a CMOS inverter could not be built.

"CMOS Inverter" Configurations

Since the same transistor can behave as "NMOS" or "PMOS" devices (depending only on the applied bias), it is possible to envisage new and very flexible ways of designing circuits, making use of complementary operation.

For example, a "CMOS Inverter" could be made either by having "conventional" "Static Source Voltage Supply", in which case it would require two transistors, or by having a "Dynamic Source Voltage Supply", in which case only one transistor is required.

In the former, the devices will be "separated" into NMOS- or PMOS-like devices, by the metallization scheme, in which power supply voltages for NMOS and PMOS transistors are "hardwired".

In the later, if rather than "hardwiring" the source lines of SD-CMOS transistors, the power supply can be alternated between "positive" and "negative" voltages, the same device acts like "NMOS" AND "PMOS" sequentially in time.

By changing the bias of the source, and maintaining the gate bias constant while the source voltage is changed, a "CMOS Inverter" with just one transistor is possible.

Devices with "hardwired" fixed source voltage supplies are faster, and devices with changing source voltage supply are much more compact.

In fact both options can co-exist in the same integrated circuit, because it is only a matter of interconnect layout. These features were never possible before the SD-CMOS concept of the present invention, and allow for maximum flexibility in optimizing circuit speed, circuit size (number of transistors), power dissipation, etc.

FIGS. 4a, 4b, 4c, and 4d, show schematics of the band diagrams of two identical SD-CMOS devices with common Gates and Drains, for different bias conditions.

The potentials applied to the sources are such that the device on the left will behave as a NMOS, and the device on the right will behave as a PMOS.

Figure 4A:
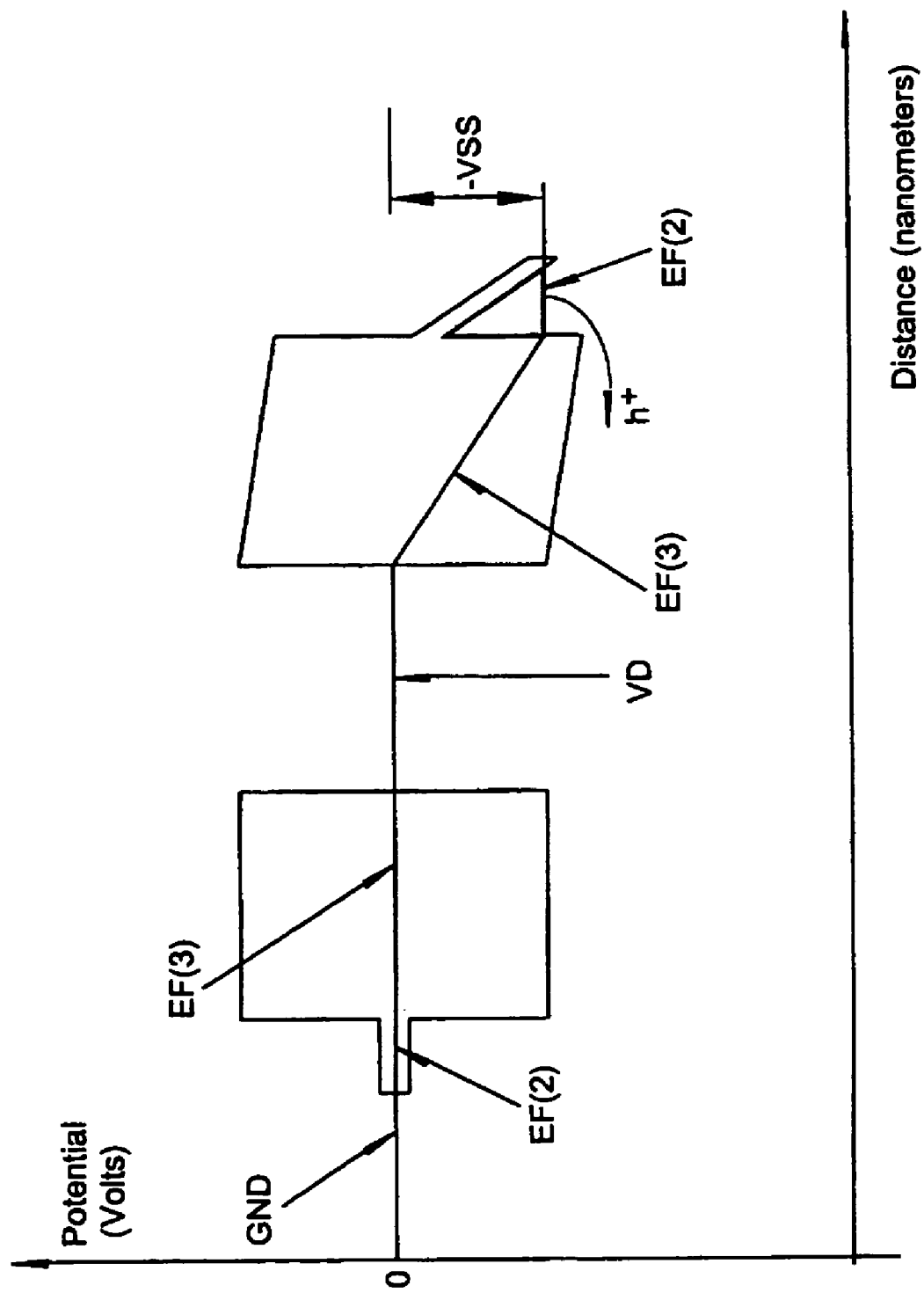
FIGS. 4a, 4b, 4c and 4d are schematic band alignments of two identical SD-CMOS devices, along a vertical section from Source to Drain, near the interface with the Gate insulator, for different Drain and Gate bias conditions.

FIG. 4a time=0: Initial condition.

VG=GND.

VD=GND.

The device on the left has just been switched "Off".

The device on the right has just been switched "On", and current starts to flow.

Figure 4B:
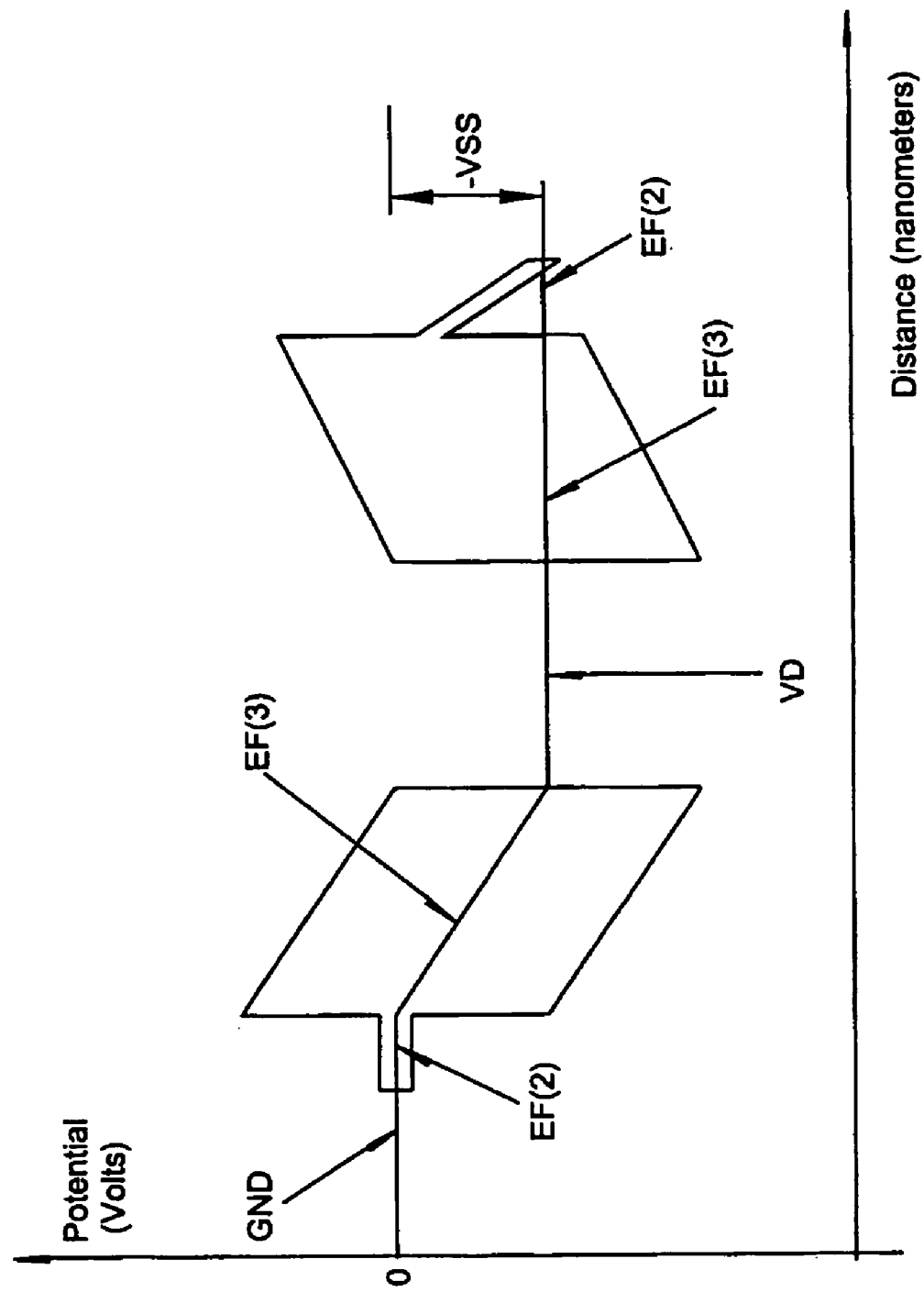

FIG. 4b time=1: steady state.

VG=GND.

VD=−VSS.

The device on the left is still "Off".

The device on the right is "On", but VDS=0, and therefore current=0.

FIG. 4c time=2: transient when VG is switched to −VSS.

VG=−VSS.
VD=−VSS.
The device on the left has just been turned On. VDS>0, current flows.
The device on the right has just been turned "Off".
FIG. 4d
time=3: steady state.
VG=−VSS.
VG=GND.
The device on the left is "On", but VDS=0, and therefore current=0.
The device on the right is "Off".
FIGS. 5a, 5b, 5c, 5d, 5e, 5f
Schematic band alignments of one SD-CMOS device, along a cut from Source to Drain, near the interface with the Gate insulator, for different Drain and Gate bias conditions.
The Source of the device is going to be changed between GND and −VSS potentials.
When VS=GND, the device behaves as a NMOS transistor.
When VS=−VSS, the device behaves as a PMOS transistor.
The Gate of the device switches between GND and −VSS potentials.
These figures demonstrate that with the SD-CMOS concept, a single device can implement, sequentially, the functionality of the CMOS inverter.
The type of MOSFET that the SD-CMOS will behave like, is set by the Source potential. For a potential at the source suitable for NMOS devices, the SD-CMOS will behave as NMOS transistor. For a potential at the source suitable for PMOS, the SD-CMOS will behave as a PMOS transistor.
Drain voltage is the output of the Inverter. Gate Voltage is the input of the Inverter.
While maintaining the input (gate voltage), the source voltage is switched between "0" and "−1", in which case the device "behaves" as NMOS and PMOS respectively.
Depending on the gate voltage (the input), there will be electron current, or hole current, or no current at all, depending on the potential at the drain (set by the previous logic state).
FIG. 5a
Initial condition:
VS=GND.
VG=GND.
VD=GND.
Therefore:
VDS=0.
VGS=0.
The device is "Off" as NMOS. No electron current flows.
FIG. 5b
Transient when VS is switched to −VSS (setting the device to work as PMOS), and VG is kept at GND.
VS=−VSS.
VG=GND.
VD=GND.
Therefore:
VDS=−VSS.
VGS=−VSS.
The device has just been turned "On" as PMOS, and hole current starts to flow.
FIG. 5c
Steady state when VS=−VSS, and VG=GND.
VS=−VSS.
VG=GND.
VD=−VSS.
Therefore:
VDS=0.
VGS=−VSS.
The device is "On" as PMOS, but VDS=0 and no hole current flows.
FIG. 5d
Transient when VS is switched to GND (setting the device to work as NMOS), and VG is kept at GND.
VS=GND.
VG=GND.
VD=−VSS.
Therefore:
VDS=+VSS.
VGS=0.
The device has just been switched from a "On-state" PMOS, to a "Off-state" NMOS. No electron current flows.
FIG. 5e
Transient when VS is kept at GND, and VG is switched to −VSS.
VS=GND.
VG=−VSS.
VD=−VSS.
Therefore:
VDS=+VSS.
VGS=+VSS.
The device has just been turned "On" as NMOS, and "electron current" starts to flow.
FIG. 5f
Steady state when VS=GND, and VG=−VSS.
VS=GND.
VG=−VSS.
VD=GND.
Therefore:
VDS=0.
VGS=+VSS.
The device is "On" as NMOS, but VDS=0 and no electron current flows.

Impact on CMOS Circuit Design

In conventional "Planar CMOS", the topology of choice for logic gates is the "NAND" configuration. In the typical "NAND" configuration, the logic inputs are the gate terminals of a series of n-type MOSFETs, connected in series with a PMOS (the load transistor). Each additional logic input, requires an additional NMOS device to be inserted in the series with all of them.

In the typical "NOR" configuration, the sources of several NMOS are shunted together, and the same is done for the drains. The set of parallel NMOS devices is connected in series with a PMOS device (the load transistor). Each additional logic input requires an extra NMOS device to be connected in parallel with the other NMOS transistors.

The main reasons for NANDs being the configuration of choice for "Planar MOSFETs" are:

1) For "Planar MOSFETs", the series connection enables area savings, because for devices of the same type, the source of one transistor can be the drain of another. However, for bulk CMOS, and because of the "body effect", the number of number of logic inputs is typically reduced to two. A larger number of inputs is possible, only if Silicon-On-Insulator (SOI) technology is used.

2) As the devices are connected in series, the total "Off-state" current, is the "Off-state" current of the least leaky device. For "NOR" gates. The total "Off-state" current is the sum of the "Off-state" currents of all individual NMOS devices.

For SD-CMOS, "NOR" logic gates are the best choice, for the following reasons:
1) Series connection of Vertical MOSFETs is area inefficient
2) Parallel connection of sources and drains can be achieved with very area-efficient process integration schemes.
3) With heterojunctions, "Off-state" current can be well controlled, even for ultra-short channel lengths.
4) Due to the lack of "body-effect", logic gates can have many inputs (gates), thereby saving area, minimizing interconnect complexity, and decreasing power dissipation.

As already mentioned, the physics of these devices makes possible channel lengths of 20 nm for example. For such short distances transport between source and drain is ballistic even at room temperature. Very low voltage operation (less than 1 Volt), very low power consumption, very high current drive (ID>1 mA/μm at VGS=VDS=1 Volt), and very short ring oscillator delays (<1 ps), can be expected.

On the assumption that 1 ps ring oscillator delays are possible, a conservative estimate would put 200 GHz circuit operation well within reach of this CMOS technology.

This kind performance level will enable circuits made with these devices to digitize and to synthesize any electrical signal of technological relevance for commercial applications, at the present of in the foreseeable future, thereby eliminating the need for analog signal processing, including signal demodulation in RF/Millimiter-Wave circuits. At 200 GHz digital circuit operation, signal demodulation can also be performed by Digital Signal Processing units.

This represents a tremendous breakthrough for silicon-based RF/Millimiter-Wave circuitry, and fundamental shifts in design of such circuits can be expected. With SD-CMOS devices, there is no more a conceptual difference between the "logic" and the "analog RF" transistors. All transistors are digital, and all operate at RF/Millimiter-Wave speeds.

CMOS Process Integration Schemes with Embedded Memory

Several "Process Integration Architectures" can be envisaged for the new device. Three main alternative exemplary schemes will be described with the disclosure of the present invention.

"Gate All Around" or "Surrounding Gate"

In this process architecture, the step that defines "Mesas" exposing the device layers where the gate stack is formed, simultaneously provides "isolation" between devices. The contacts to the several device layers are made inside the perimeter of the gate stack (which as its name suggests, surrounds the device layers).

Figure 6:
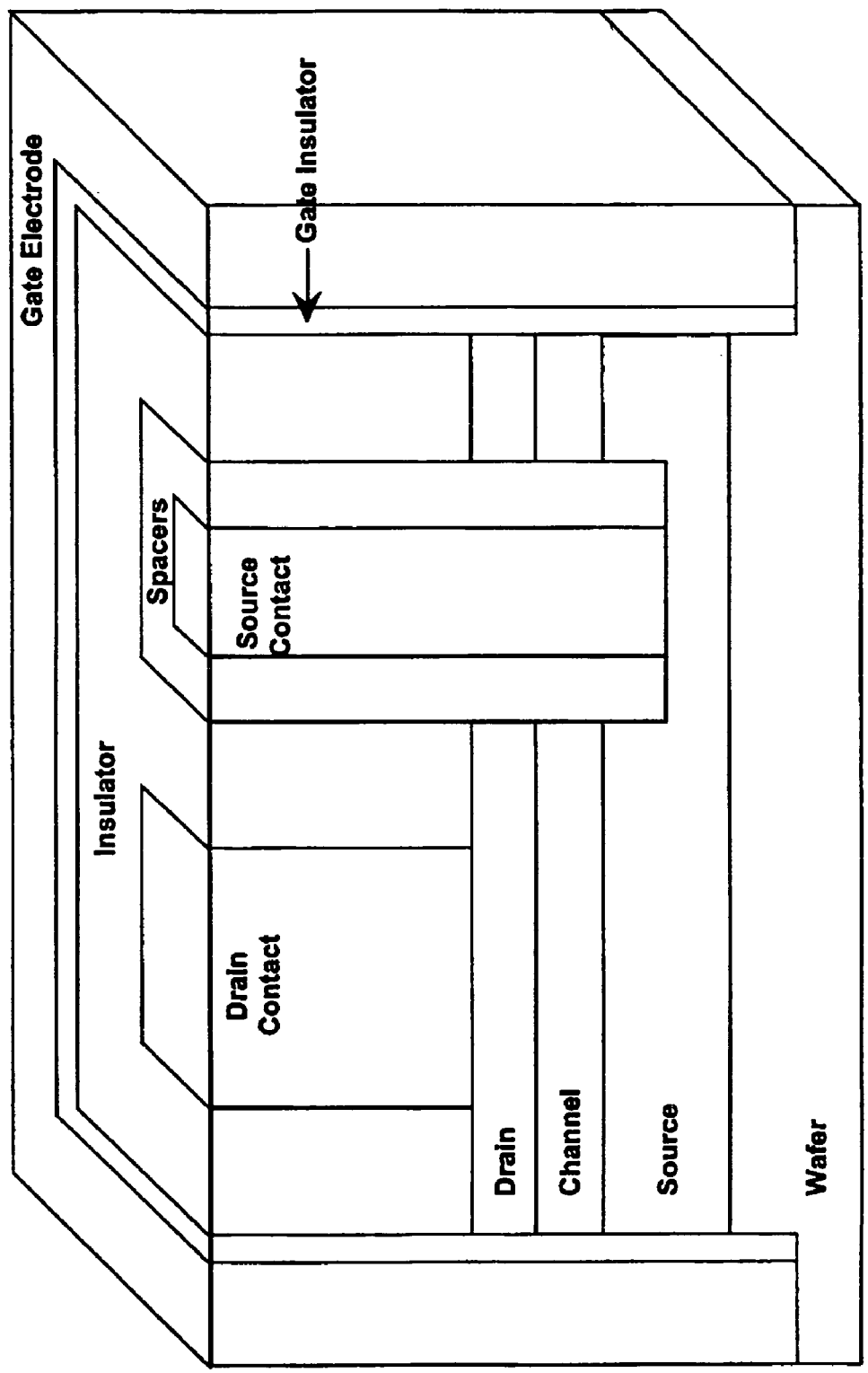
FIG. 6 illustrates a 3-dimensional perspective of a "Gate All Around" device.

FIG. 6, is a schematic of 3-dimensional perspective of a "Gate All Around" device.

"Edge-Gate"

In this process architecture, the "Isolation" and "Gate Stack" formation steps are performed separately. The gate is not surrounding the "Mesa" of the device layers, but it is placed on only one crystalline plane. The other sides of the "device layer Mesa" face the "Field Isolation" for example. With this configuration, it is possible to have a single drain contact for several independent gates.

Figure 7A:
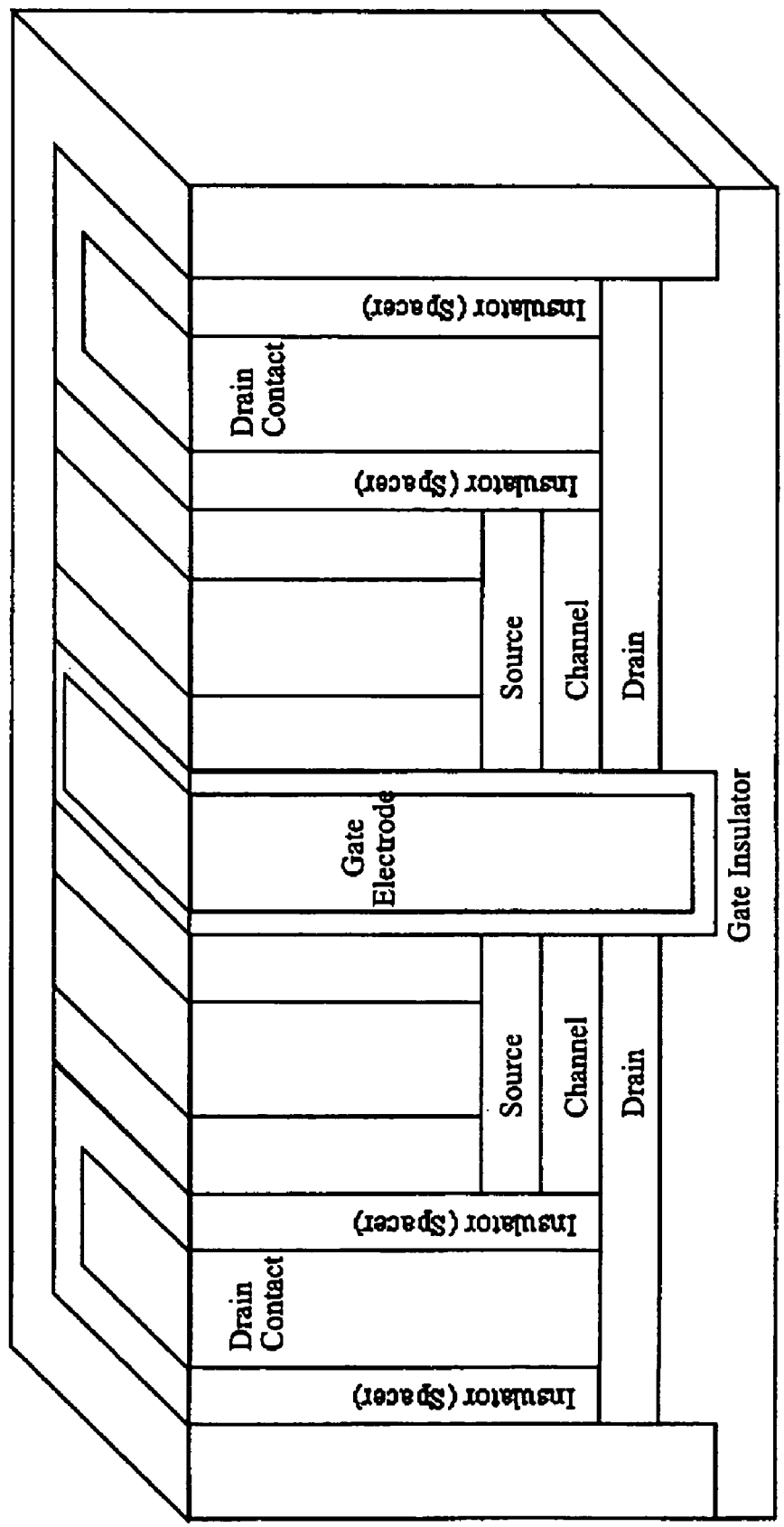
FIG. 7a illustrates a 3-dimensional perspective of one possible implementation of the "Edge-Gate" arrangement.

FIG. 7a, is a schematic of 3-dimensional perspective of one possible implementation of the "Edge-Gate" arrangement.

Figure 7B:
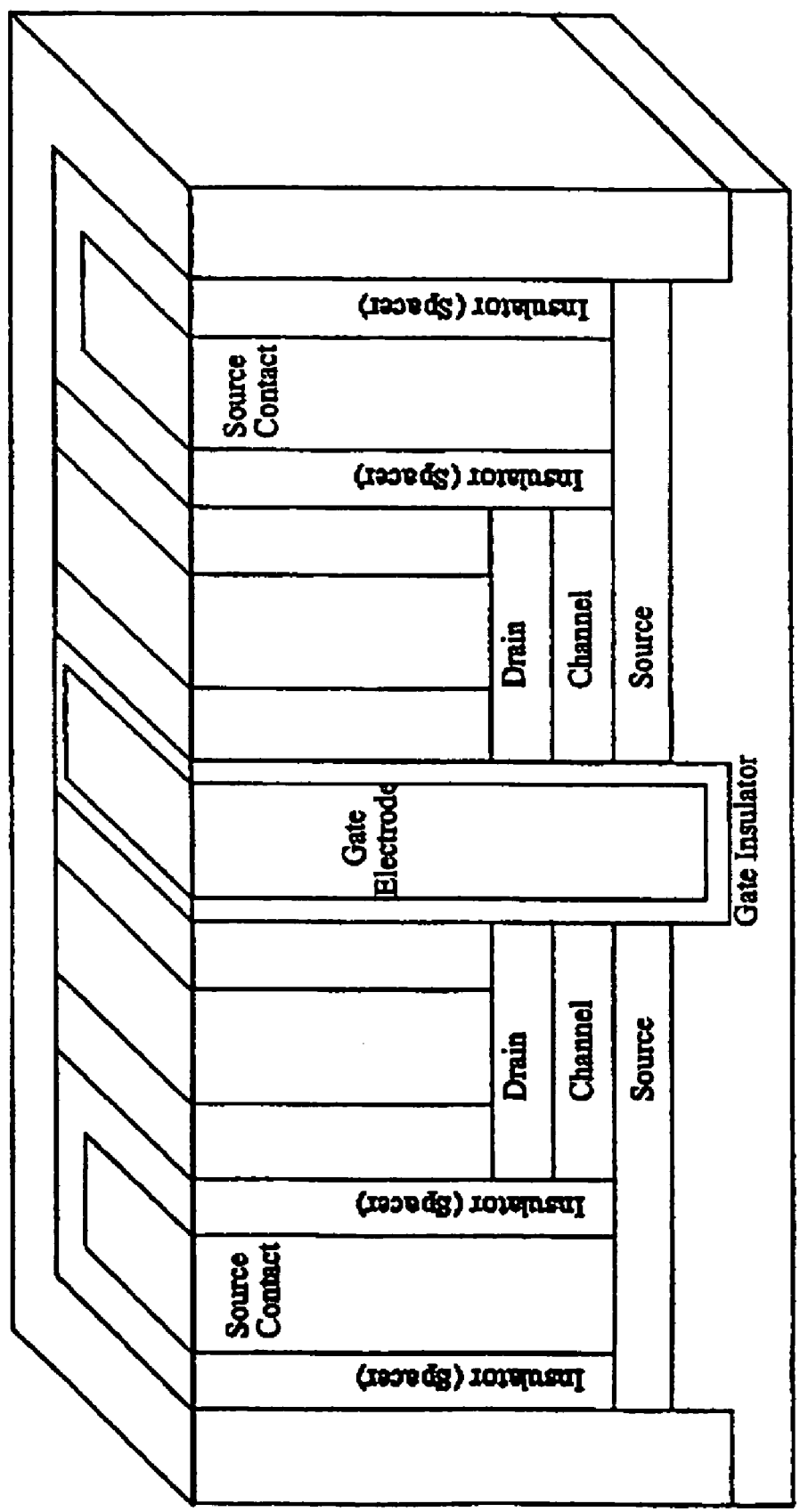
FIG. 7b illustrates a 3-dimensional perspective of a second possible implementation of the "Edge-Gate" arrangement.

FIG. 7b, is a schematic of 3-dimensional perspective of a second possible implementation of the "Edge-Gate" arrangement.

Figure 7C:
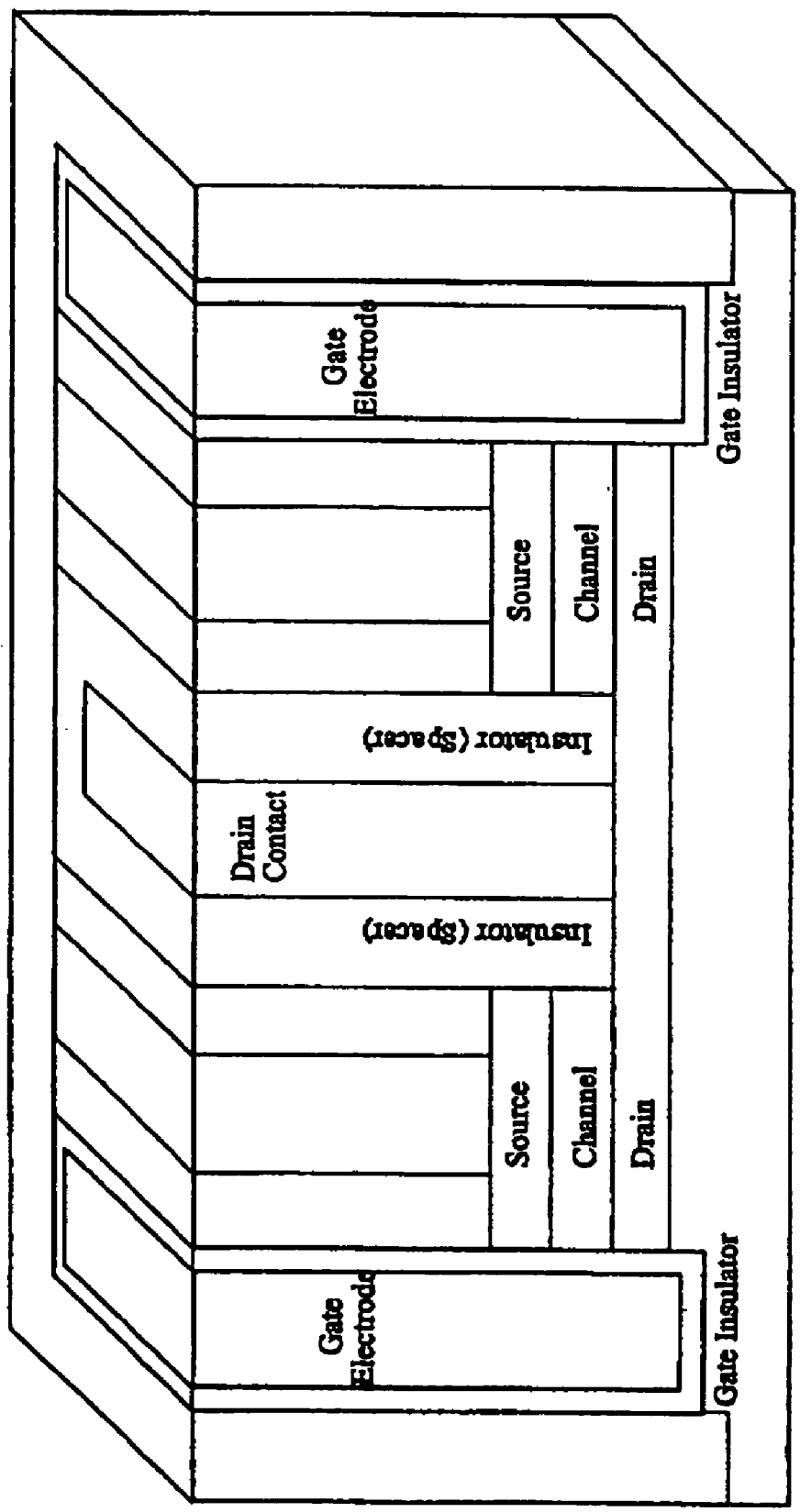
FIG. 7c illustrates a 3-dimensional perspective of third possible implementation of the "Edge-Gate" arrangement.

FIG. 7c, is a schematic of 3-dimensional perspective of third possible implementation of the "Edge-Gate" arrangement.

"Inner-Gate"

In this process architecture, the gate is surrounded by the device layers, which at the edges face the "Field Isolation". The "Field Isolation" and "Gate Stack" formation steps are performed separately. This configuration enables not only single drain contact, but also single source contact, for several independent gates. This is an ideal configuration for "NOR" logic gates.

Figure 8:
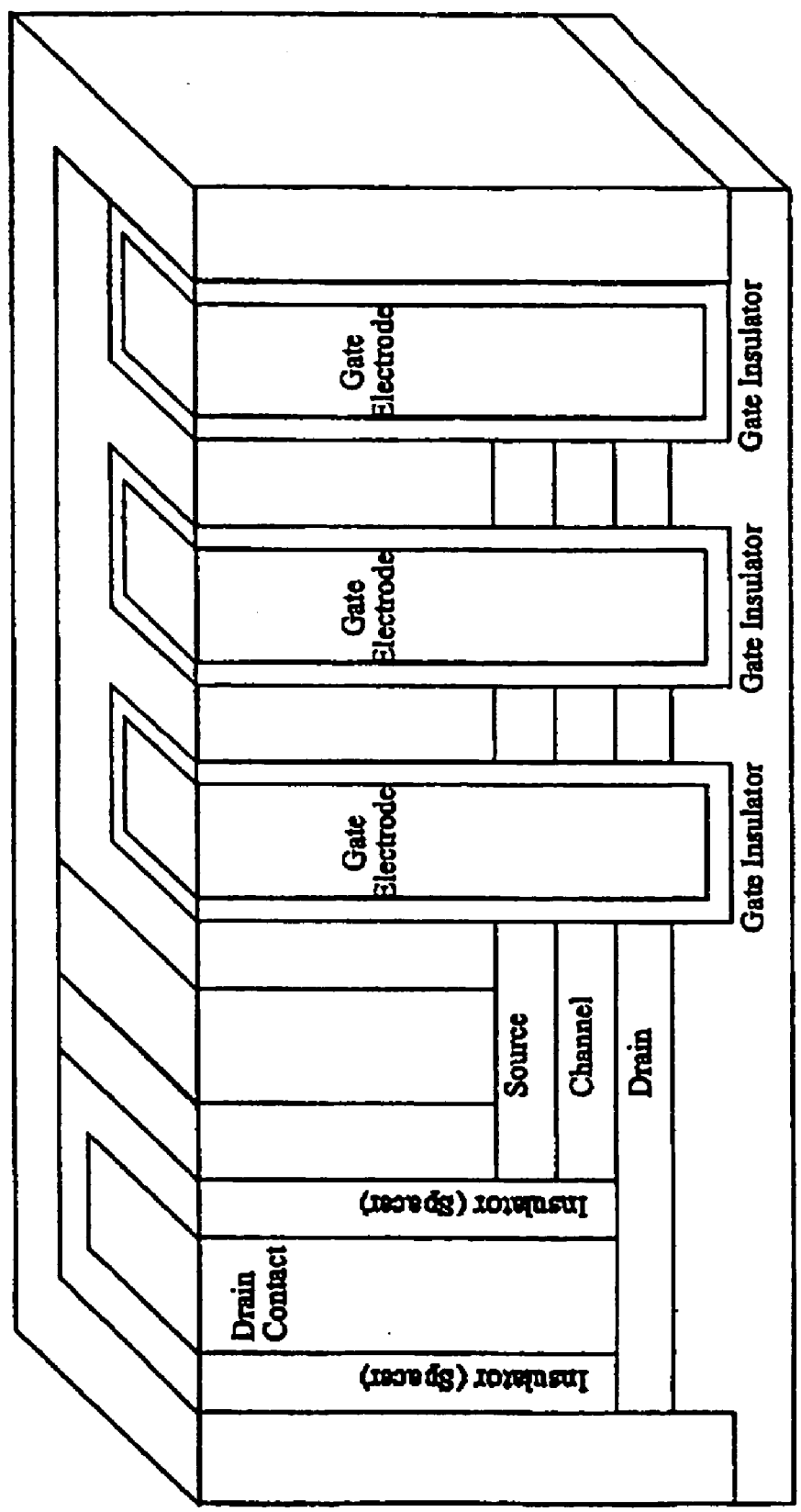
FIG. 8 illustrates a 3-dimensional perspective of a possible implementation of the "Inner-Gate" together with "Edge-Gate" arrangements.

FIG. 8, is a schematic of 3-dimensional perspective of a possible implementation of the "Inner-Gate" together with "Edge-Gate" arrangements.

Figure 9B:
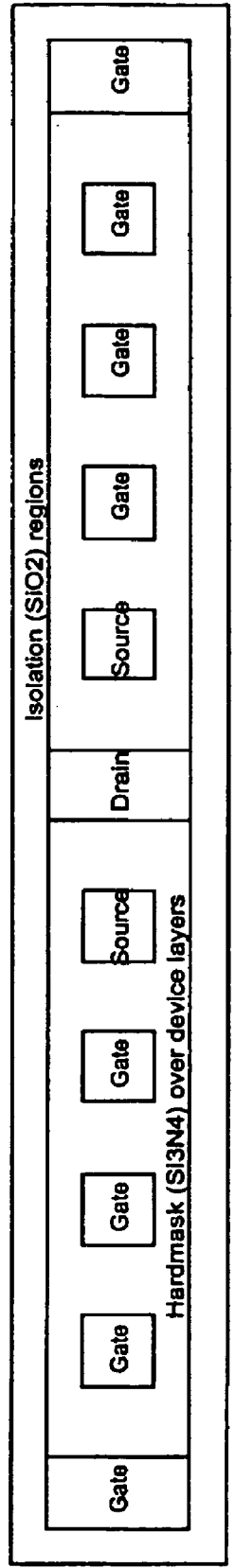
FIG. 9b illustrates an implementation of a "NOR" logic gate, where a SD-CMOS devices will behave alternatively as NMOS or PMOS by changing the bias at the source contact.
Figure 9B:
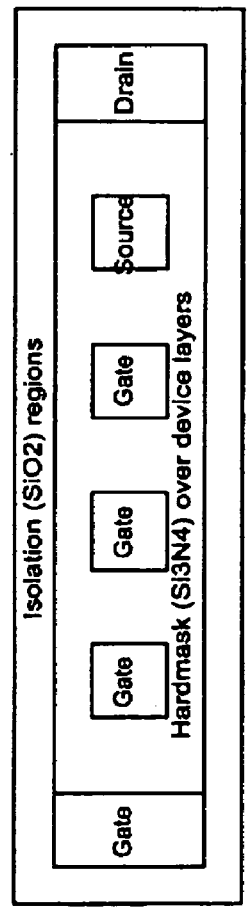

FIG. 9 is a top view of a possible implementation of the "Inner-Gate" together with "Edge-Gate" arrangements.

FIG. 9a, shows an implementation where SD-CMOS devices to behave as NMOS and PMOS are made on opposite sides of the "Drain Contact".

FIG. 9b, shows an implementation where a single SD-CMOS device will behave alternatively as NMOS or PMOS by changing the bias at the source contact.

The "Edge-Gate" and "Inner-Gate" process architectures differ only in layout, and both types of devices can be simultaneously on the same circuit, as it is shown in FIG. 8.

Any of the "SD-CMOS" process integration architectures, has many advantages over "Planar CMOS" as well as over "Vertical Integration of Vertical MOSFETs" where NMOS and PMOS devices are physically different.

Some of these advantages are:
1) Significant reduction in the number of process steps,
2) Area savings for a single device,
3) Area savings for "many-input" CMOS inverters/logic-gates. This is especially apparent for the "Edge-Gate" and "Inner-Gate" integration architectures, due to the possibility of a single drain contact, and the fact that several gates (NOR) are within the same "Active-Area".
4) Change the "type" of transistor by simply changing bias conditions.

SD-CMOS does not suffer from "corner effect", due to the intrinsic characteristics of the device physics, and therefore none of the possible implementations or process integration architectures, is affected by it.

The reason for the immunity to "corner effect", is that the "corner effect" is a geometric effect that re-enforces the "zero-bias" electric field across a MOS interface.

In standard "planar technology", it is typical to have a MOS with a n+ poly gate electrode across from a p-type doped potential well. Even when there is no bias applied, there is a built-in electric field, because of the differences in Fermi-Levels between the n+ poly gate and the p-type well. This built-in electric field is re-enforced by curvature, as it can be the case at the edge of the gate (in the width direction).

The "zero-bias" electric field across the MOS interface of the SD-CMOS is zero, because of a flat-band condition imposed by the non-doping of the device layers and by the "mid-gap" Fermi-Level of the gate electrode, drain and source contact metals. Therefore and "by definition" the SD-CMOS does not suffer from "corner effect".

Process Flows

References [12] to [16] demonstrate the feasibility of epitaxial TiN deposition on silicon, and some of these references also show the feasibility of epitaxial growth of silicon on TiN.

References [17] and [18], demonstrate the feasibility of epitaxial insulators like SrTiO3 and BaTiO3 (the later a Ferroelectric) using epitaxial TiN on silicon as a buffer material.

The process flows described below, give exemplary ways of embodying the several innovations being disclosed in this patent application.

CMOS Integration schemes for Vertical MOSFETs have been proposed before, but for SD-CMOS only one device structure needs to be fabricated, and that carries important consequences.

Three of the four the process flows will include the fabrication steps necessary to have embedded memory, which depending on the materials chosen, can have ferroelectric properties, and therefore provide non-volatile storage of the data.

Since the SD-CMOS is an asymmetric Vertical MOSFET, it means that source and drain are not interchangeable, and therefore, choosing which one is at the bottom and at the top of the layer stack, carries consequences.

Having the source as the bottom layer, is the easiest configuration from a technological standpoint. However, this may result in a high series resistance of the source, which is perceived to be a key parameter to minimize for devices with channel lengths below 100 nm.

Source as the top layer implies one of the following options:
1) Pseudomorphic growth of the channel (Si) and source (SiGeC) layers to be performed after the epitaxy of the drain metal film (TiN).
2) Pseudomorphic growth of source (SiGeC) and channel (Si), followed by epitaxy of drain metal film (TiN). In order to have the source as the top layer, wafer bonding of the top layer to an insulating substrate, and etch back the original substrate (where the device layer growth was performed) will expose the source layer at the top of the stack. The new insulating substrate must be compatible with the remaining steps of the process flow. Examples of insulating substrates are glass, quartz, sapphire, etc.

Another set of options regarding the device layers, has to do with the formation of the device Mesas: blanket growth followed by patterning of the epitaxial layers, or pre-patterning of hard mask followed by selective epitaxial growth.

Each of these options has technological advantages and drawbacks over the other.

There are several possible choices regarding the gate architecture:
1) "Gate All Around" or "Surrounding Gate"
2) "Edge-Gate"
3) "Inner-Gate"

Inner-Gate and Edge-Gate can be implemented simultaneously, without extra masks.

The combinations of the different options for what device layer is on top of the epitaxial stack, if wafer-bonding or pseudomorphic growth of SiGeC and Si is performed on metals, blanket versus selective epitaxial growth, and the different gate architectures, lead to a very large number of possible process flows.

Process Flow #1

"Gate All Around" device architecture, with source at the bottom of device layer stack.

Epitaxial Device-Layer Growth
1) Bare silicon wafer (undoped, <100>).
2) Epi of source layer (undoped Si1-x-yGexCy or Si1-xGex/Si1-yCy superlattice)
3) Epi of channel layer (undoped Si)
4) Epi of drain layer (TiN)
5) Epi of Insulator which can be Ferroelectric (for example BaTiO)
6) Epi of capacitor plate (TiN)
7) Deposition of thin SiO2 and thick Si3N4

FIG. 10A

Definition of Mesa Structures
8) Lithography-->Mask 1: definition of mesas.
9) Etch through Si3N4, stopping on SiO2.
10) Resist strip & clean.

Figure 10A:
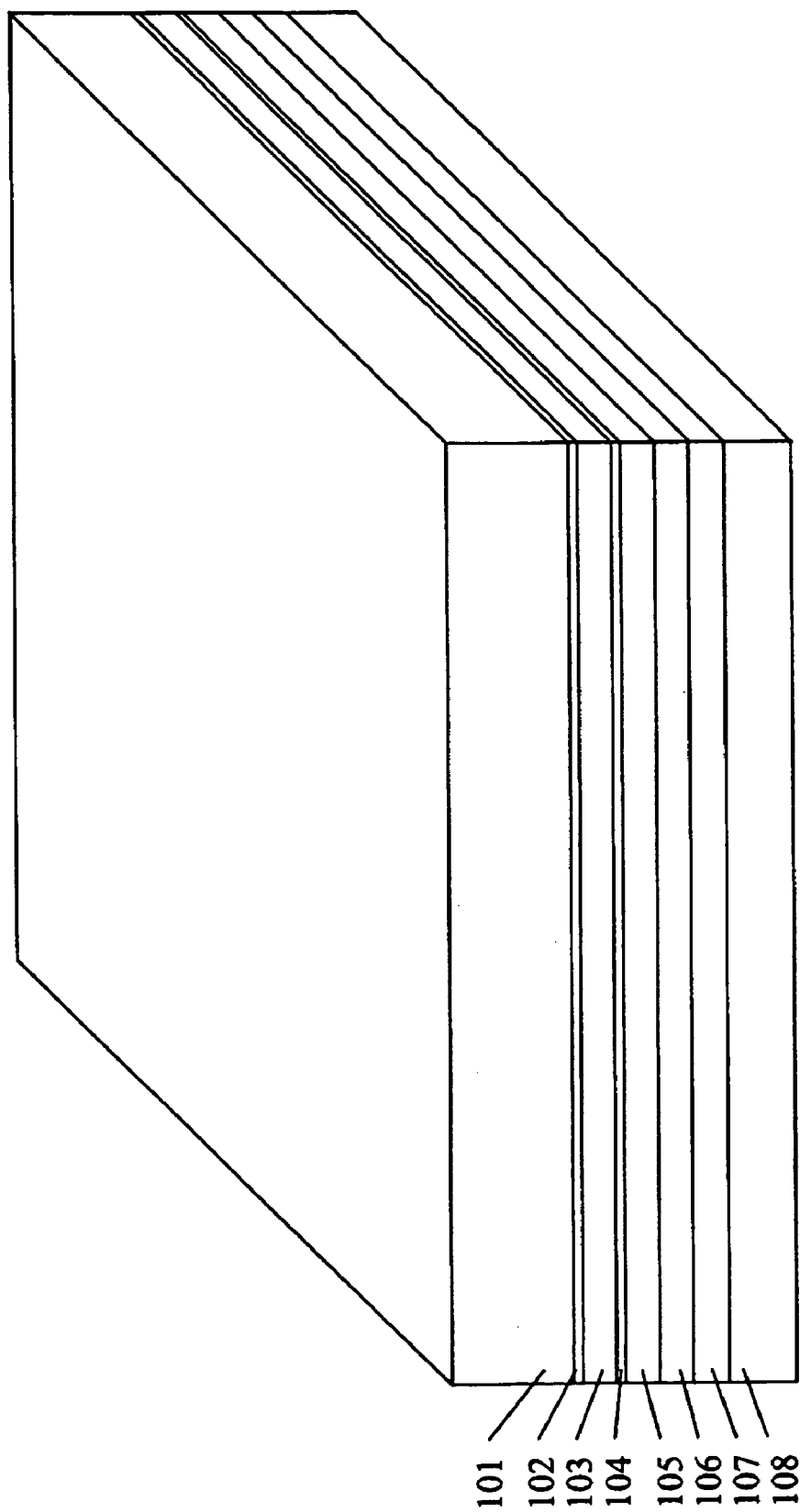
FIGS. 10A to 10N illustrate a process flow for manufacturing a device according to the invention according to a first preferred embodiment.
Figure 10B:
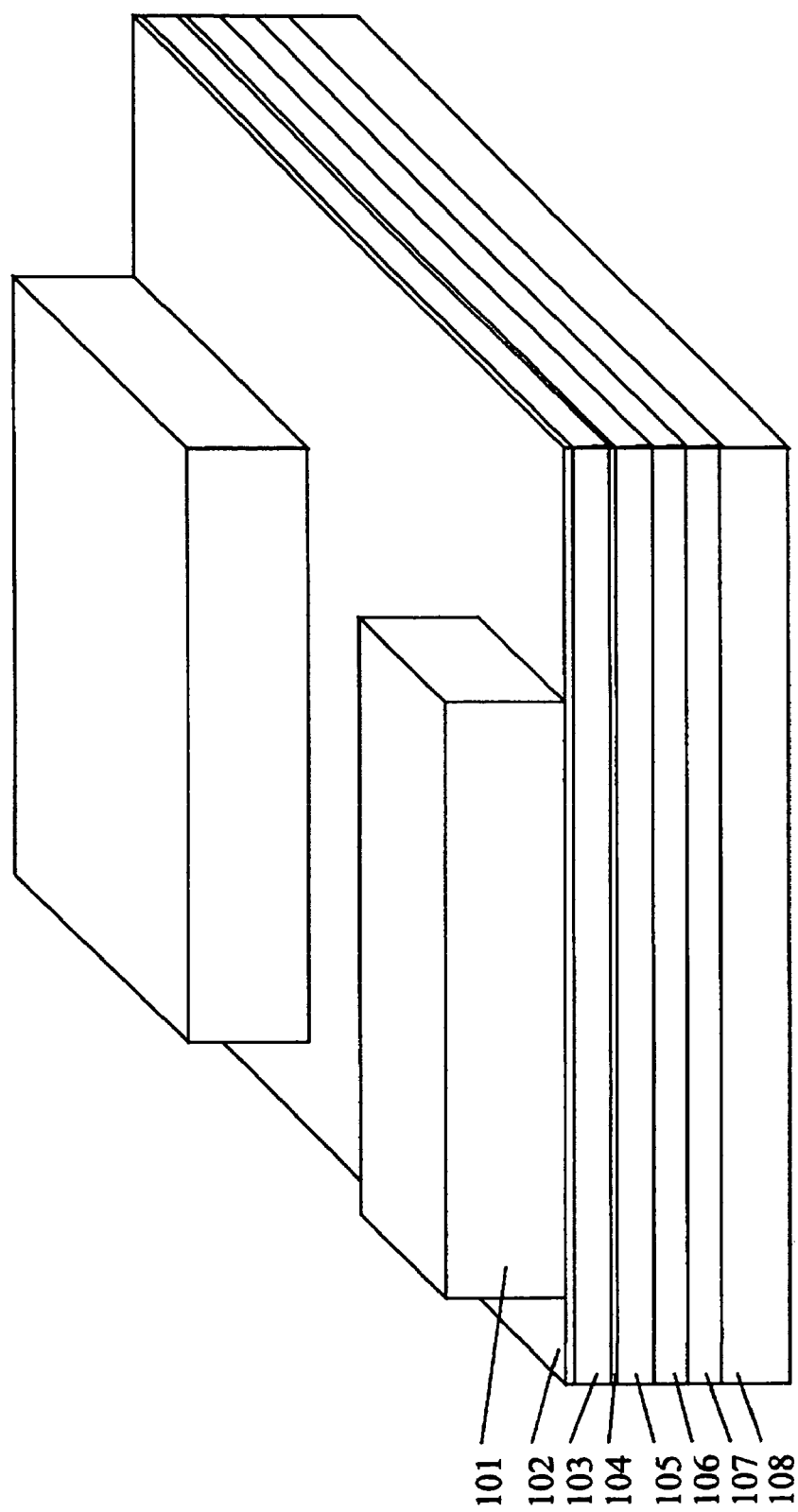

FIG. 10B
11) Damage-less removal of oxide (HF dip or vapor for example).

Figure 10C:
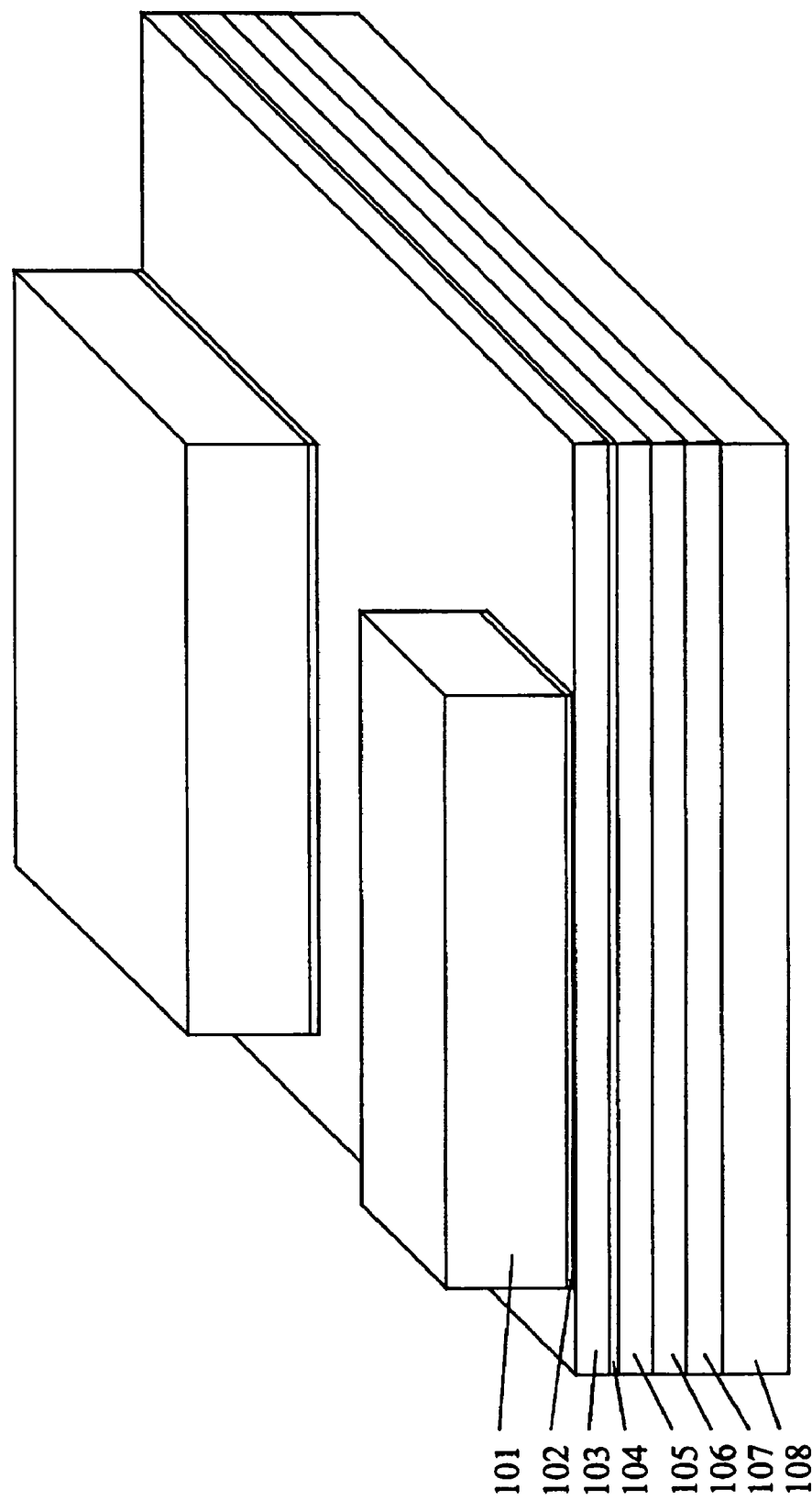

FIG. 10C
12) Damage-less etch of trenches through the device layers, stopping in the wafer bulk.

Figure 10D:
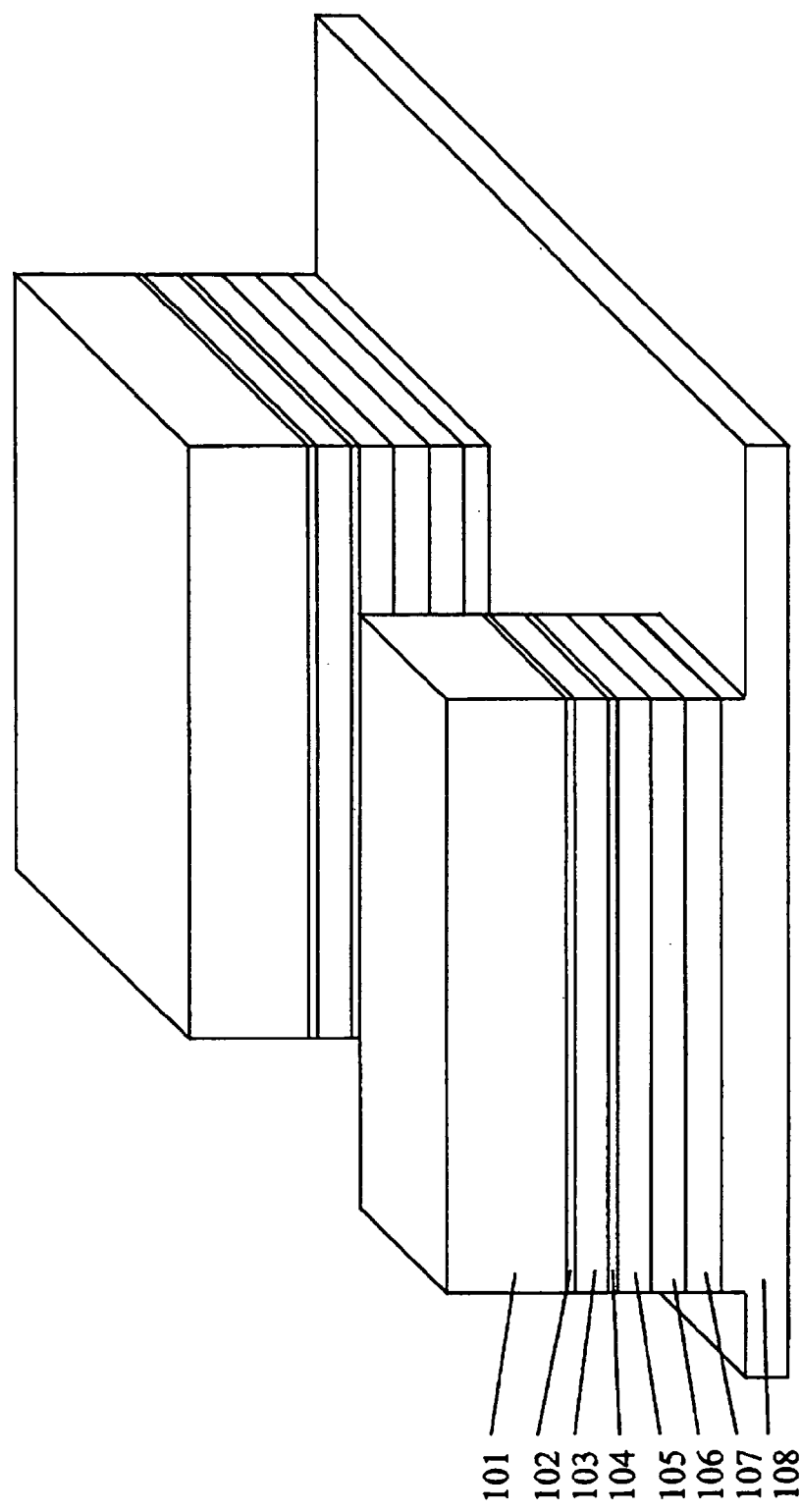
Figure 10E:
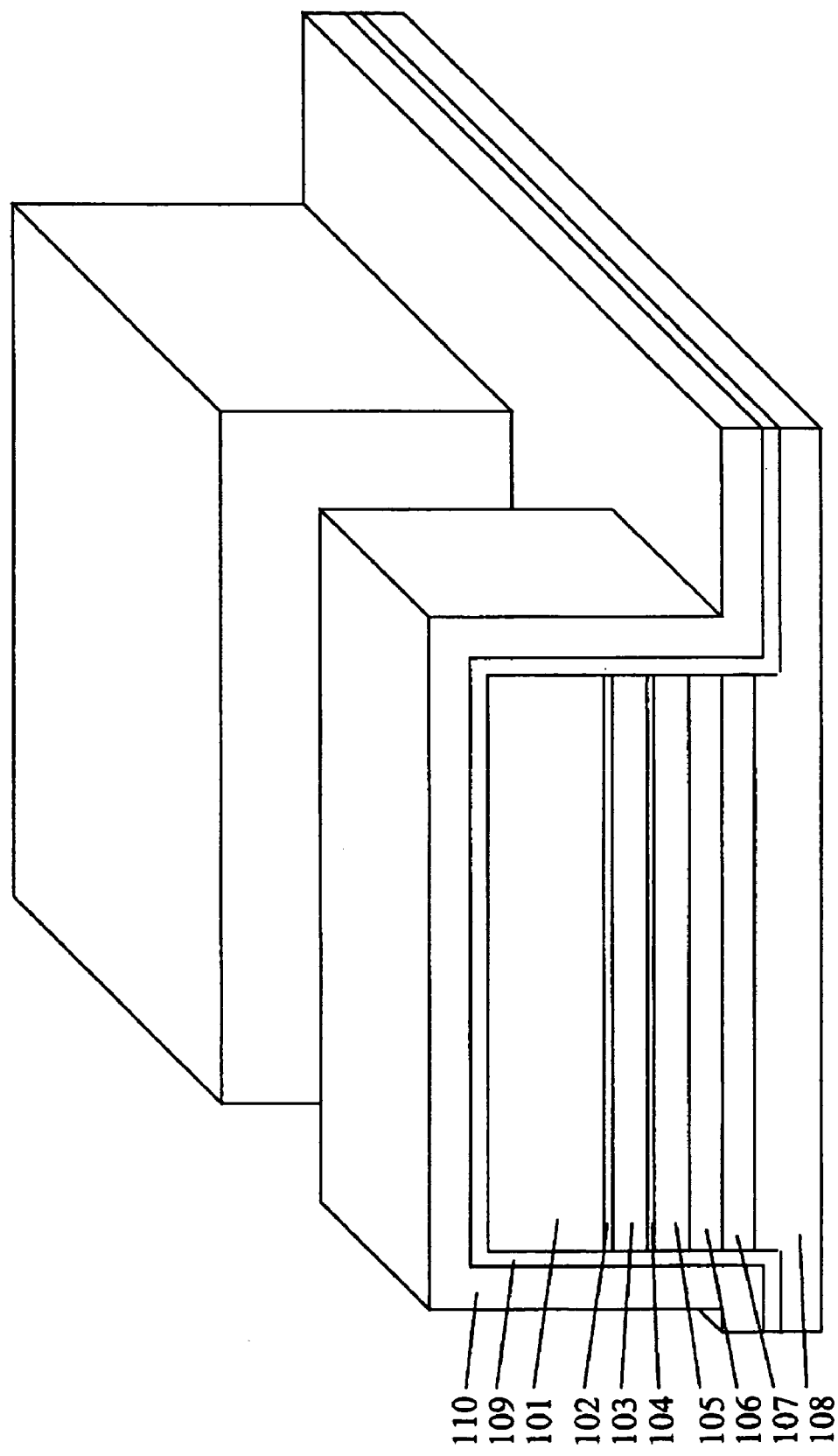

FIG. 10D
13) Deposition (CVD for example) of gate stack (gate insulator & gate electrode).

FIG. 10E

Formation of Gate Contact Pads
14) Lithography-->Mask2: patterning of "Gate Stack".

Figure 10F:
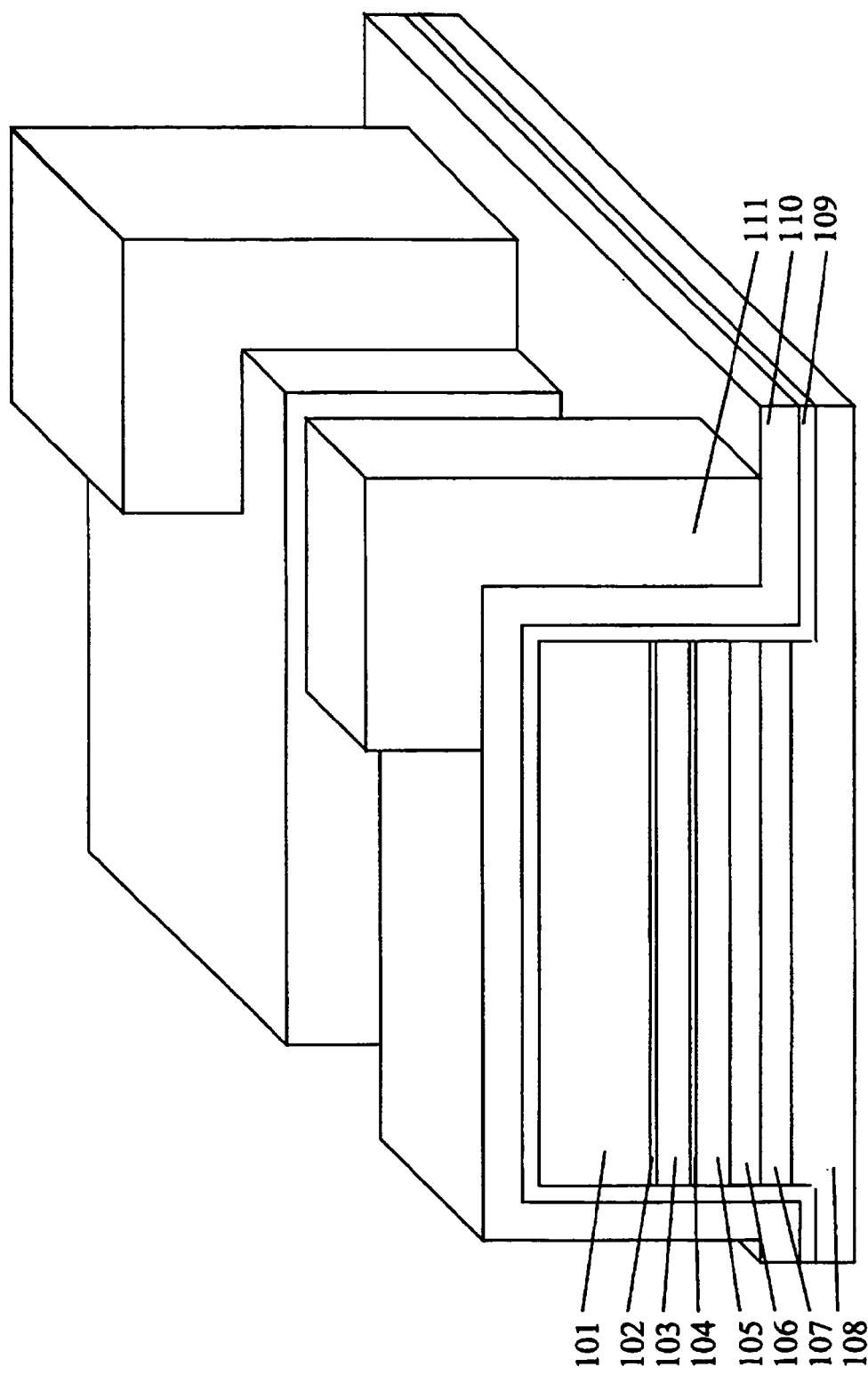
Figure 15:
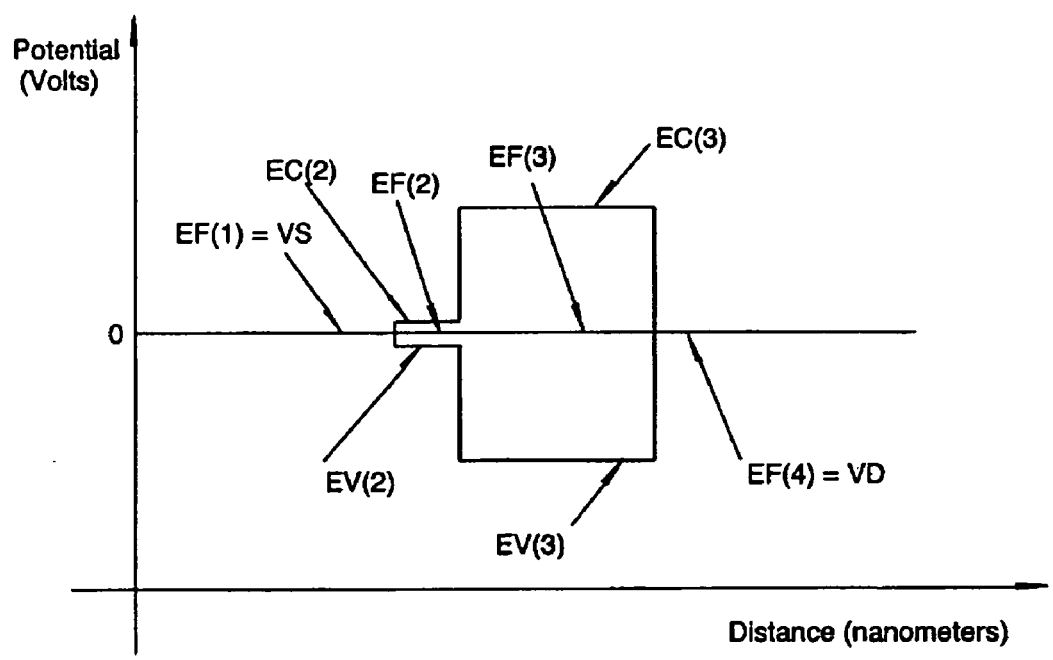
FIG. 15 is a schematic band alignment, along a vertical section from Source to Drain in the device of FIG. 1, near the interface with the Gate insulator, in the absence of applied voltage, that is, all electrodes are at the same potential.

FIG. 10F
15) Etch through gate stack, stopping on Si3N4 and wafer bulk.

Figure 10G:
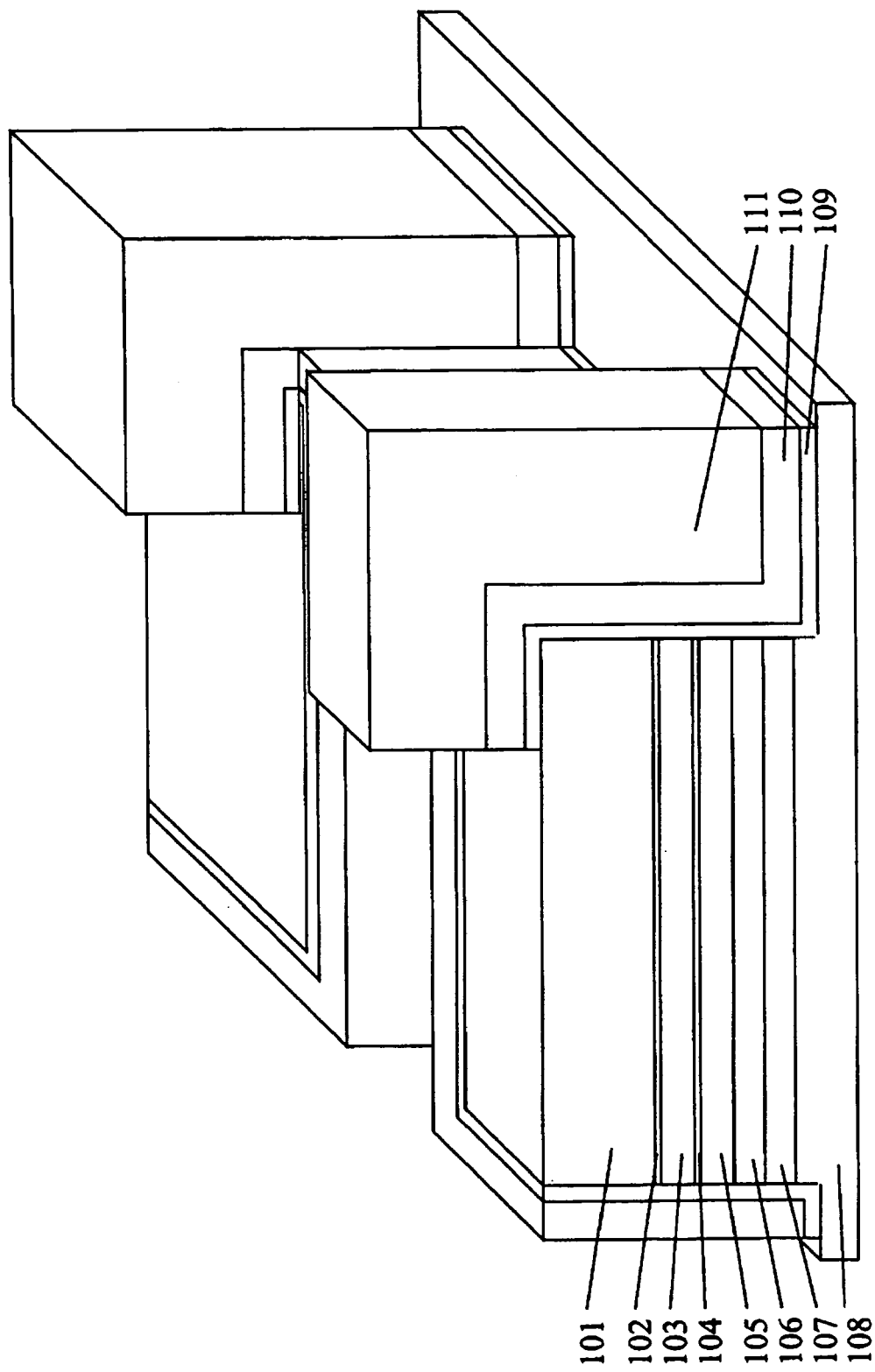

FIG. 10G
16) Resist strip & clean.

Figure 10H:
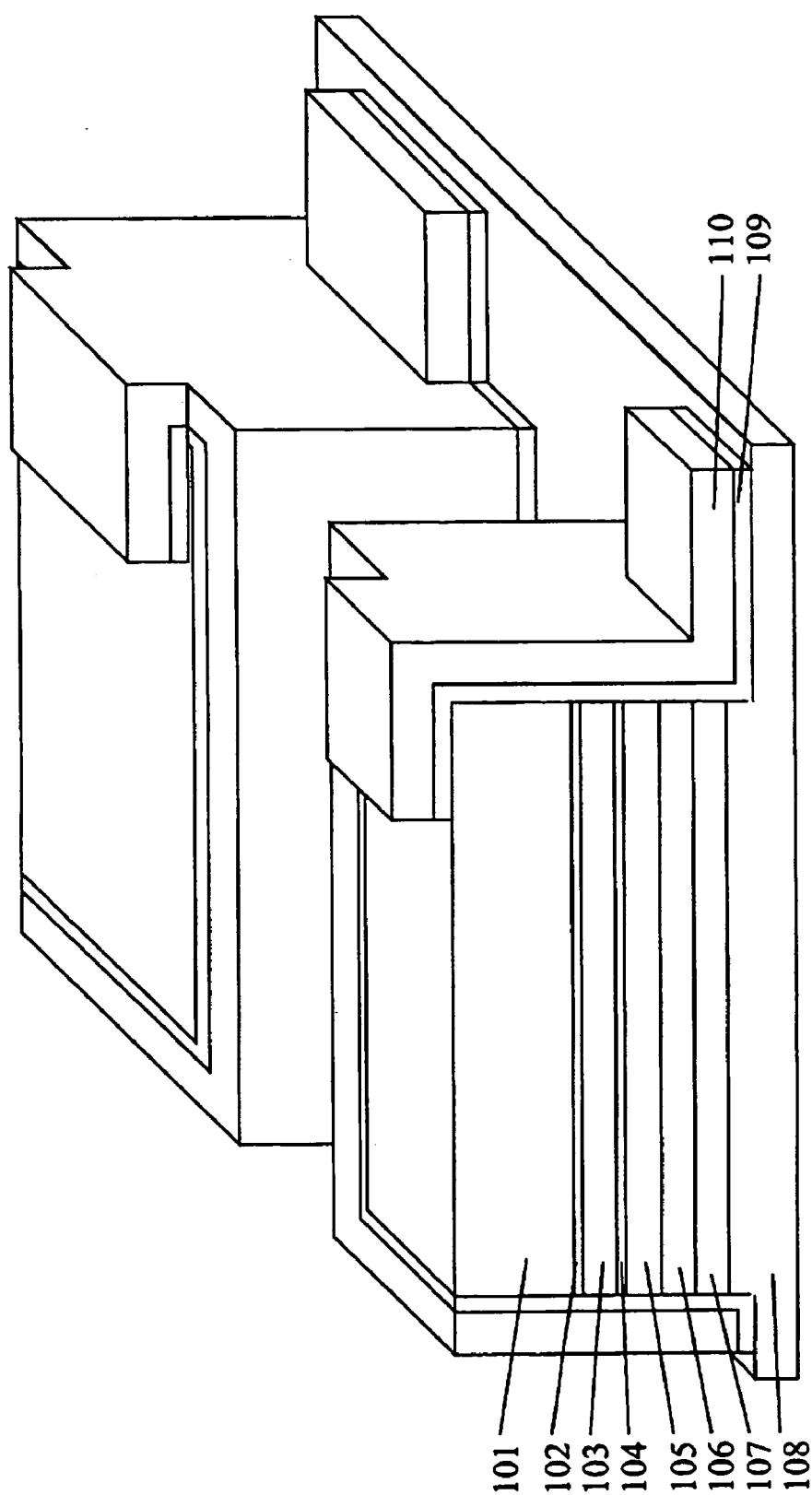
Figure 10I:
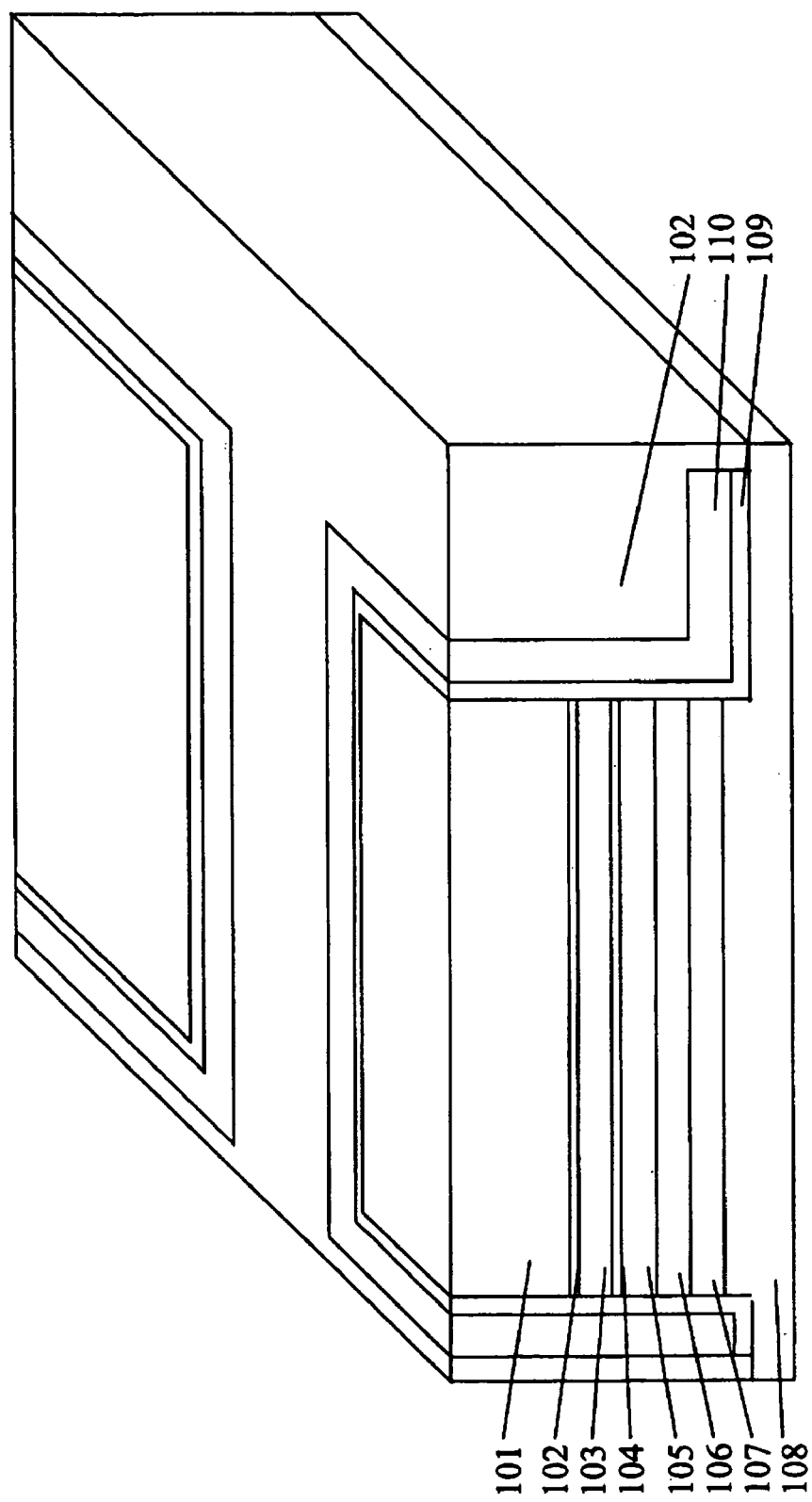

FIG. 10H
17) Trench filling with deposition of SiO2 (HDP-CVD for example).
18) Planarization by CMP, stopping on Si3N4.

FIG. 10I

Formation of Contact Holes to Top Plate of Capacitor
19) Lithography-->Mask3: patterning of contact holes.
20) Dry etch of Si3N4 and SiO2, stopping on top plate of capacitor.
21) Resist strip & clean.

Figure 10J:
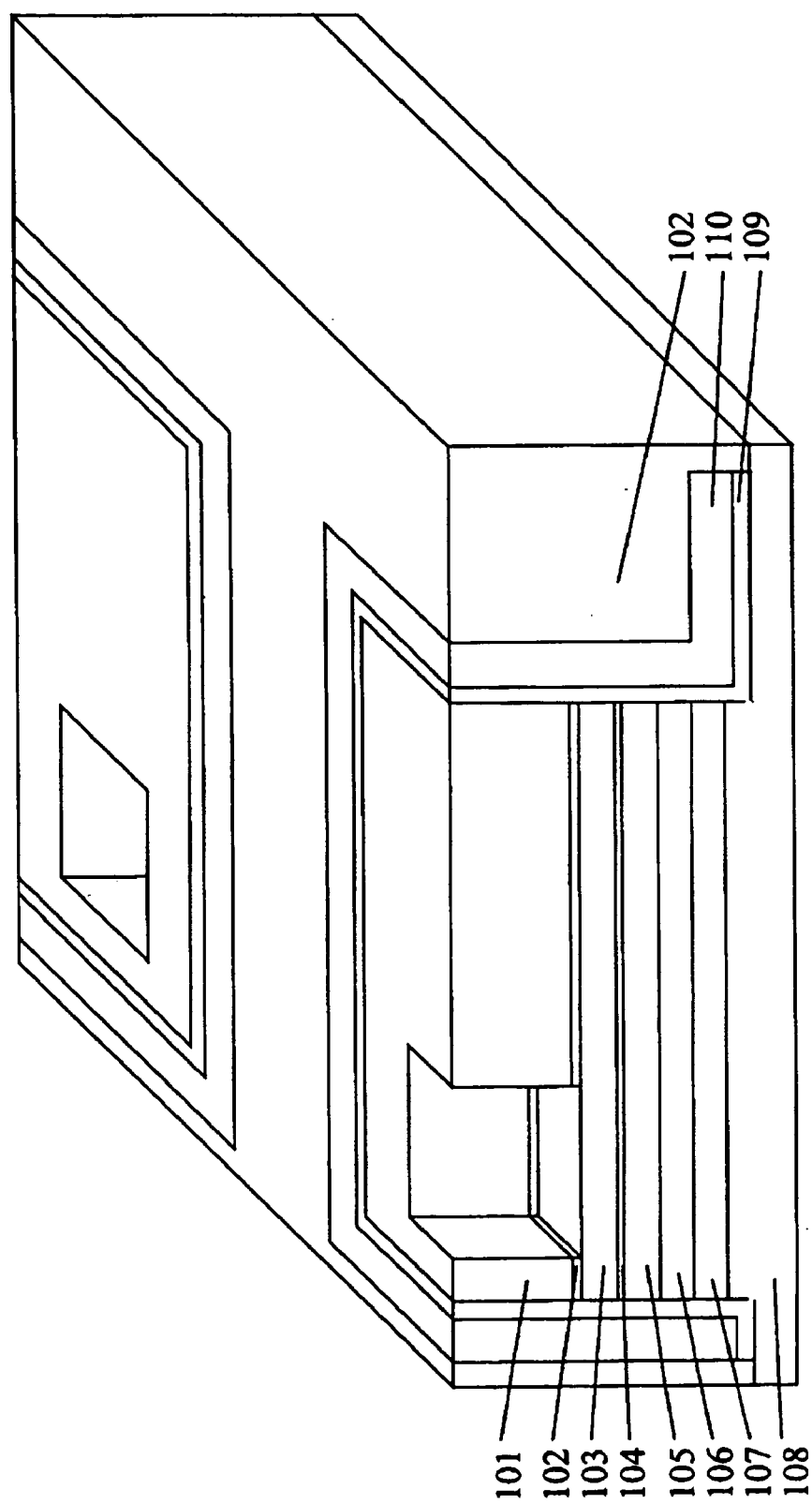
Figure 10K:
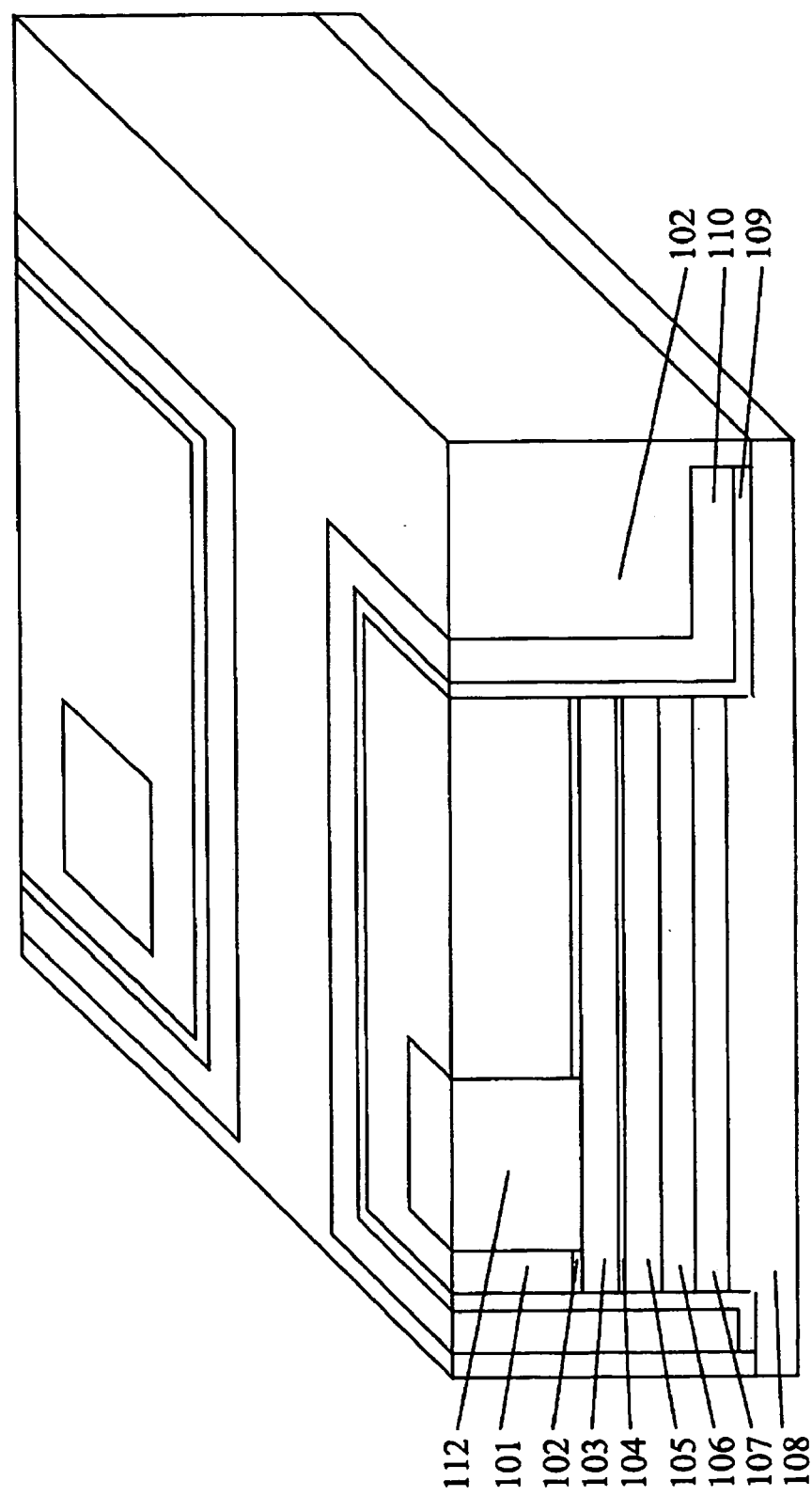

FIG. 10J
22) Deposition (PVD or CVD for example) of metal to fill contact hole.
23) Planarization by CMP, stopping on SiO2 and Si3N4.

FIG. 10K

Source Contact
24) Lithography-->Mask5: contact to the source.
25) Etch through Si3N4, SiO2, TiN, Insulator, TiN, Si, stopping inside source (SiGeC).
26) Resist strip & clean.

Figure 10L:
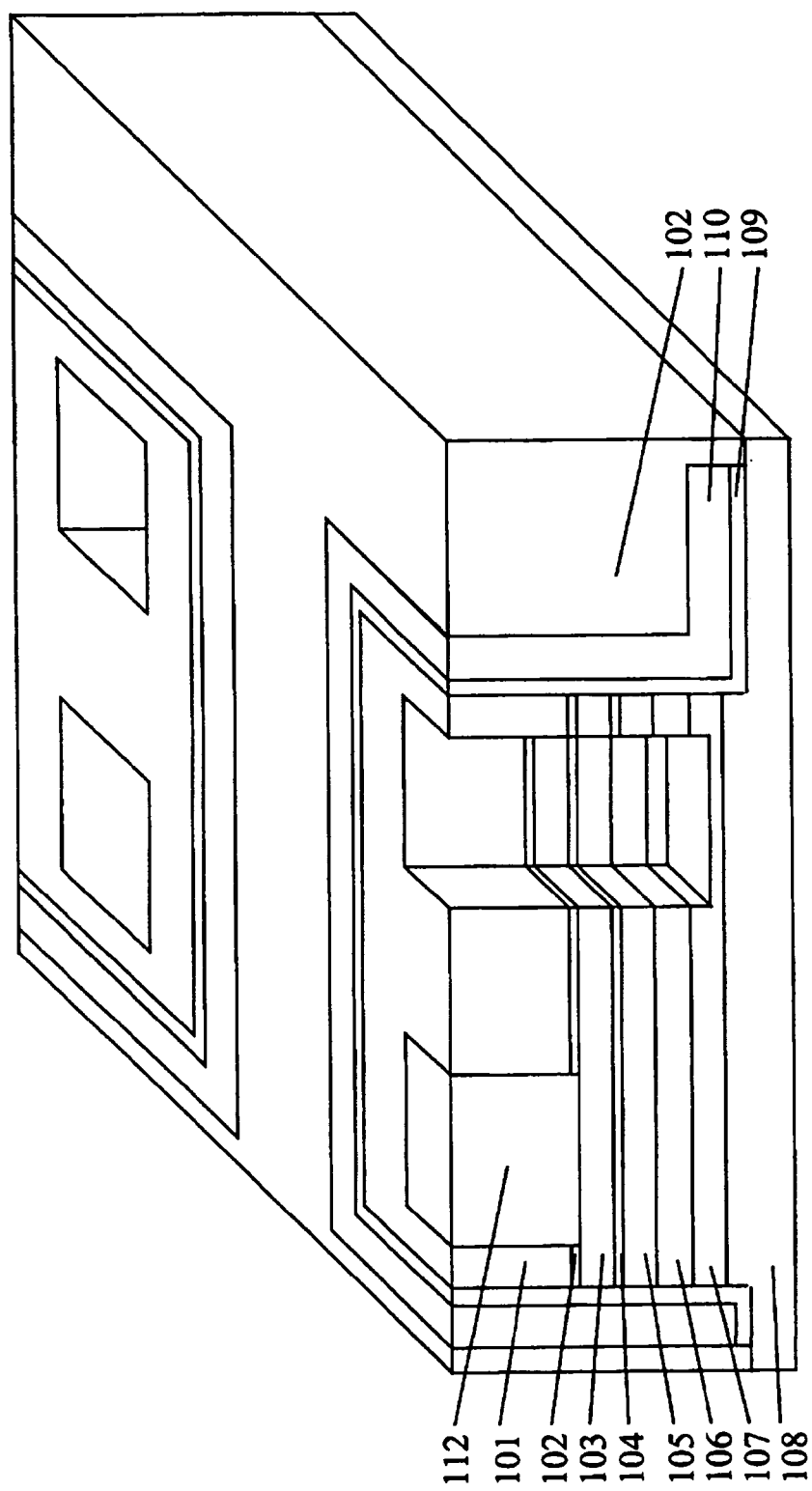

FIG. 10L
27) Conformal deposition of SiO2 and Si3N4
28) Etch back to make inner-wall spacers.

Figure 10M:
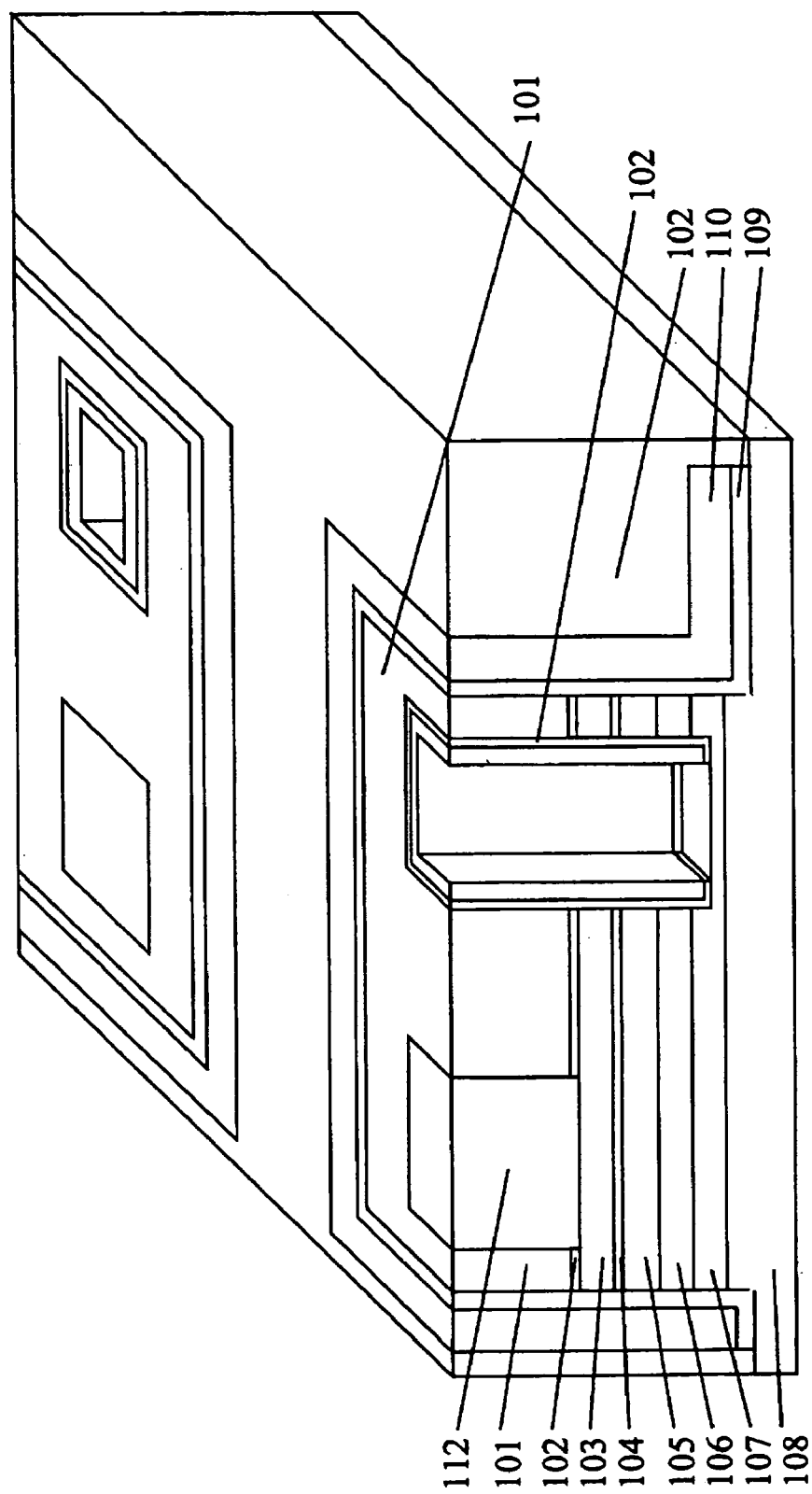

FIG. 10M
27) Deposition (PVD or CVD for example) of metal (with Fermi-Level in the middle of the band-gap of the source-SiGeC) to fill contact hole.
28) Planarization (CMP for example).

FIG. 10N

Process Flow #2

"Edge Gate" device architecture, with embedded capacitor and source at the bottom of device layer stack.

Epitaxial Device-Layer Growth
1) Bare silicon wafer (undoped, <100>).
2) Epi of source layer (undoped Si1-x-yGexCy or Si1-xGex/Si1-yCy superlattice)
3) Epi of channel layer (undoped Si)
4) Epi of drain layer (TiN)
5) Epi of Insulator which can be Ferroelectric (for example BaTiO)

Figure 10N:
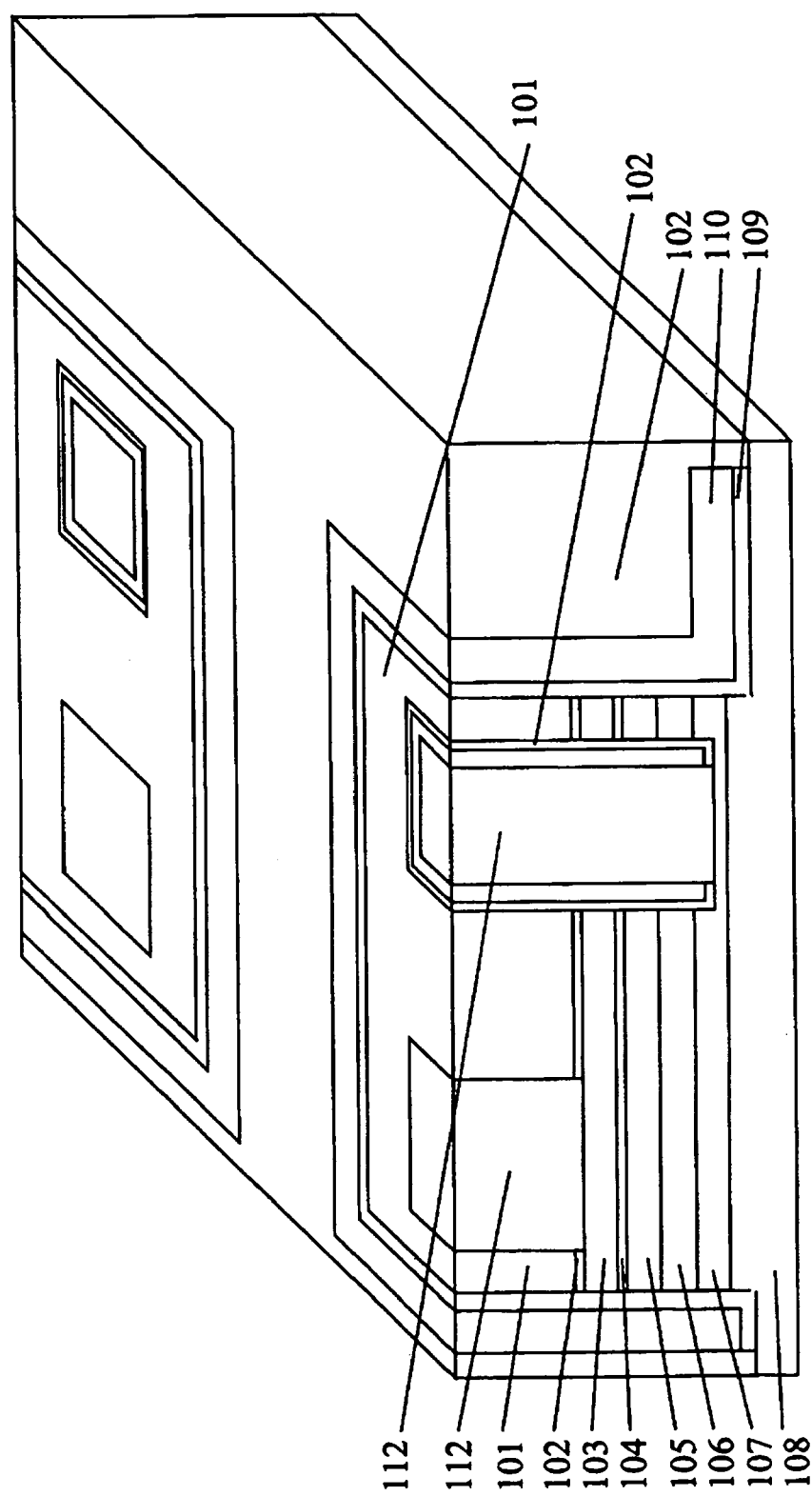
Figure 11A:
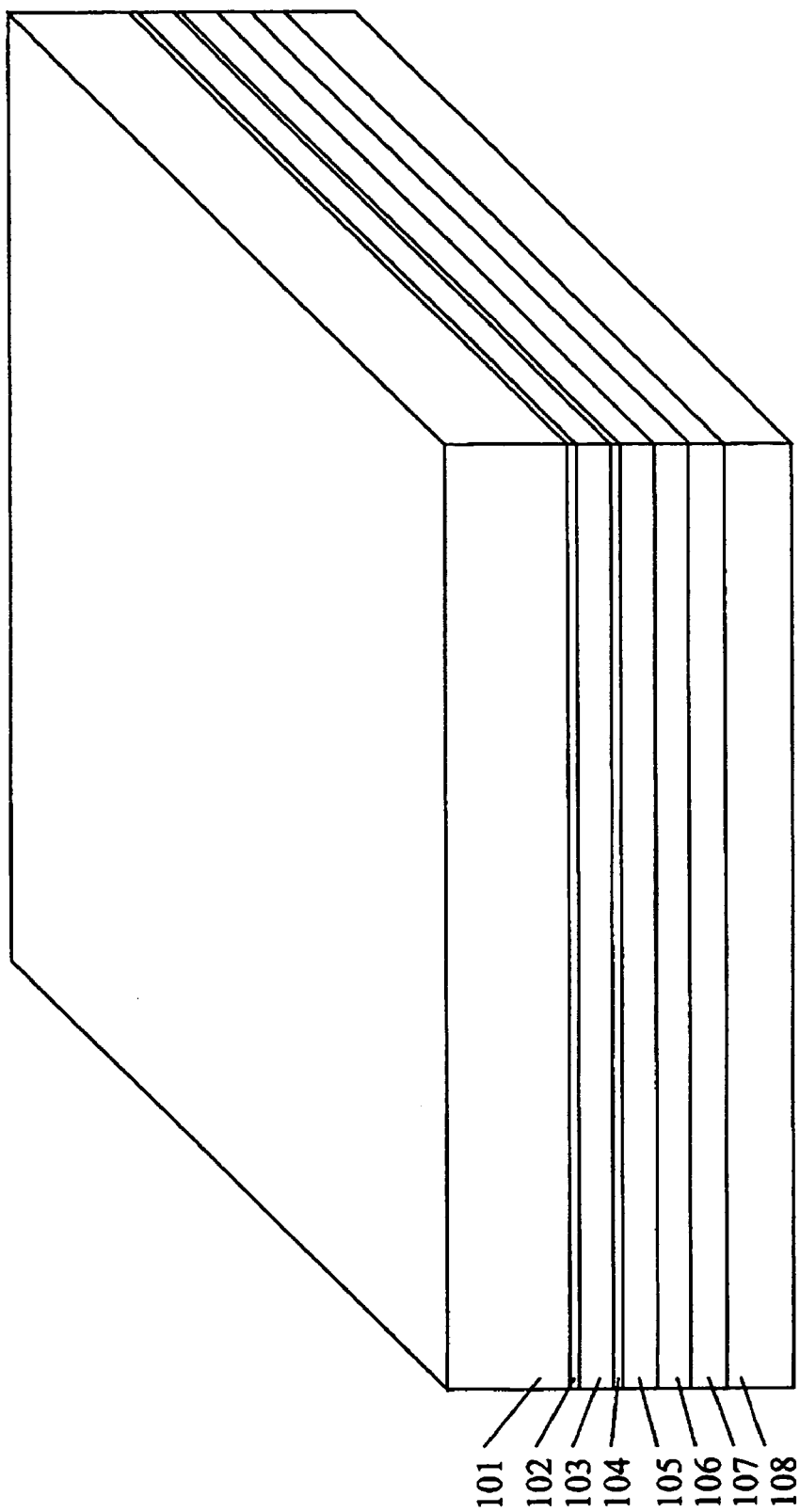
FIGS. 11A to 11M illustrate a process flow for manufacturing a device according to the invention according to a second preferred embodiment.
Figure 11B:
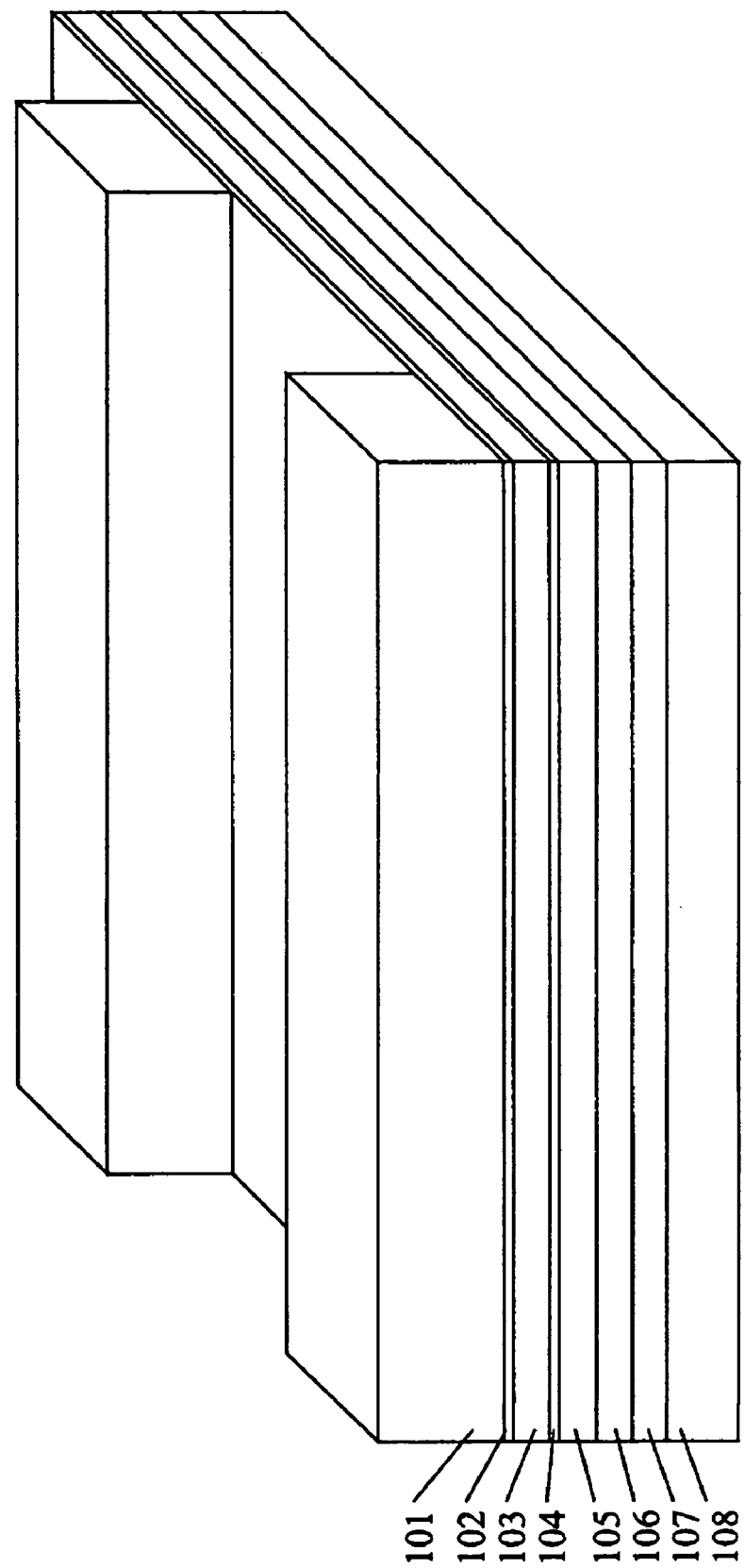
Figure 11C:
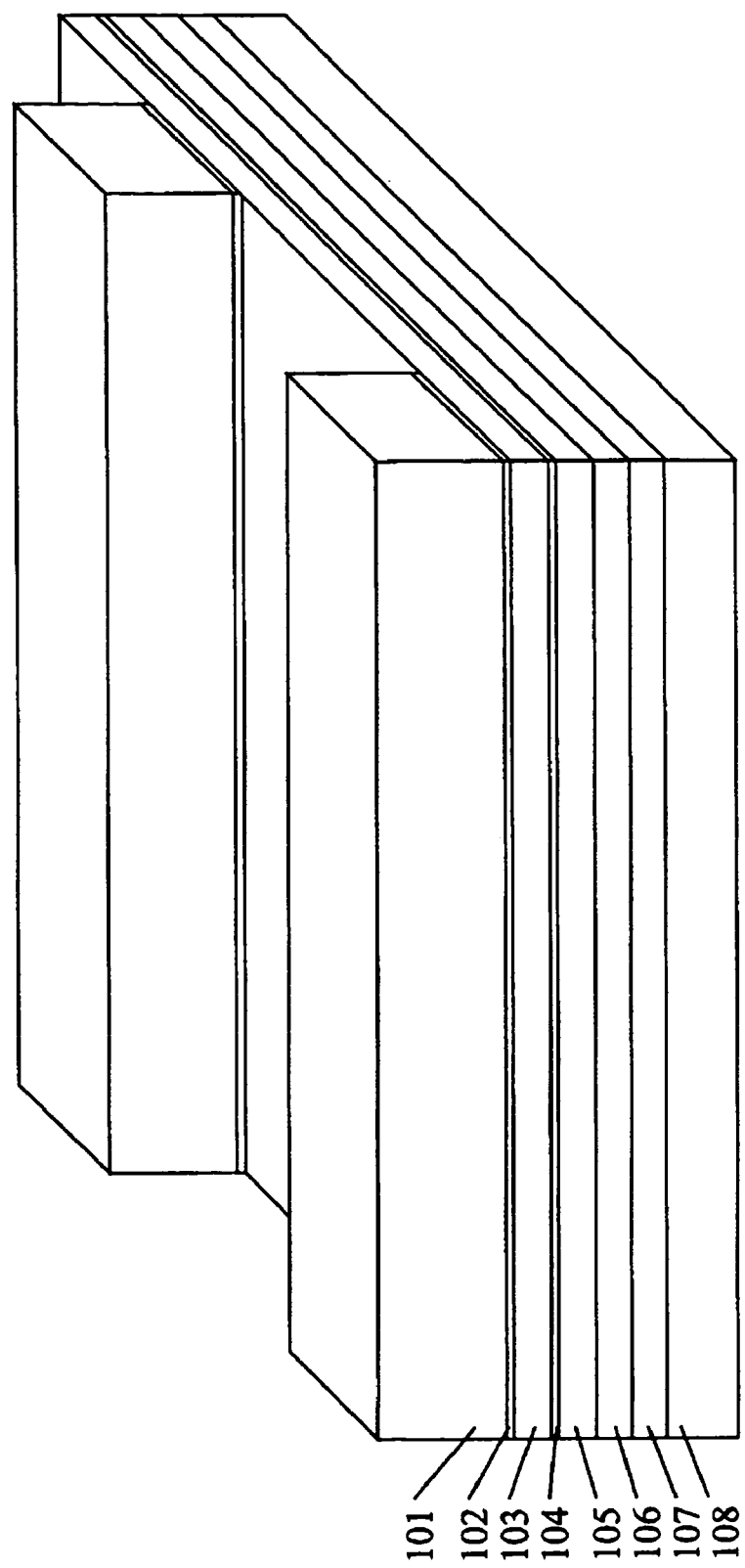
Figure 11D:
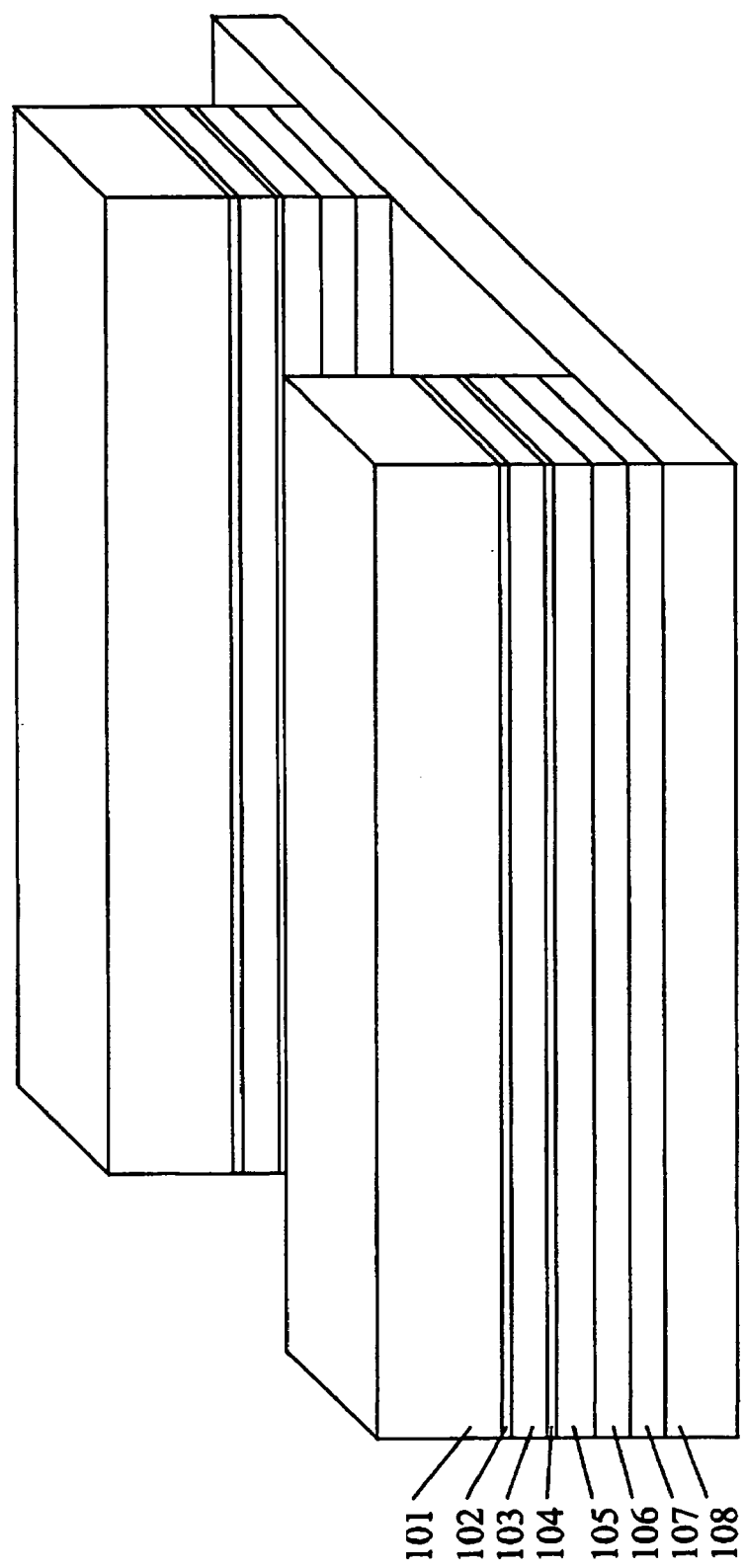
Figure 11E:
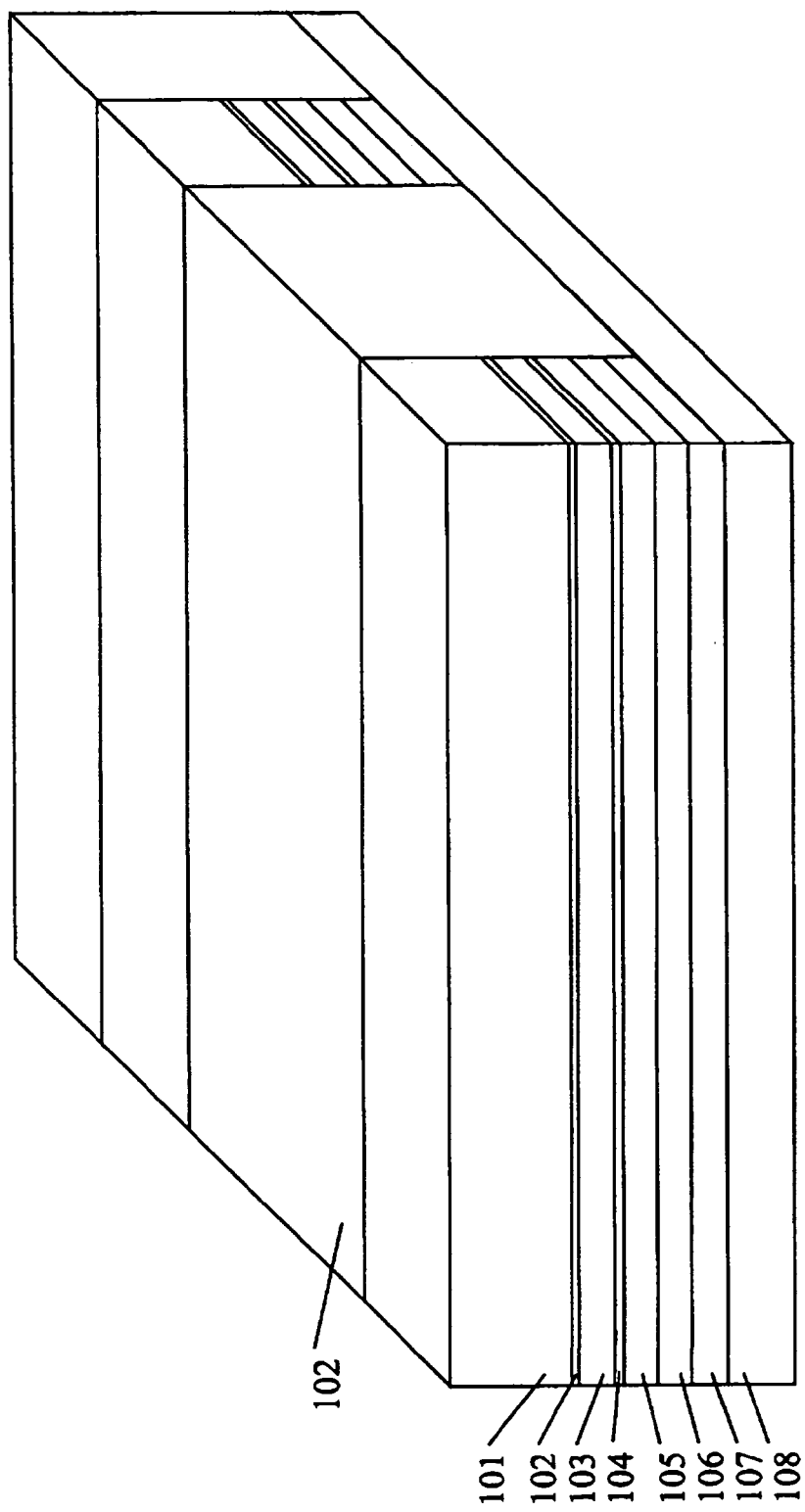
Figure 11F:
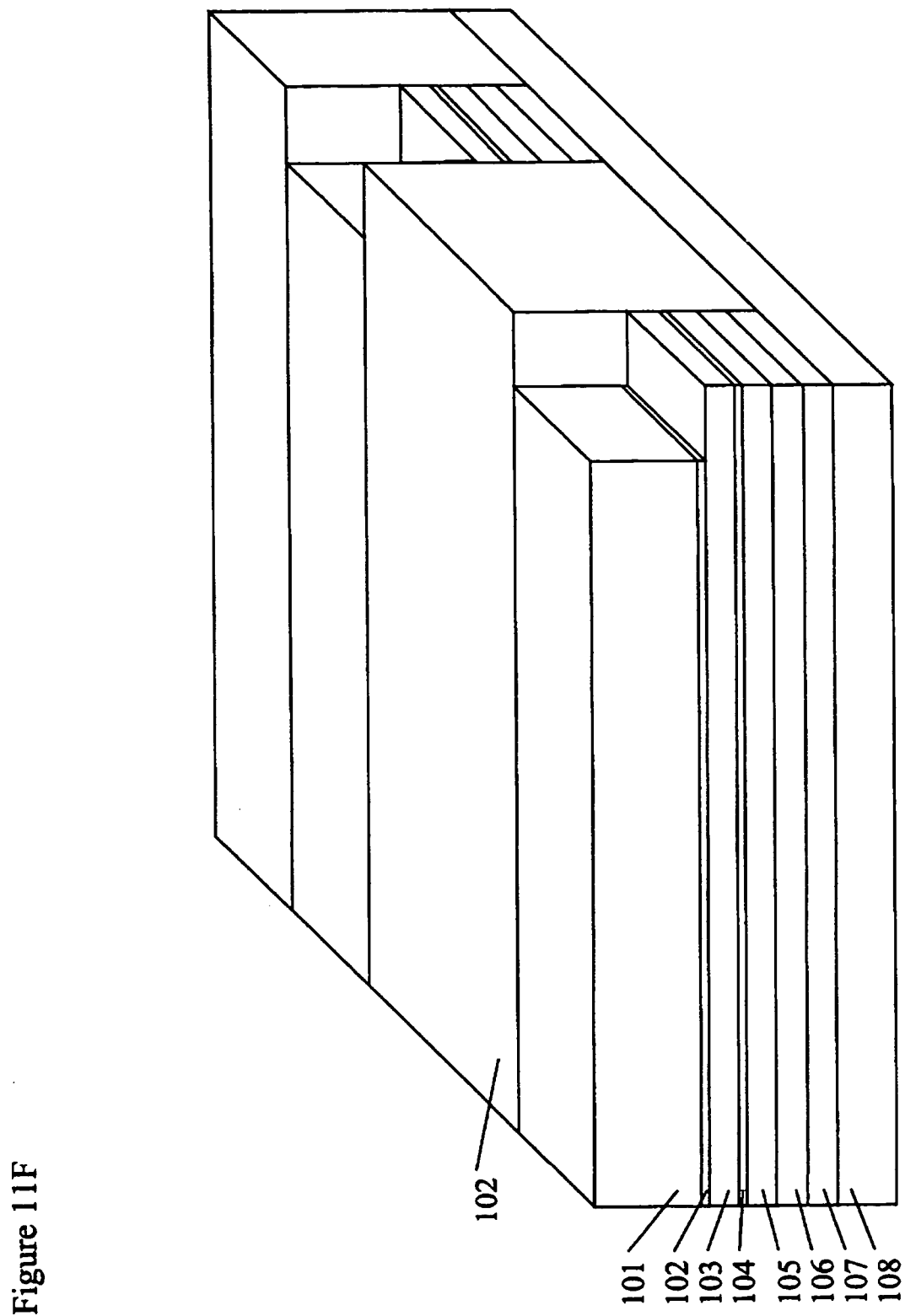
Figure 11G:
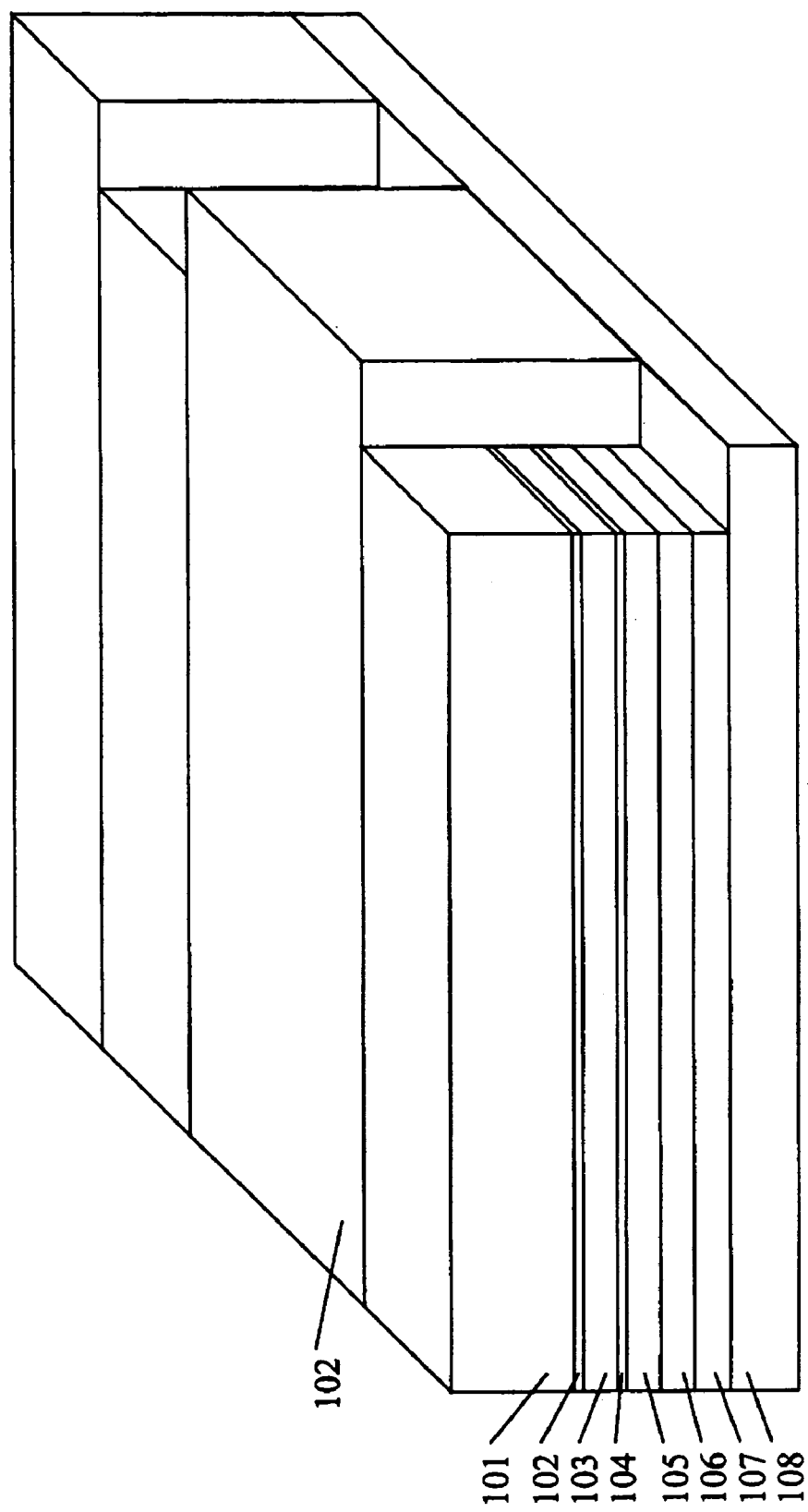
Figure 11H:
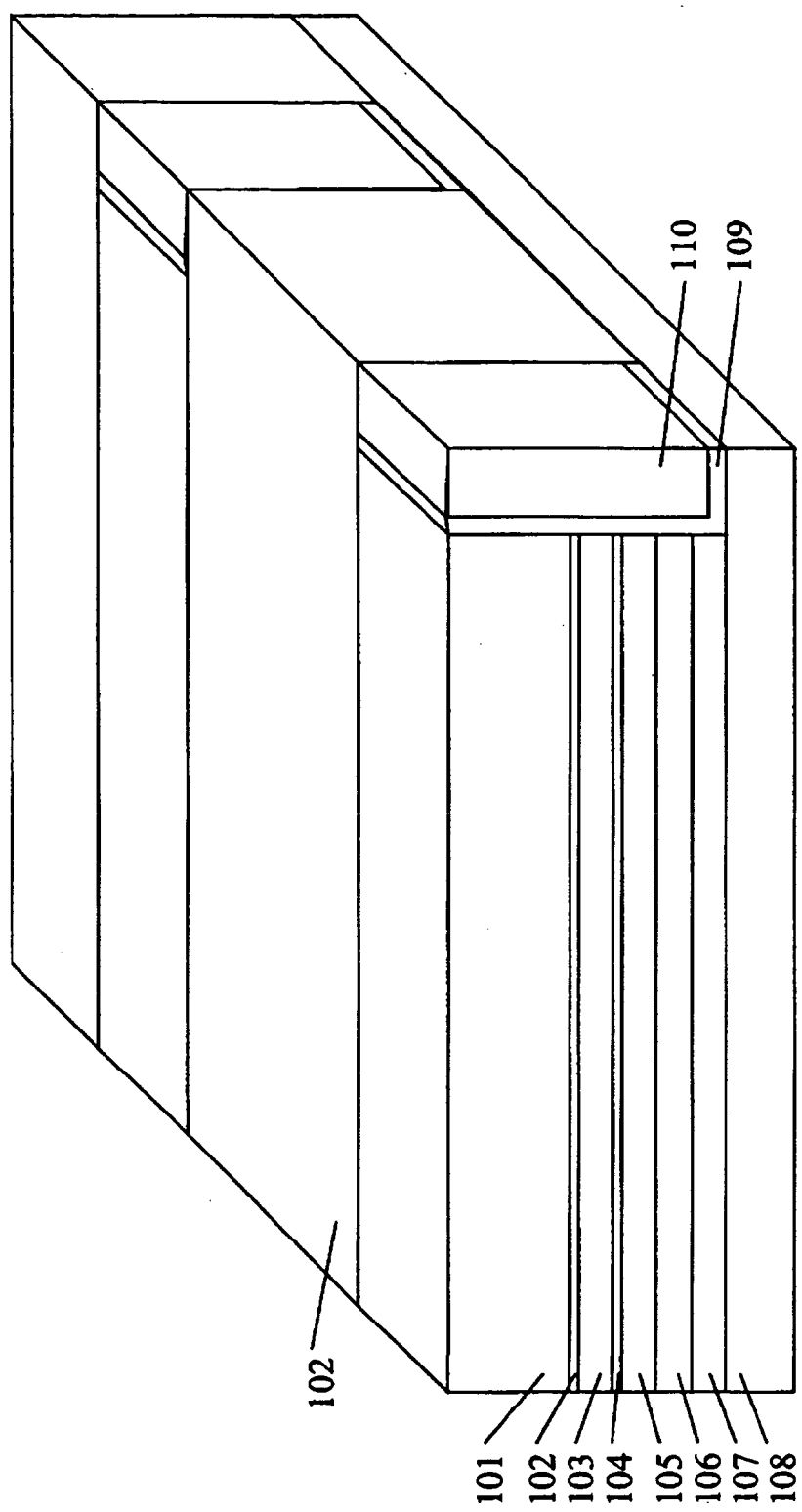
Figure 11I:
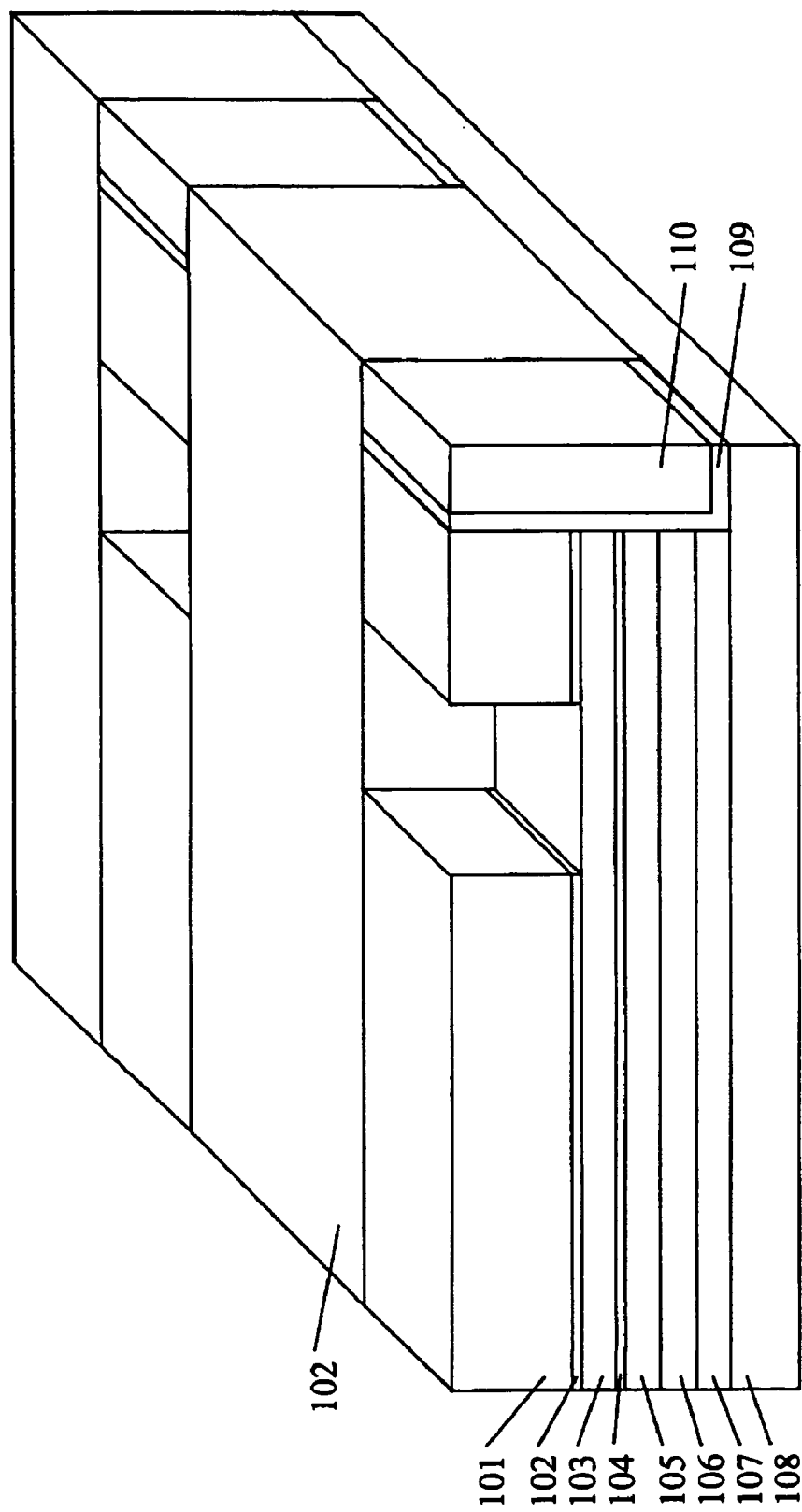
Figure 11J:
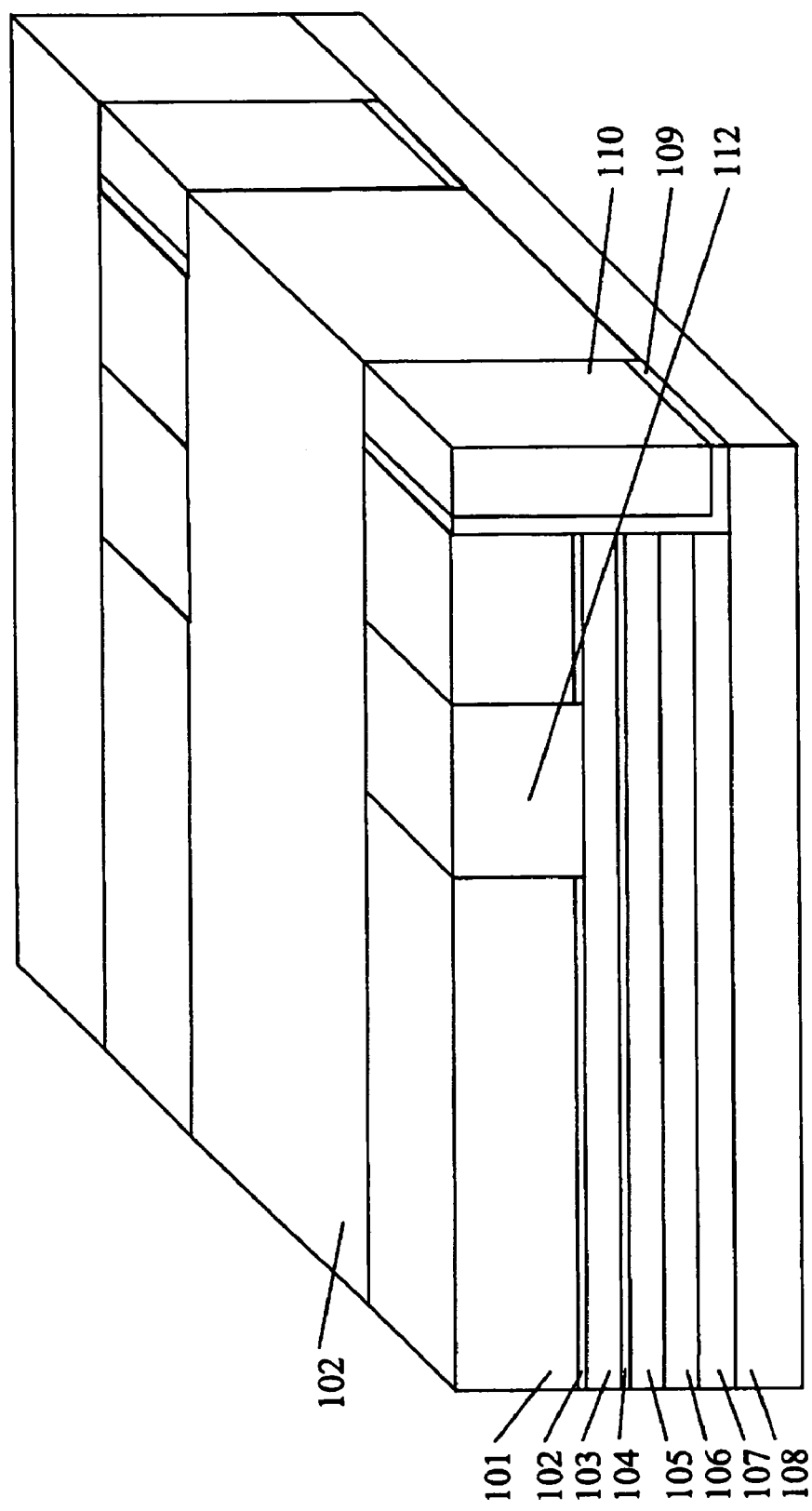
Figure 11K:
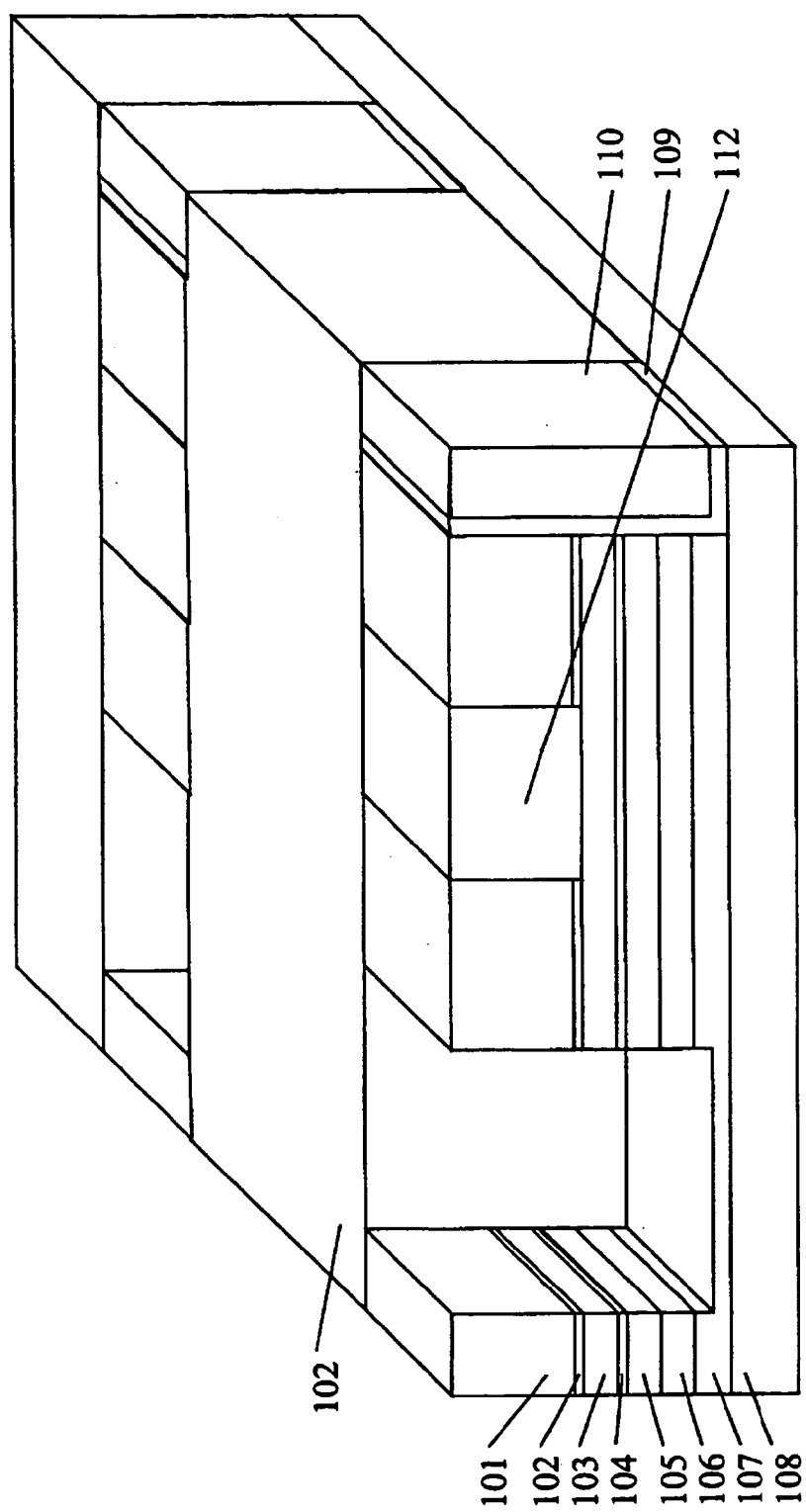
Figure 11L:
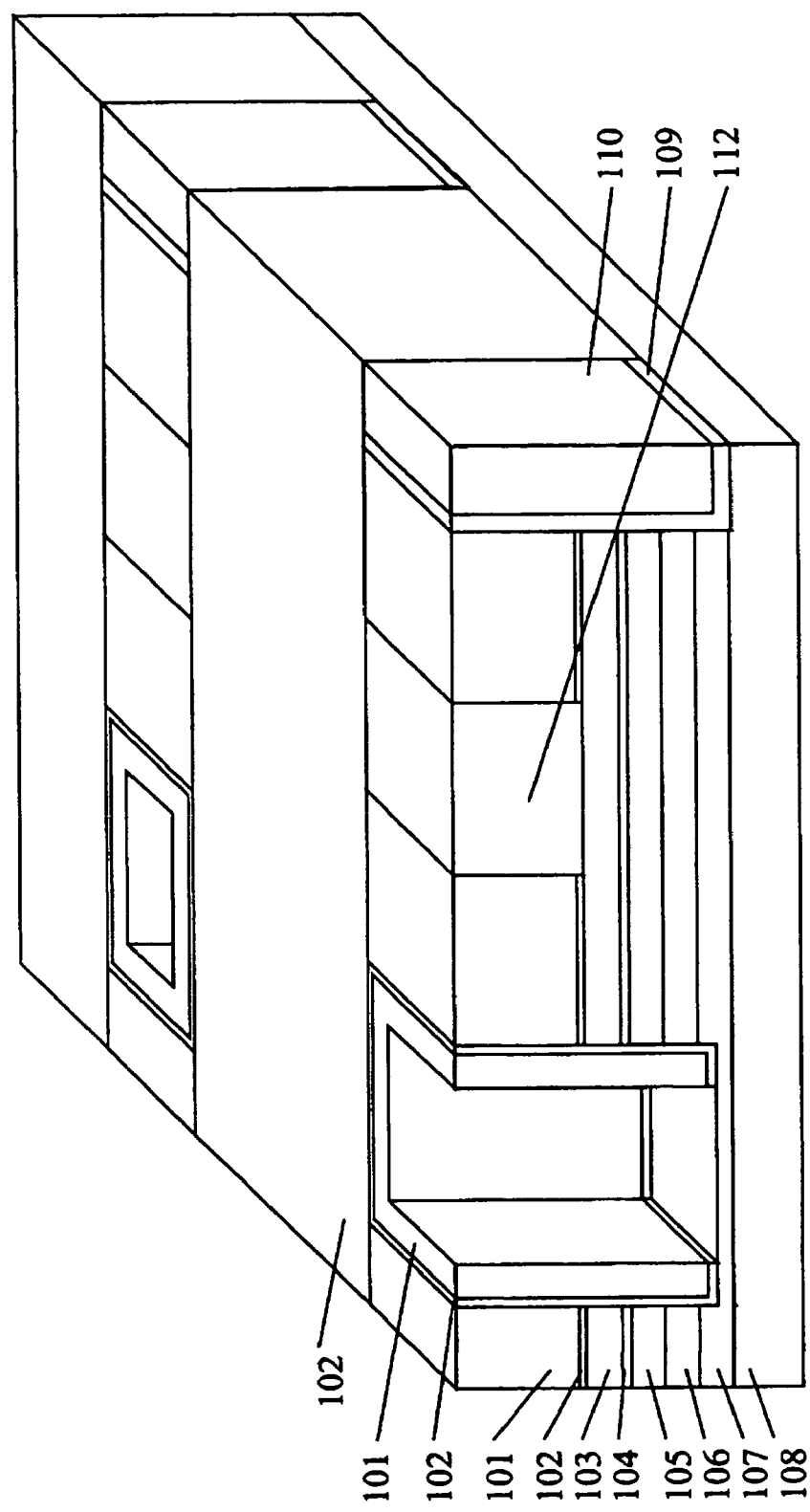
Figure 11M:
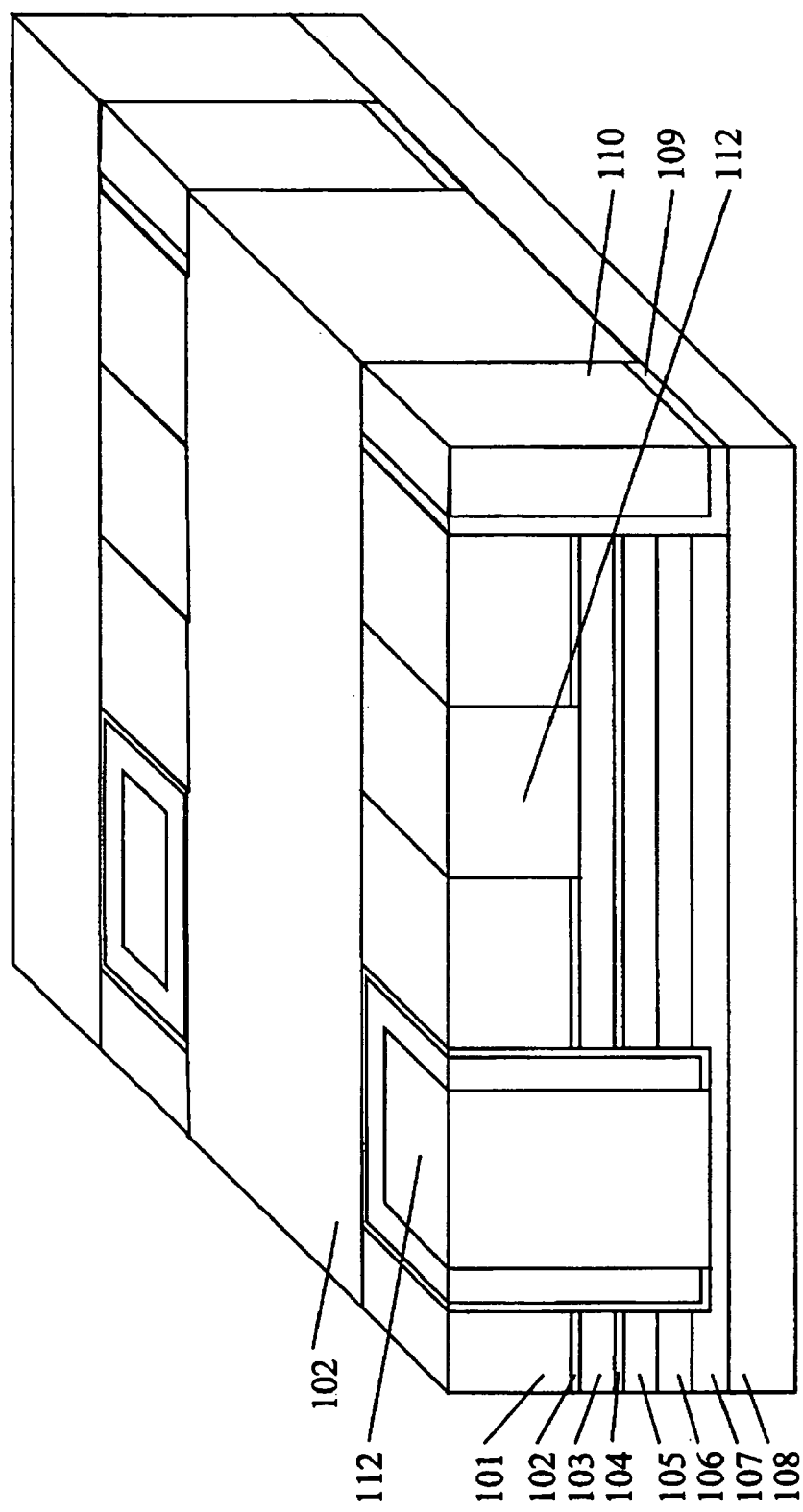

6) Epi of capacitor plate (TiN)
7) Deposition of thin SiO2 and thck Si3N4
FIG. 11A
Definition of Trenches
8) Lithography-->Mask1: definition of trenches.
9) Etch through Si3N4, stopping on SiO2.
10) Resist strip & clean.
FIG. 11B
11) Damage-less removal of oxide (HF dip or vapor for example).
FIG. 11C
12) Damage-less etch of trenches through the device layers, stopping in the wafer bulk.
FIG. 11D
13) Trench filling with deposition of SiO2 (HDP-CVD for example).
14) CMP of SiO2, stopping on Si3N4.
FIG. 11E
Formation of "Edge-Gate"
15) Lithography-->Mask2: trenches on the "Mesa" structures defined by Mask1.
16) Etch through Si3N4, SiO2.
17) Resist strip & clean.
FIG. 11F
18) Etch through TiN, Insulator, TiN, Si, SiGeC.
FIG. 11G
19) Deposition of gate stack (gate insulator & gate electrode).
20) Planarization by CMP, stopping on SiO2 and Si3N4.
FIG. 11H
Formation of Contact Holes to Top Plate of Capacitor
21) Lithography-->Mask3: patterning of contact holes.
22) Dry etch of Si3N4 and SiO2, stopping on top plate of capacitor.
23) Resist strip & clean.
FIG. 11I
24) Deposition (PVD or CVD for example) of metal to fill contact hole.
25) Planarization (CMP for example).
FIG. 11J
Source Contact
26) Lithography-->Mask4: contact to the source.
27) Etch through Si3N4, SiO2, TiN, Insulator, TiN, Si, stopping inside source (SiGeC).
28) Resist strip & clean.
FIG. 11K
29) Conformal deposition of SiO2 and Si3N4
30) Etch back to make inner-wall spacers.
FIG. 11L
27) Deposition (PVD or CVD for example) of metal to fill contact hole.
28) Planarization (CMP for example).
FIG. 11M
Process Flow #3
"Inner- & Edge-Gates" device architecture, with embedded capacitor and source at the top of device layer stack.
Process flow for "Inner-Gate" & "Edge-Gate" with "source on top" by wafer bonding, with blanket epitaxial growth, having embedded Ferroelectric capacitor.
The circuit configuration chosen, is a "NOR Gate" with 5 inputs (4 "inner-gates" and 1 "edge-gate"). The capacitor layers are not used (are in fact transparent to the functionality of simple logic gates). In an small change to this flow with an extra mask, the capacitor flms could have been removed from the "logic-only" areas.
Epitaxial Device-Layer Growth
1) Bare silicon wafer (undoped, <100>).
2) Epi of source layer (undoped SiGeC)
3) Epi of channel layer (undoped Si)
4) Epi of drain layer (TiN)
5) Epi of Ferroelectric (for example BaTiO)
6) Epi of capacitor plate (TiN)
FIG. 12A
7) Wafer bonding to an insulating substrate (Quartz or Sapphire for example).
FIG. 12B
8) Selective etch of the wafer bulk, stopping on the source layer (SiGeC)
FIG. 12C
9) Clean & Epi of Metal (for example TiN)
FIG. 12D
10) CVD of SiO2/Si3N4
FIG. 12E
11) Alignment Markers for Lithography tool.
Isolation of Source & Channel Layers
12) Lithography-->Mask1: definition of mesas.
13) Etch through Si3N4, stopping on SiO2
14) Resist strip & clean, with HF to remove thin SiO2.
FIG. 12F
15) Selective etch of TiN (for example with $H_2O_2$).
FIG. 12G
16) Low temperature oxidation of SiGeC (Source) and Si (Channel).
FIG. 12H
17) Trench filling with deposition of SiO2 (HDP-CVD for example).
18) CMP of SiO2, stopping on Si3N4.
FIG. 12I
Formation of "Edge" and "Inner" Gates.
19) Lithography-->Mask2: trenches on the "Mesa" structures defined by Mask1.
20) Etch through Si3N4, SiO2, TiN, SiGeC, Si, TiN, Ferroelectric, TiN.
21) Resist strip & clean.
FIG. 12J
22) Deposition (CVD) of gate stack (gate insulator & gate electrode).
23) CMP of gate stack, stopping on Si3N4 and SiO2.
FIG. 12K
Drain Contact
24) Lithography-->Mask3: contact to the drain.
25) Etch through SiO2, stopping on TiN.
26) Resist strip & clean.
FIG. 12L
27) Deposition (PVD or CVD for example) of metal to fill contact hole.
28) Planarization (CMP for example).
FIG. 12M
Source Contact
29) Lithography-->Mask4: contact to the source.
30) Etch through Si3N4, SiO2, stopping on TiN.
31) Resist strip & clean.
FIG. 12N
32) Deposition (PVD or CVD for example) of metal to fill contact hole.
33) Planarization (CMP for example).
FIG. 12O
Isolation of Drain Layers
34) Lithography-->Mask5: patterning of "drain layer (a metal)", which can also be used as "local interconnect".
35) Etch through SiO2 (field isolation), and drain metal film (TiN).
36) Resist strip & clean.

FIG. 12P

Ground Plane Contact

37) Lithography-->Mask6: contact to the ground plane.
38) Etch through SiO2 and Ferroelectric Insulator layer, stopping on TiN.
39) Resist strip & clean.
40) Deposition (PVD or CVD for example) of metal to fill contact hole.
41) Planarization (CMP for example).

(not shown in the drawings)

A Metal-Insulator-Semiconductor Field-Effect Transistor (MIS-FET) is disclosed where the electrostatic potential in a single device is symmetric for electrons and holes, in the source, channel, drain and gate regions, with the source to channel interface being different from the channel to drain interface.

A Metal-Insulator-Semiconductor Field-Effect Transistor (MIS-FET) is disclosed where the electrostatic potential in a single device is symmetric for electrons and holes, in the source, channel, drain and gate regions, with the source to channel interface being different from the channel to drain interface, and the source to channel barrier height can be modulated by gate action (field-effect), and the channel to drain barrier height is not affected by gate bias.

A Metal-Insulator-Semiconductor Field-Effect Transistor (MIS-FET) is disclosed, composed of the following active regions:
  a) A channel layer, made with a "wider" band-gap undoped semiconductor.
  b) A drain layer, made with a metal directly interfaced to the channel material (Schottky junction), having a Fermi-Level value in the middle of the band-gap of the channel material.
  c) A source layer, made with a semiconductor with a "narrower" band-gap, centered with the band-gap of the channel material (equal offsets in the conduction and valence bands between the source and channel layers).
  d) A source contact metal with a Fermi-Level in the middle of the band-gap of the channel material.
  e) A gate electrode with a Fermi-Level in the middle of the band-gap of the channel material.

A MISFET is disclosed with specific embodiment in the silicon materials system, having the following device layers:
  a) Channel material: undoped silicon (Si).
  b) Drain material: epitaxial titanium nitride (TiN).
  c) Source material: Si1-x-yGexCy, either as random alloy or short-period superlattice of alternating Si1-yCy/Si1-xGex layers for example.
  d) Source contact metal: epitaxial titanium nitride (TiN).
  e) Gate electrode: titanium nitride (TiN).

A Metal-Insulator-Semiconductor Field-Effect Transistor (MIS-FET) concept is disclosed where a single device functions as a N- or P-type, depending only on the applied bias conditions, acting like a NMOS when drain to source (VDS) and gate to source (VGS) voltages are positive, and acts like a PMOS when drain to source (VDS) and gate to source (VDS) voltages are negative.

With the device according to the invention it is possible to build a one-transistor (1T) CMOS circuits having configurations where "inverters", "logic gates", memory cells, are fabricated with a single device which sequentially behaves as NMOS and PMOS, by appropriately sequentially changing the voltage at the source terminal.

It is also possible to build a Two (identical) Transistor (2T) CMOS circuits having configurations where "inverters", "logic gates", memory cells, are fabricated with two identical devices, which behave as NMOS and PMOS by connecting their source terminals to the appropriate voltage sources.

The MISFET can be used for logic applications, for Random Memory (Dynamic, Static, Flash, Ferroelectric) applications, for logic applications with embedded Random Memory (Dynamic, Static, Flash, Ferroelectric) elements, for Random Memory (Dynamic, Static, Flash, Ferroelectric) applications with embedded logic elements, for co-integration with image sensors, like CCD and CMOS imagers, or any other kind, for co-integration with any kind of Micro-Electronic-Mechanical Systems (MEMS), or Micro-Optical or Optoelectronic-integrated systems.

Process Integration Architecture depicted in FIG. 7a can be achieved, where the Drain layer is at the bottom of the device layer stack (and therefore the Source at the top), and where a Gate Stack is positioned in such a way, as to be common to two devices, each one with its separate drain and source layers and respective contacts.

Process Integration Architecture depicted in FIG. 7b can be achieved, where the Source layer is at the bottom of the device layer stack (and therefore the Drain at the top), and where a Gate Stack is positioned in such a way, as to be common to two devices, each one with its separate drain and source layers and respective contacts.

Process Integration Architecture depicted in FIG. 7a can be achieved, where, the Drain layer is at the bottom of the device layer stack (and therefore the Source at the top), and where a Drain Contact is positioned in such a way, as to be common to two devices, each one with its separate Gate Stack at the extreme edges of the device layer stack, and with its separate source layers and respective contacts.

Process Integration Architecture depicted in FIGS. 8 and 9a can be achieved where a single device layer stack, has single source and drain contacts, but several parallel Gates, for a compact "NOR-gate" arrangement. The arrangement as depicted, represents a solution with "Dynamic Source Voltage Supply".

Process Integration Architecture depicted in FIG. 9b can be achieved, where a single device layer stack, has a single drain contact, two source contacts, and several parallel Gates, for a compact "NOR-gate" arrangement. The arrangement as depicted, represents a solution with "Fixed Source Voltage Supply".

The process flow according to FIGS. 10A to 10N can be used for CMOS logic, with very reduced number of extra processing steps for the inclusion of embedded memory (possibly Ferroelectric).

The process flow according to FIGS. 11A to 11M can be used for CMOS logic, with very reduced number of extra processing steps for the inclusion of embedded memory (possibly Ferroelectric).

Figure 12A:
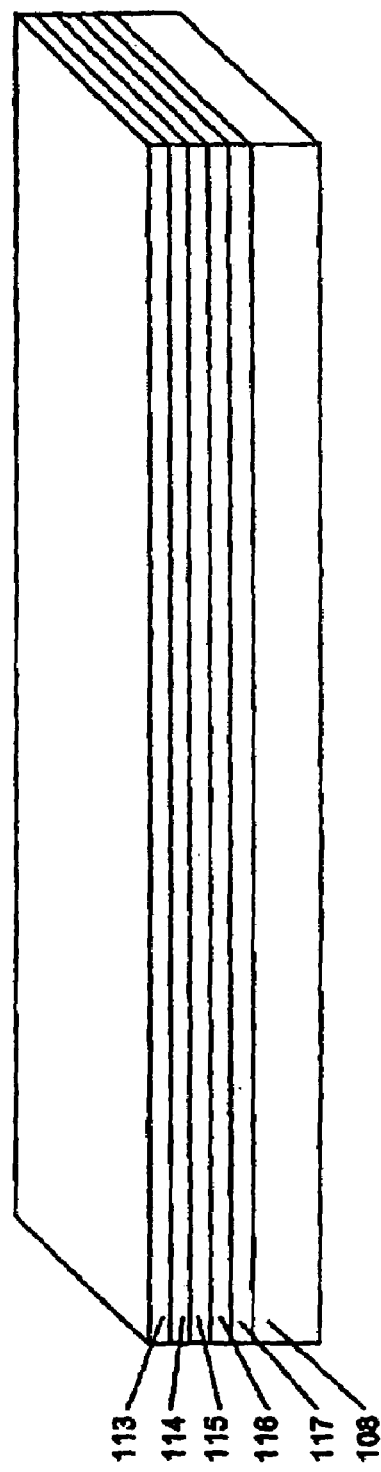
FIGS. 12A to 12Q illustrate a process flow for manufacturing a device according to the invention according to a third preferred embodiment.
Figure 12B:
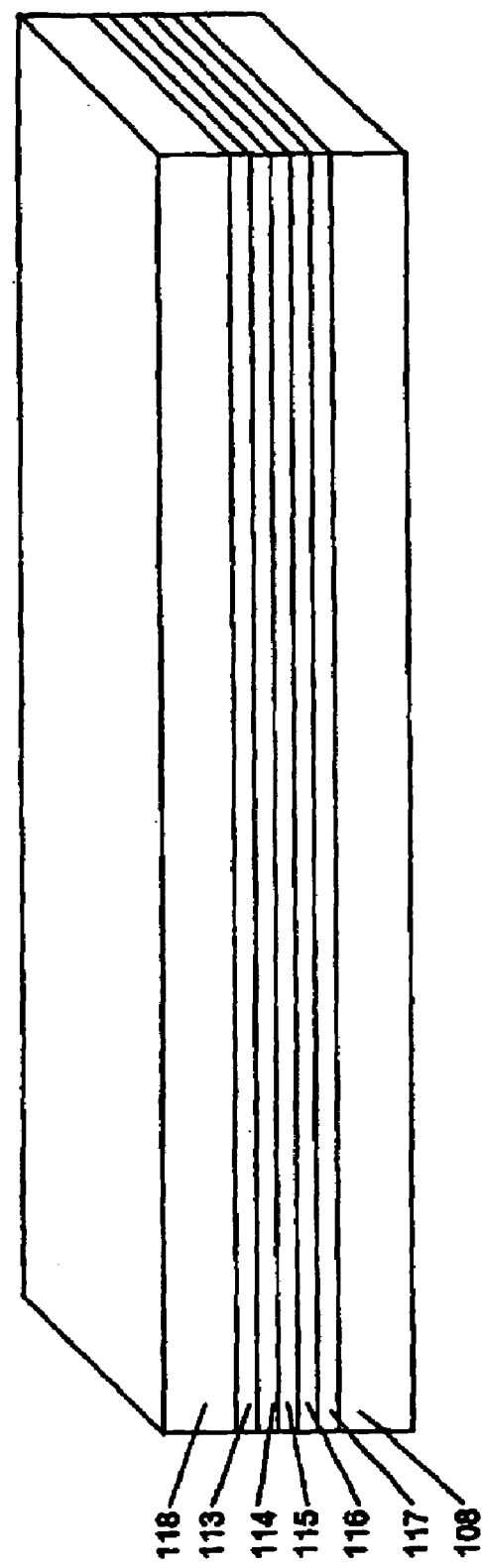
Figure 12C:
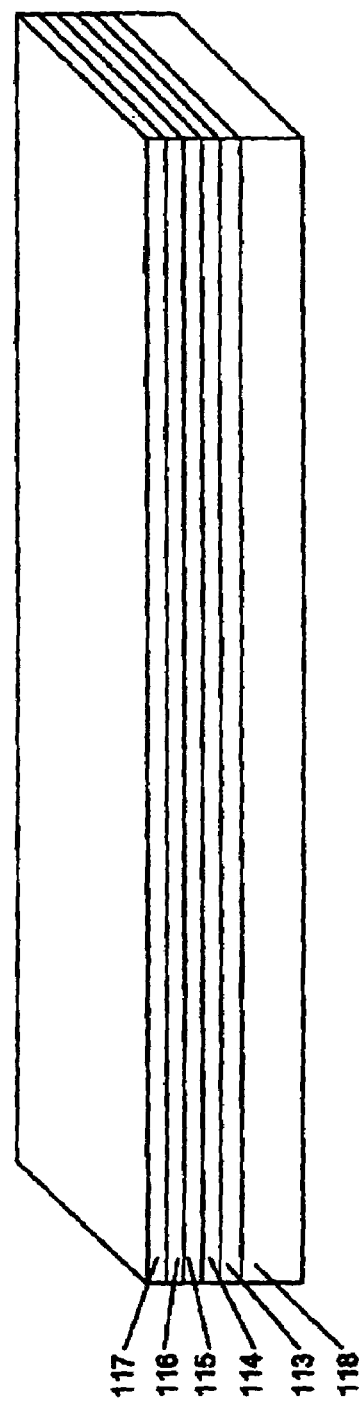
Figure 12D:
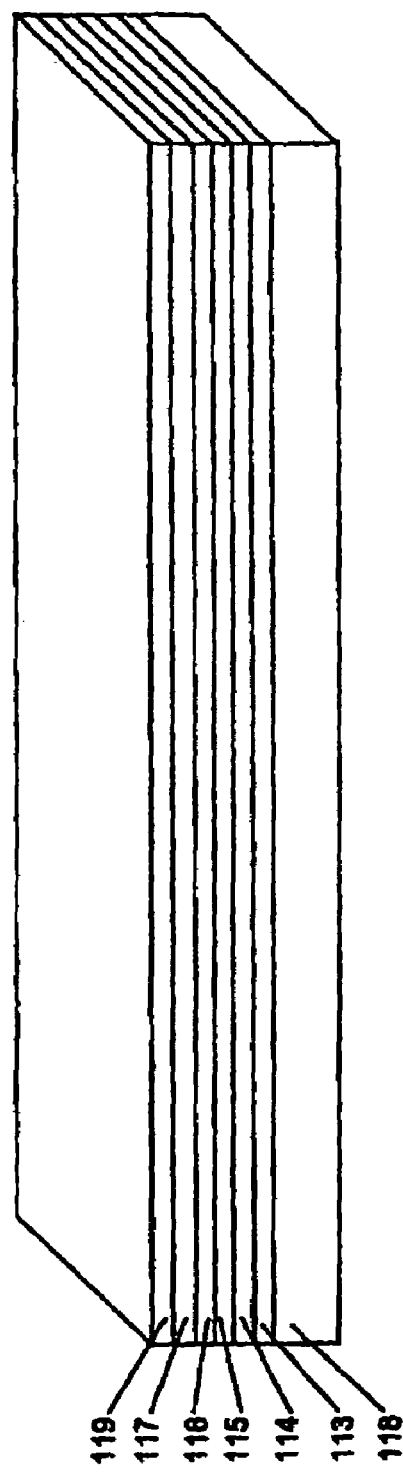
Figure 12E:
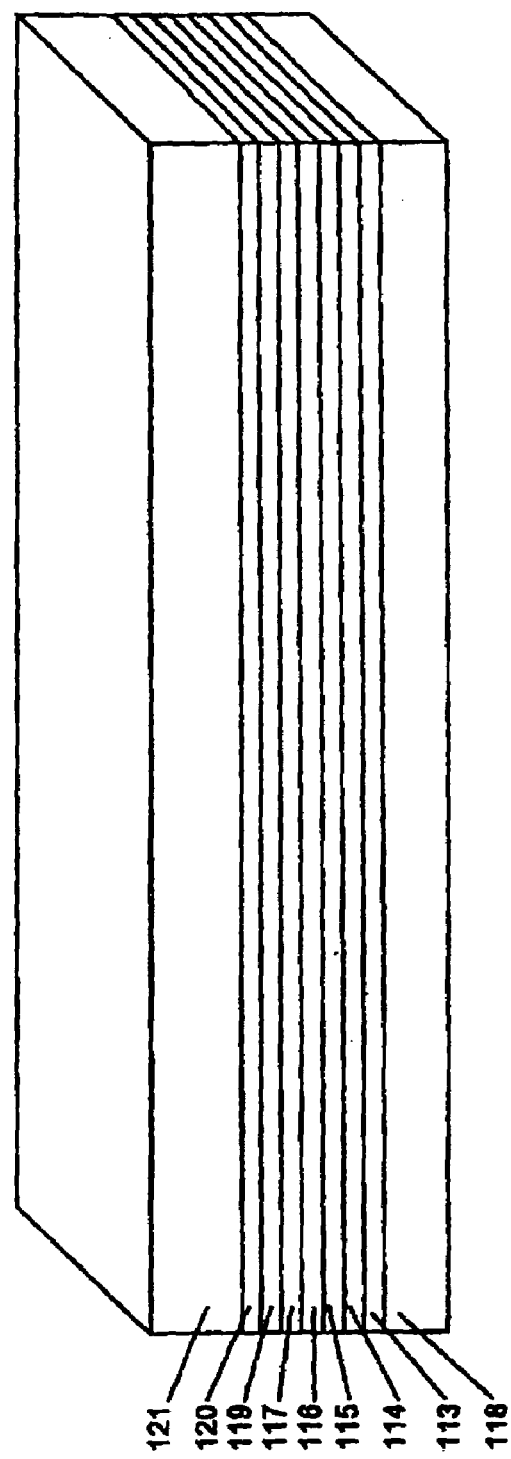
Figure 12F:
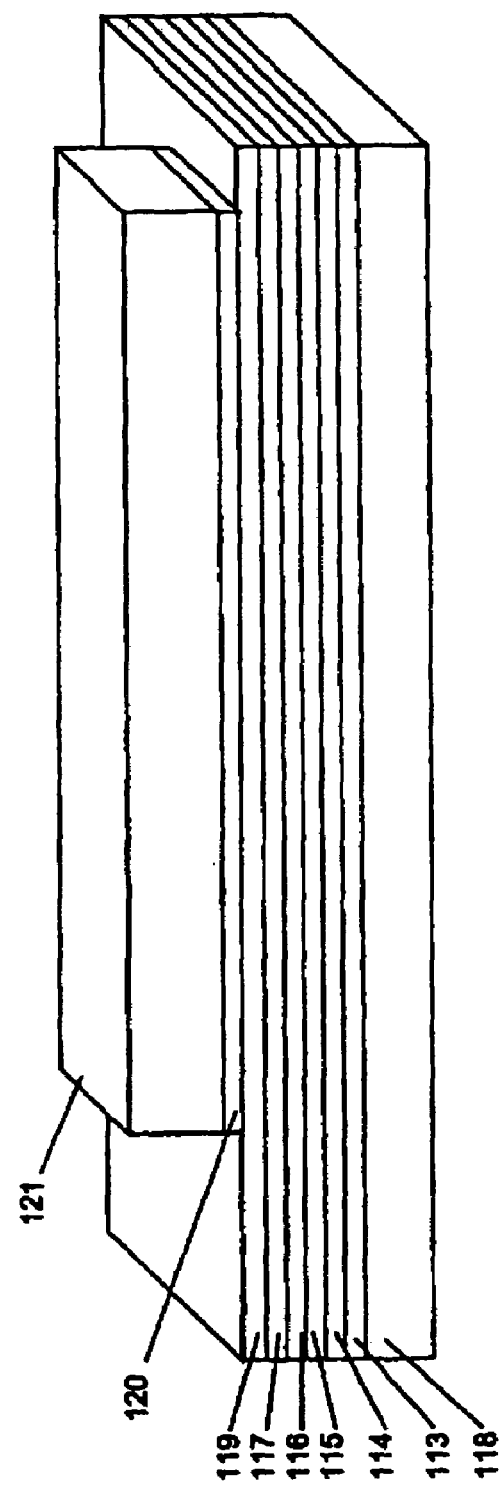
Figure 12G:
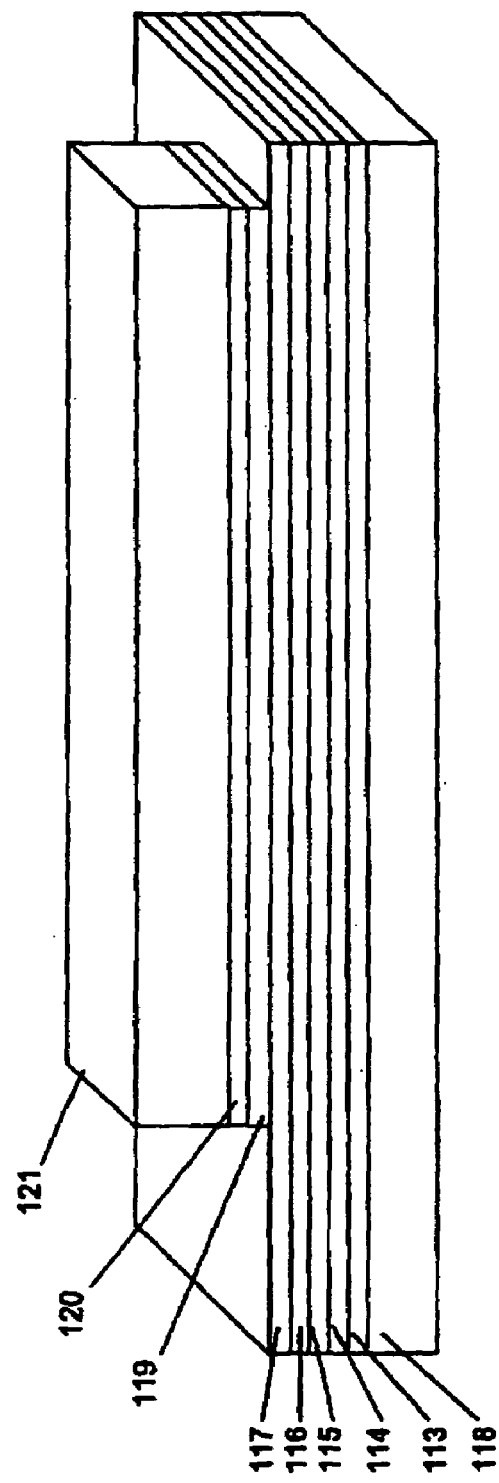
Figure 12H:
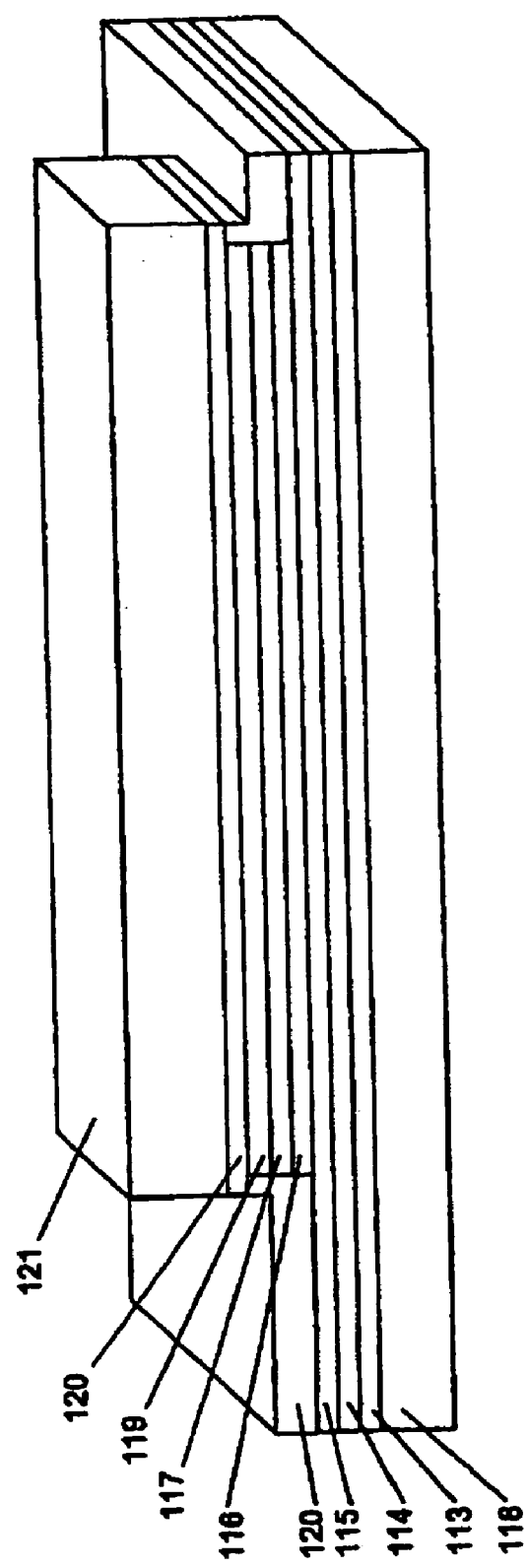
Figure 12I:
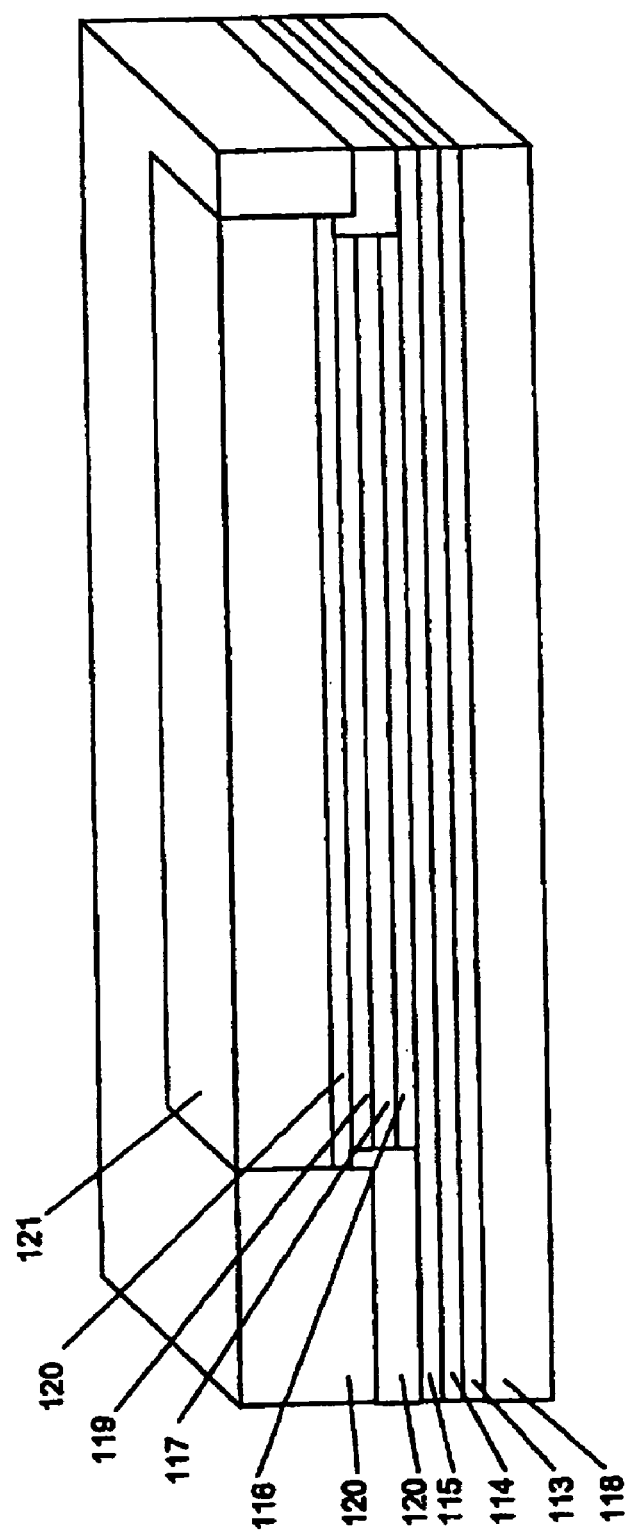
Figure 12J:
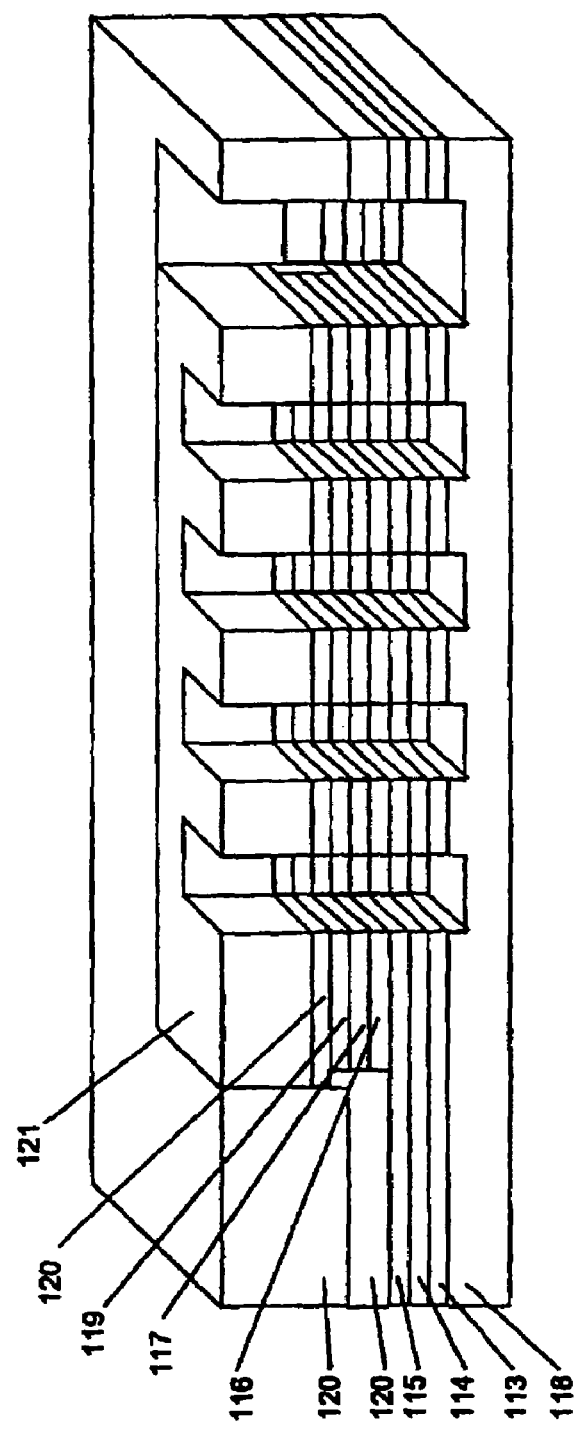
Figure 12K:
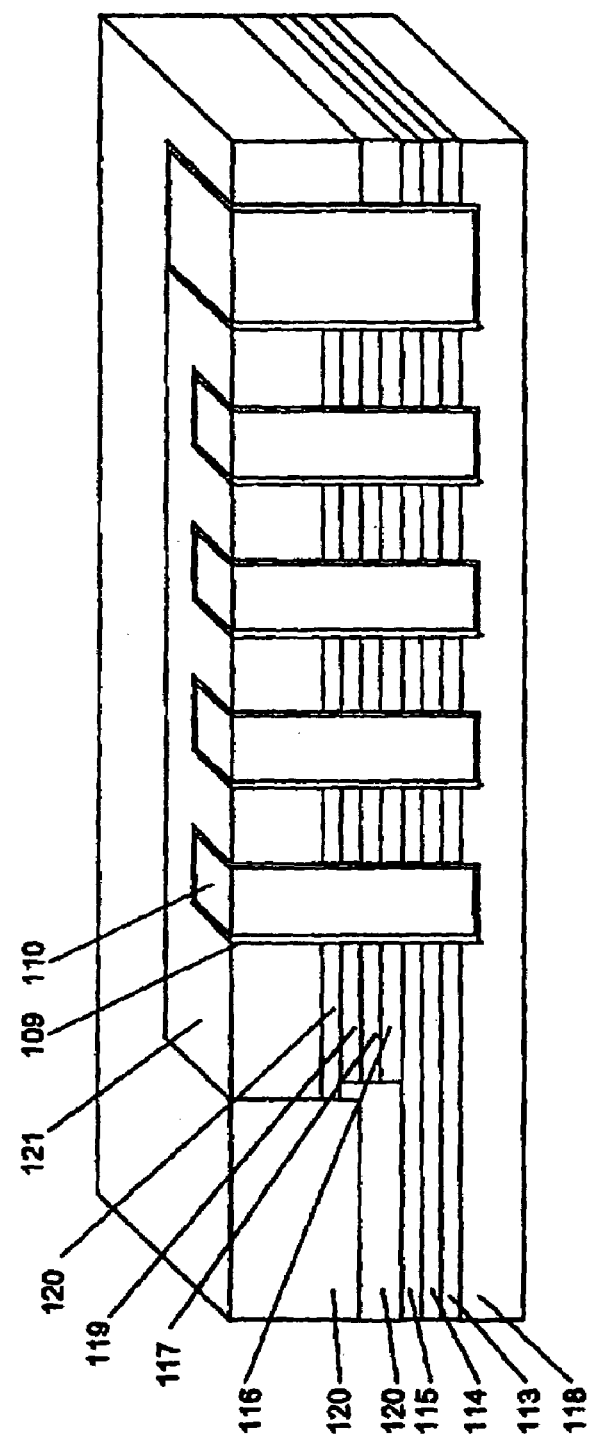
Figure 12L:
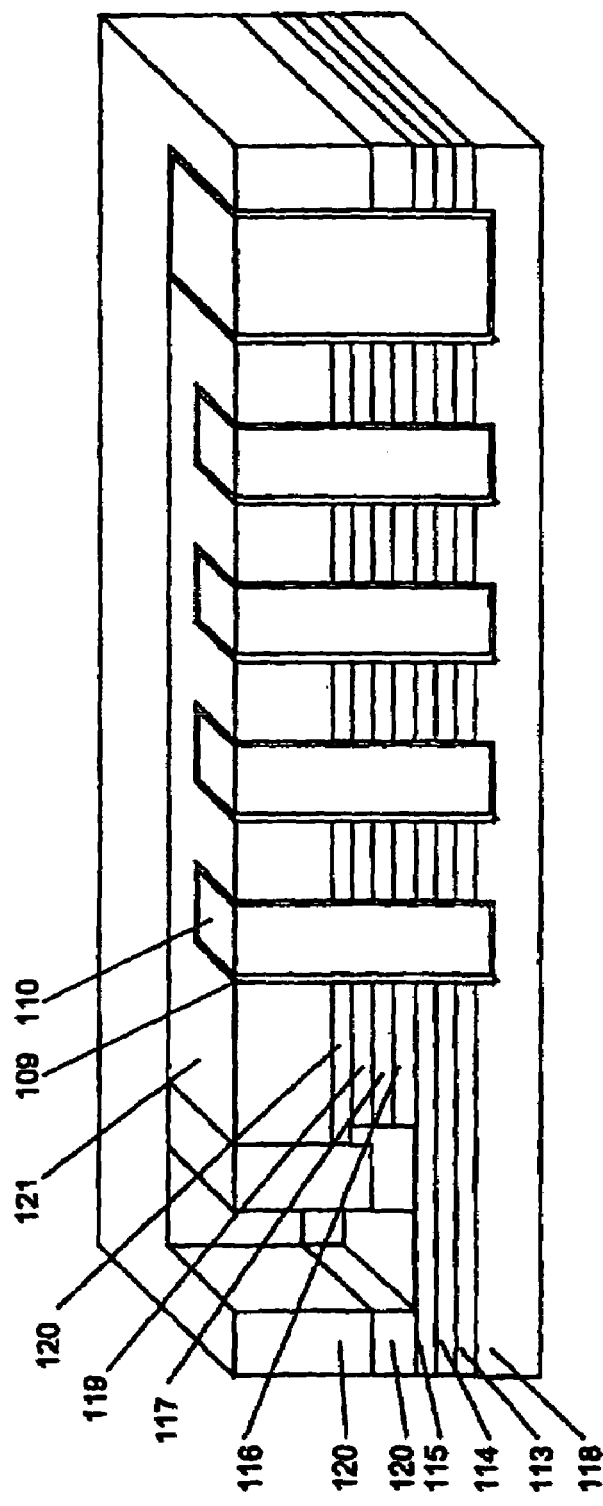
Figure 12M:
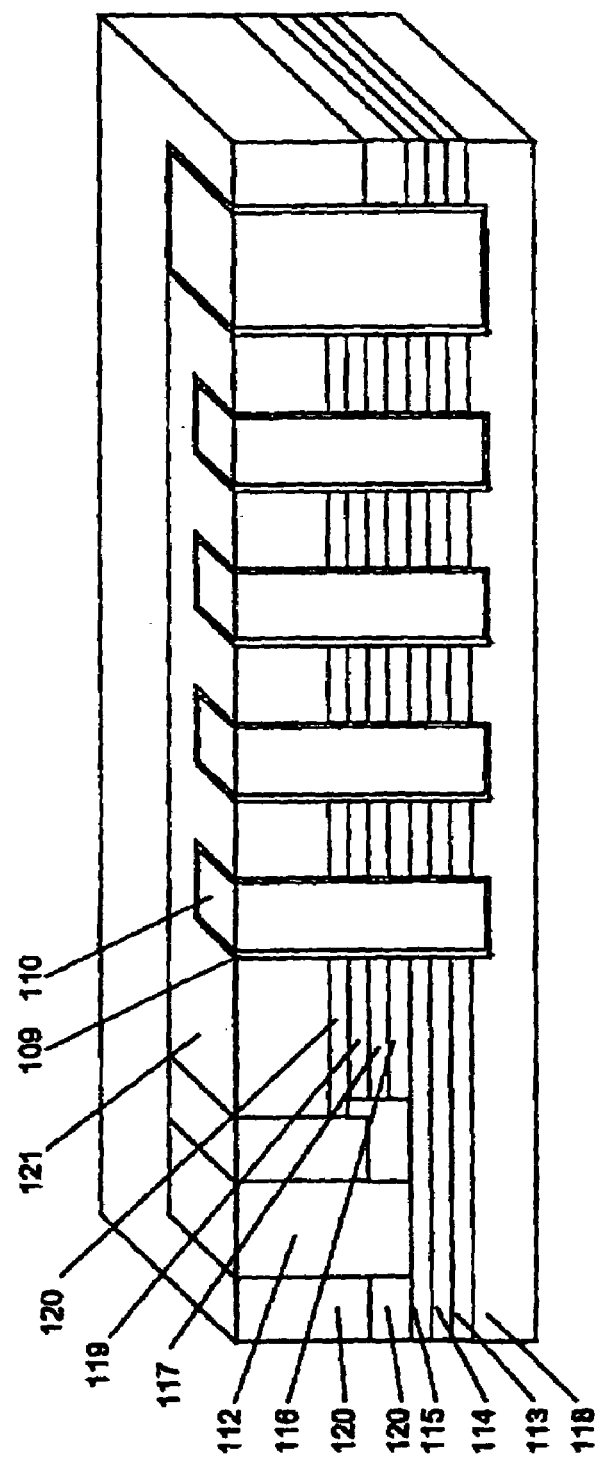
Figure 12N:
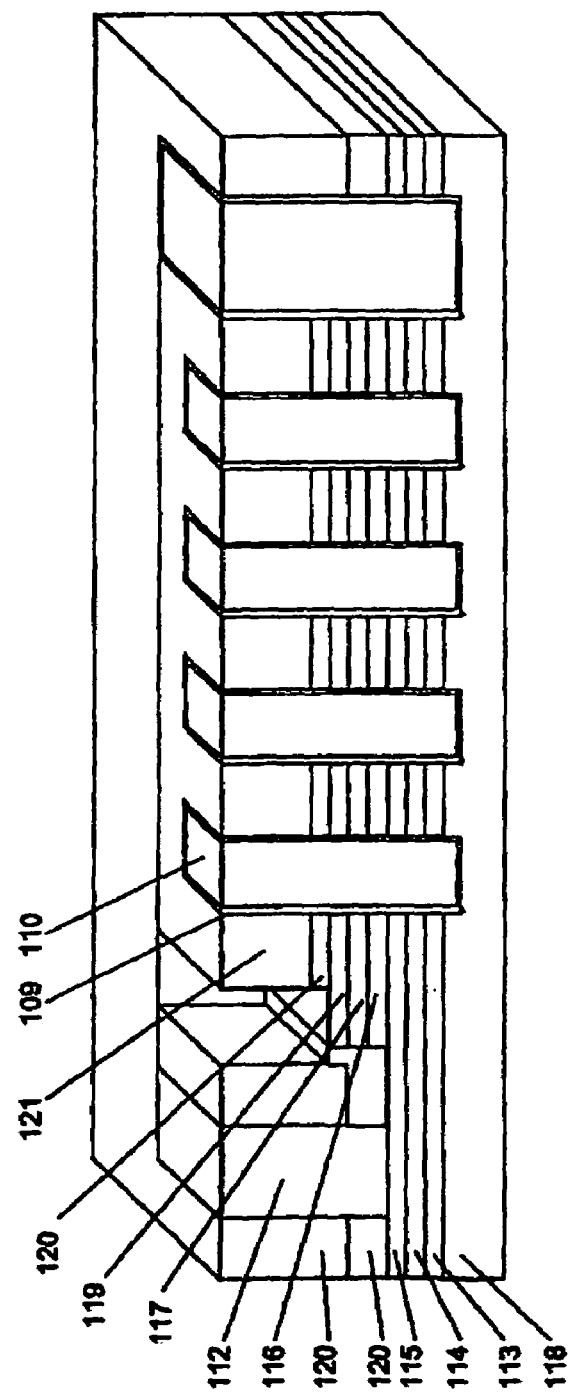
Figure 12O:
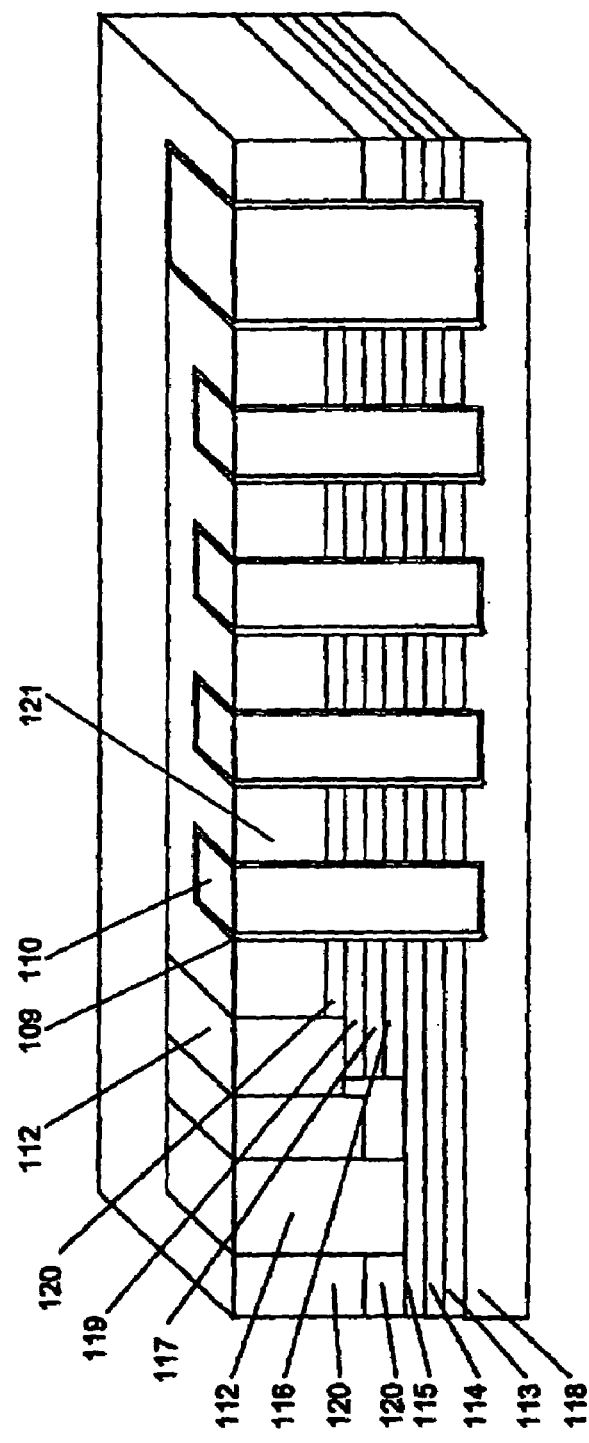
Figure 12P:
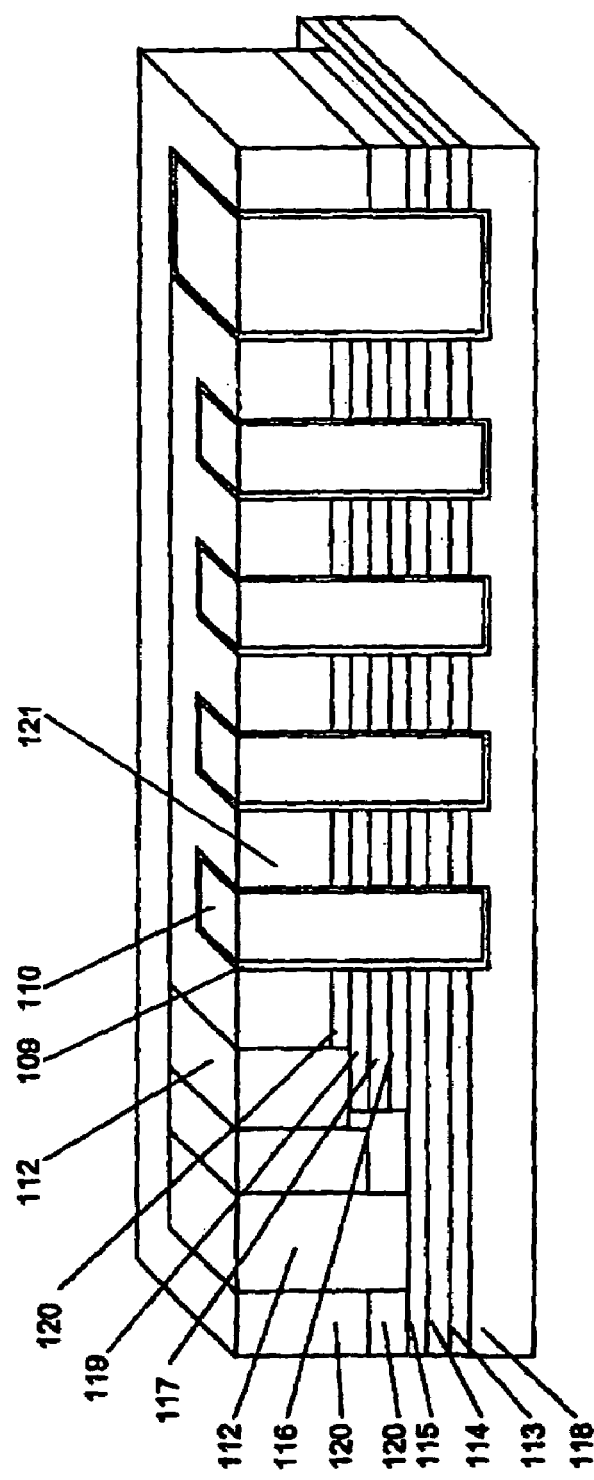
Figure 12Q:
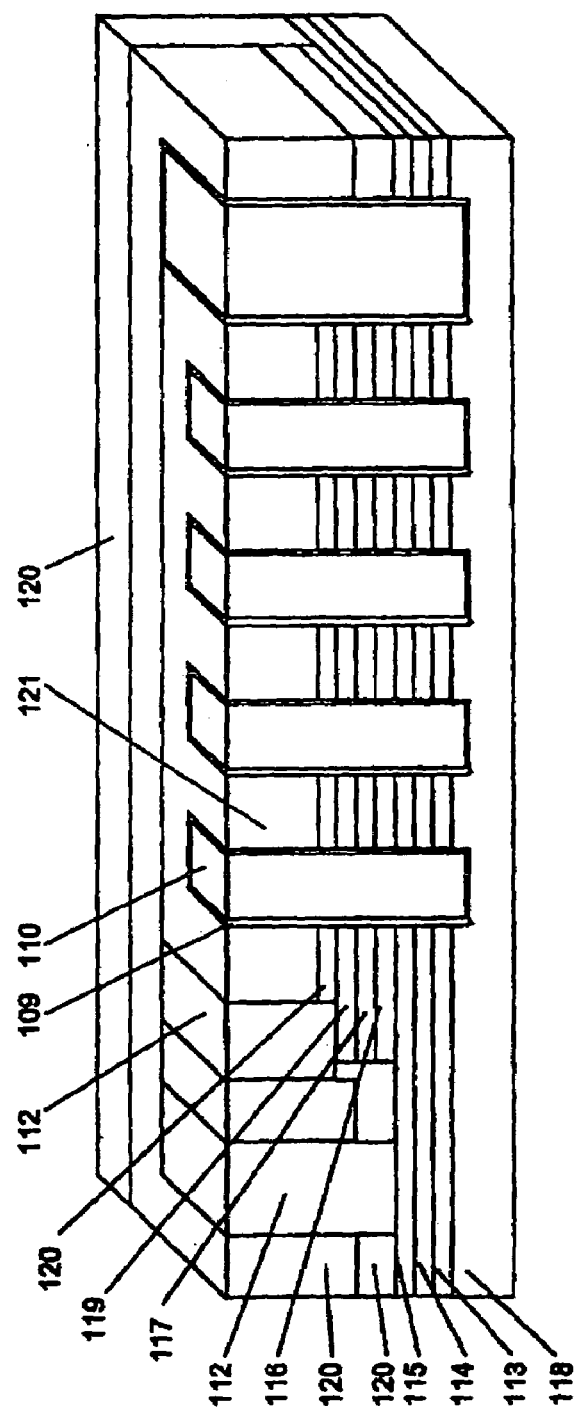
Figure 13A:
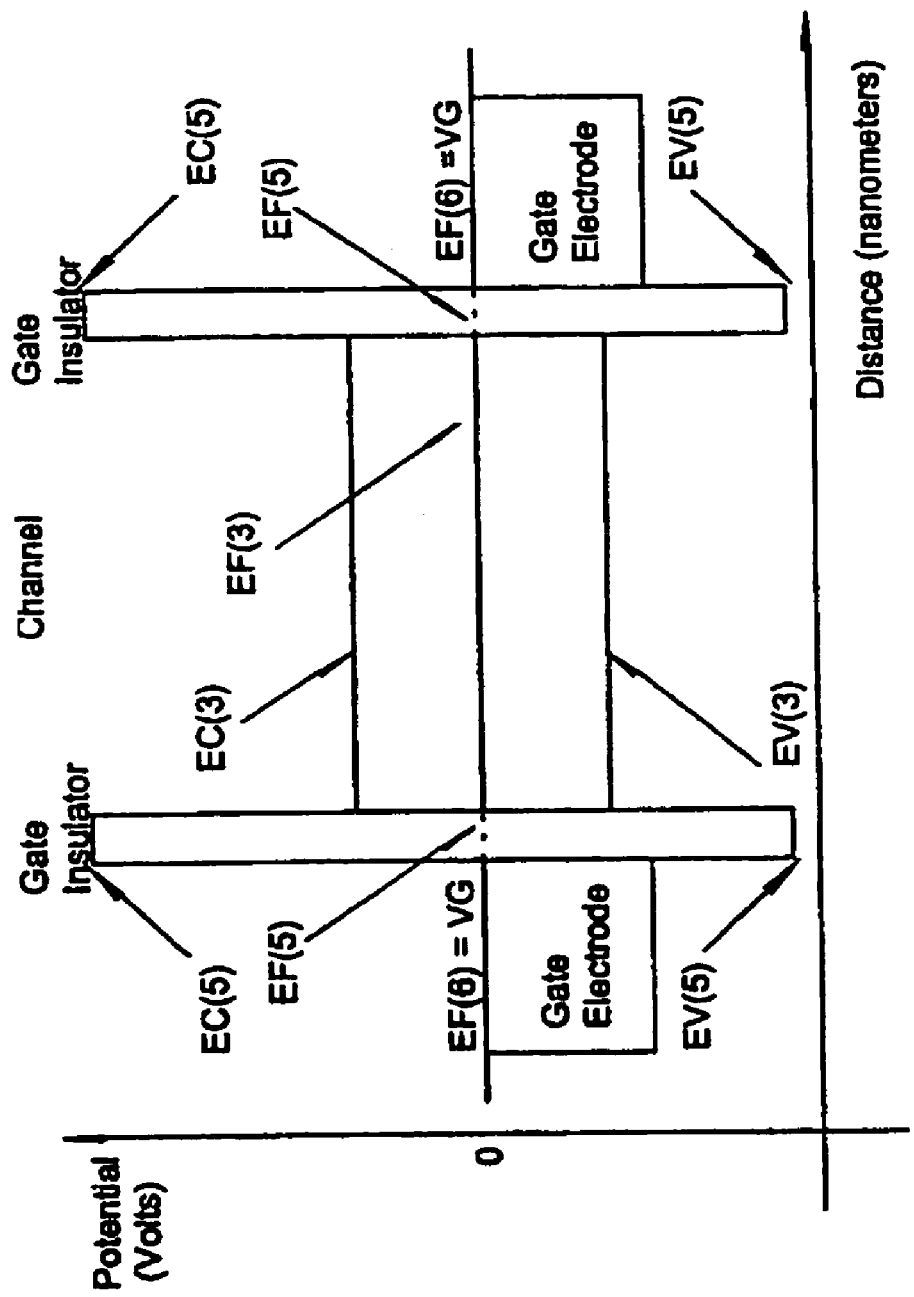
FIG. 13a is a band-diagram, along a horizontal section through the gate electrode, the gate insulator, the channel, the gate insulator and the gate electrode of the device according to FIG. 1 in absence of any applied voltage to any terminal of the device.
Figure 13B:
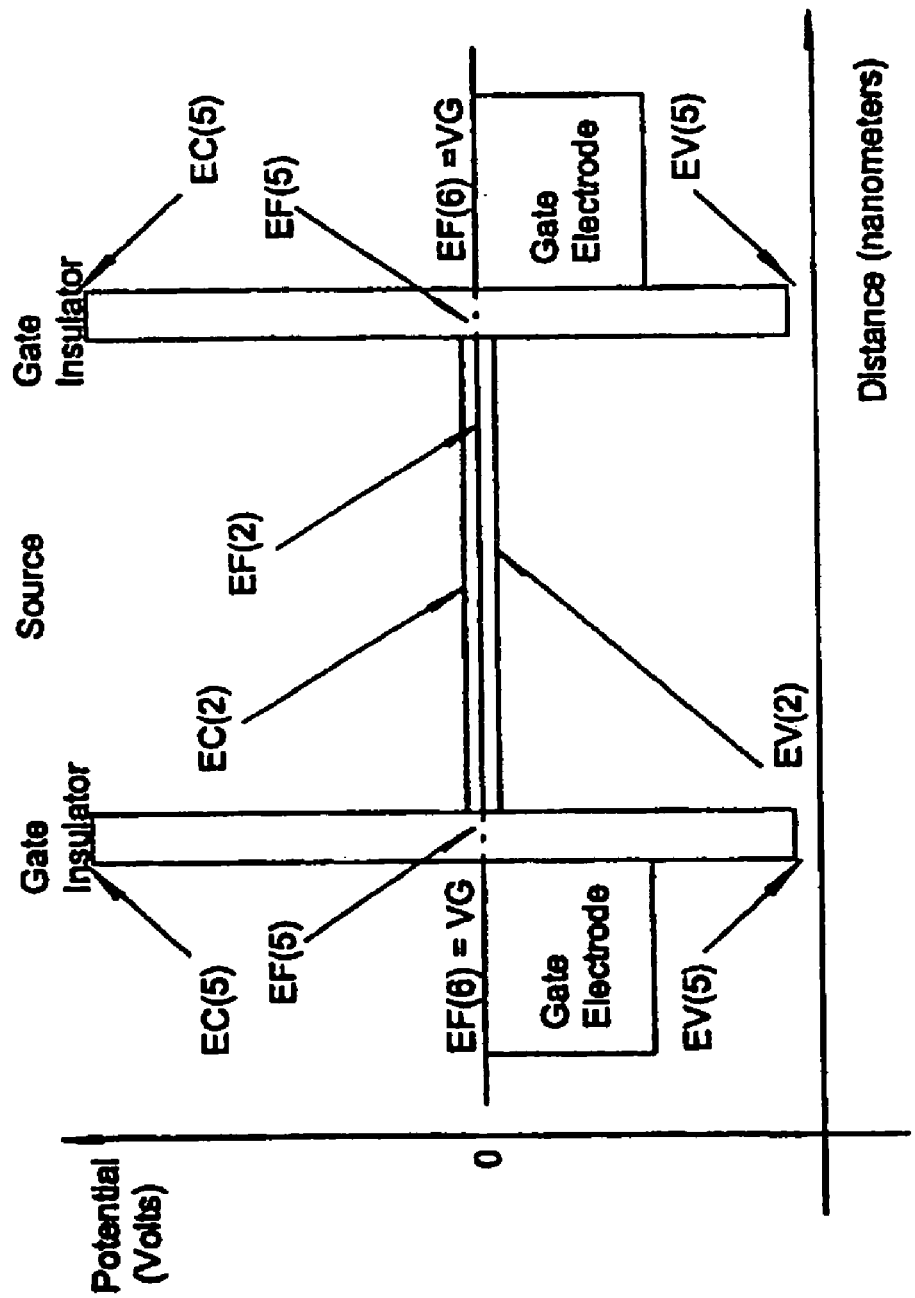
FIG. 13b is a band-diagram, along a horizontal section through the gate electrode, the gate insulator, the source, the gate insulator and the gate electrode of the device according to FIG. 1 in absence of any applied voltage to any terminal of the device.
Figure 13C:
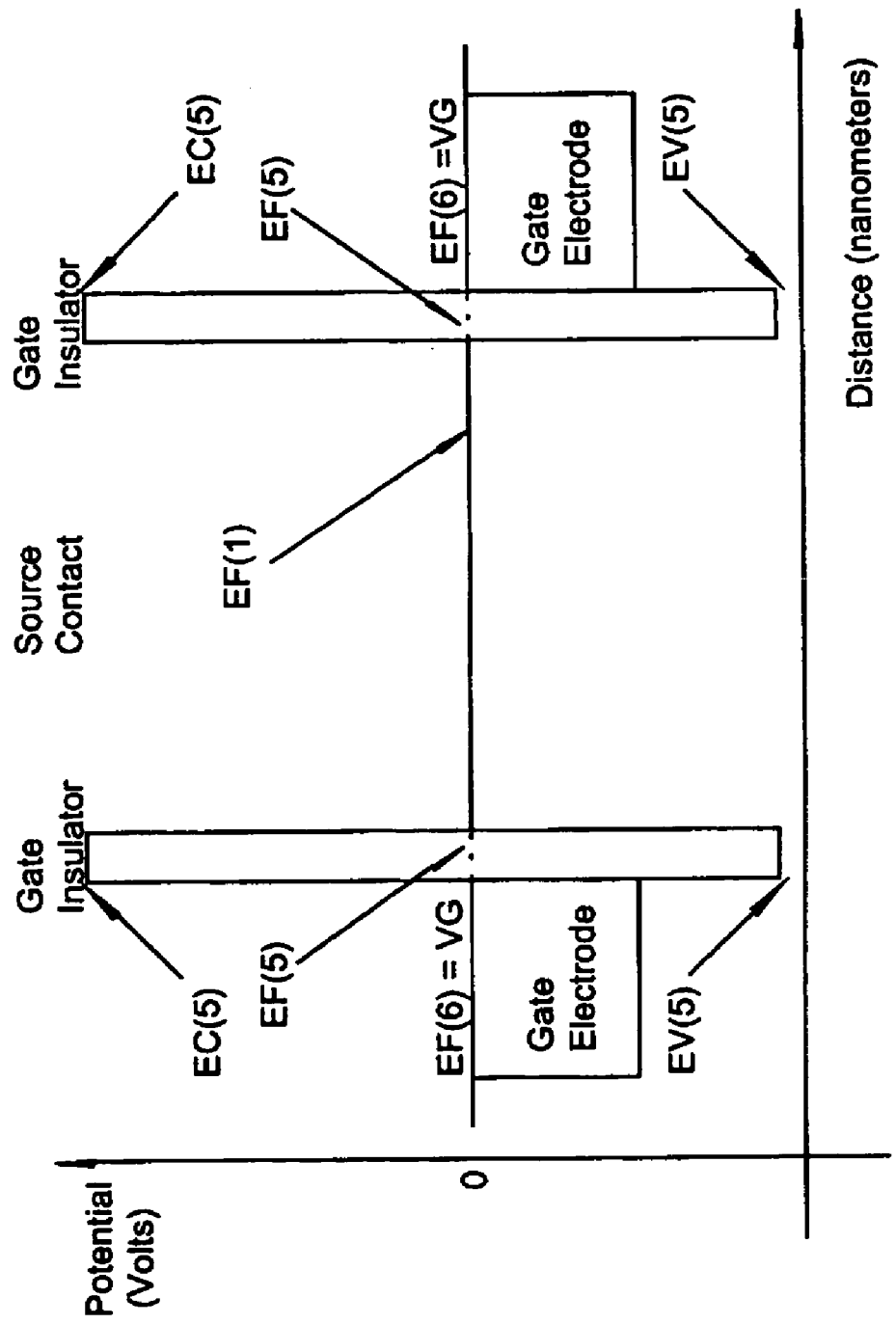
FIG. 13c is a band-diagram, along a horizontal section through the gate electrode, the gate insulator, the source contact, the gate insulator and the gate electrode of the device according to FIG. 1 in absence of any applied voltage to any terminal of the device.
Figure 13D:
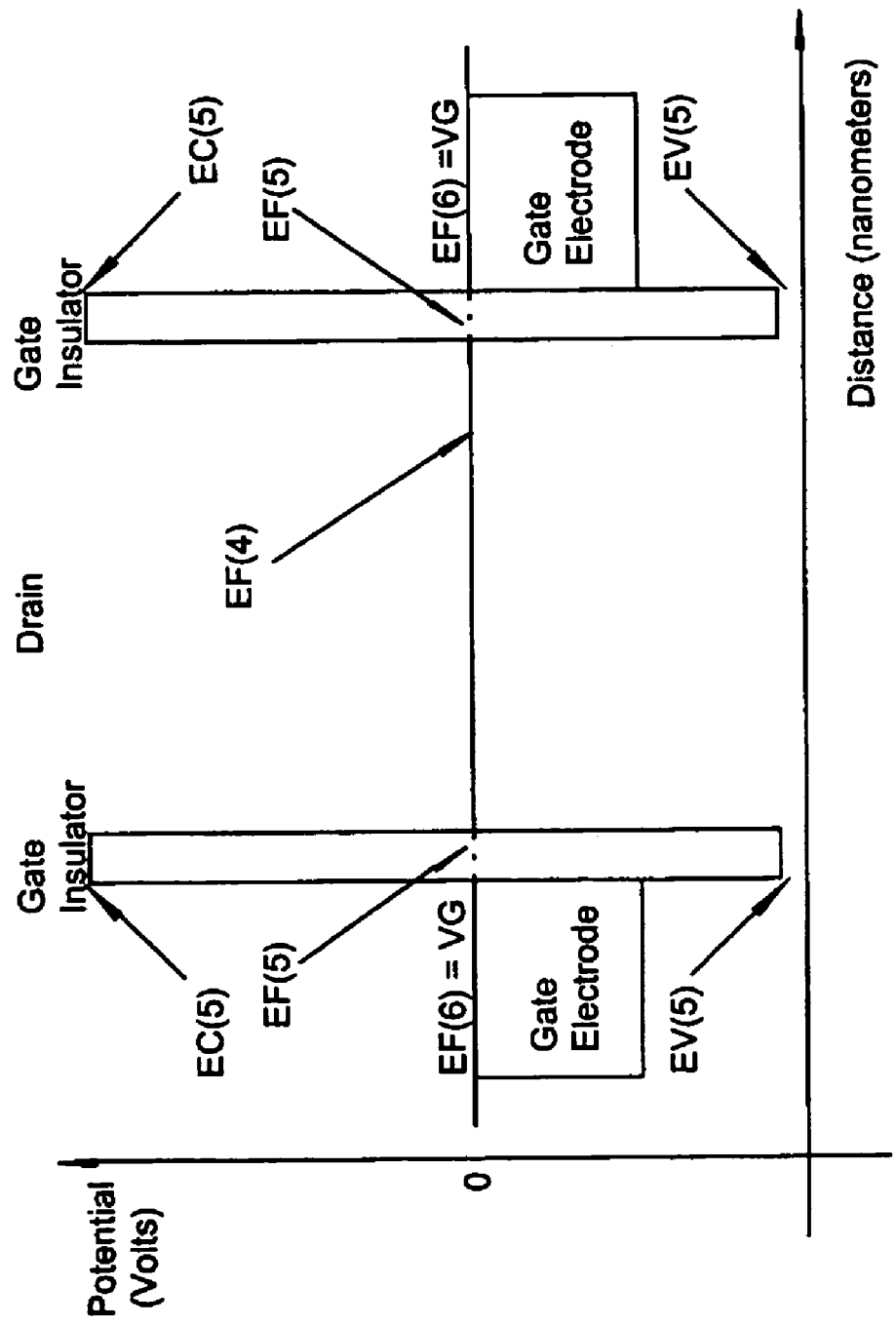
FIG. 13d is a band-diagram, along a horizontal section through the gate electrode, the gate insulator, the drain, the gate insulator and the gate electrode of the device according to FIG. 1 in absence of any applied voltage to any terminal of the device.

The process flow according to FIGS. 12A to 12Q can be used for CMOS logic, with very reduced number of extra processing steps for the inclusion of embedded memory (possibly Ferroelectric).

Germanium Substrate Implementations

It should be kept in mind that there are important differences between substrates of the same material but of different orientations. These differences are relevant for device physics and process technology. For example, for CMOS <100> silicon substrates have been favored over <111> silicon substrates because of two main factors. For gate oxides that are not ultra-thin (e.g., thicker than 3 nm), there are significant advantages regarding reliability, of gate silicon dioxides grown on <100> over <111> [23]. The band structure of Silicon is symmetric along the (100) directions, and the electron effective mass is considerably lower on a plane perpendicular to a (100) direction than it is on a plane perpendicular to the (111) direction. Because charge carrier mobility is directly related to effective mass, NMOS devices made on <100> substrates have much better performance than NMOS devices made on <111> substrates.

However, the picture is considerably different for germanium, whose band structure is symmetric with respect to the <111> directions, and the electron effective mass is also much smaller, i.e., the mobility much higher, when NMOS are made on <111> substrates than on <100> substrates. From a technological point of view, <111> substrates are much easier for the growth of high quality epitaxial layers at low temperature than <100> substrates. This is a surface and crystal related property which is true for both silicon and germanium materials. Therefore, for CMOS made on germanium substrates, <111> is the preferred substrate orientation, regardless if the devices have charge transport parallel to the substrate (horizontal devices) or perpendicular to the substrate (vertical devices).

It has been shown [24, 25] that on <111> Silicon substrates it is possible to fabricate high-quality, fully relaxed, germanium layers, as thin as 10 nm. Such capability does not exist for <100> Silicon substrates, which typically require layers at least 1 m thick in order to have similar transport properties. Therefore, the epitaxial growth of fully relaxed, high-quality thin-films of Germanium on <111> Silicon, and/or Silicon-On-Insulator, substrates may provide the best and most economical route to large germanium "virtual substrates".

The most important aspects of the band alignments for the "Single-Device CMOS" concept are:
 a source layer being made with a material having a source band-gap (EG2) and a source mid-gap value (EGM2), said source layer having a source Fermi-Level (EF2);
 a drain layer having a drain Fermi-Level (EF4);
 a channel layer between the source layer and the drain layer, said channel layer being made with a material having a channel band-gap (EG3) and a channel mid-gap value (EGM3), said channel layer having a channel Fermi level (EF3);
 a source contact layer connected to the source layer opposite the channel layer, said source contact layer having a source contact Fermi-Level (EF1); and
 a gate electrode having a gate electrode Fermi-Level (EF6)
 wherein:
 said source band-gap is substantially narrower (EG2) than said channel band-gap (EG3);
 said source contact Fermi-Level (EF1), said source Fermi-Level (EF2), said channel Fermi-Level (EF3), said drain Fermi-Level (EF4) and said gate electrode Fermi-Level (EF6) are equal to said source mid-gap value (EGM2) and said channel mid-gap value (EGM3), within a predetermined tolerance value, when no voltage is applied to the device.

By providing that the Fermi-Levels are substantially equal to the source and the channel mid-gap values, symmetric paths from source to drain for electrons and for holes are created. This allows the device to behave as an NMOS or PMOS, depending on the voltage applied.

The number of materials, such as semiconductors, insulators, and conductors, whose band alignments are fairly well documented, is far less on germanium than on silicon substrates. Still it is possible identify several possible materials for the different layers in the device. In the following a germanium-based device implementation is suggested, using a tentative list of materials based on information currently available about the respective band alignments with germanium.

Preferential Substrate:
 <111> oriented Germanium bulk wafers, or relaxed Germanium "virtual substrate" on <111> Silicon wafers, or <111> Germanium-On-Insulator (GeOI) wafers.

Figure 14:
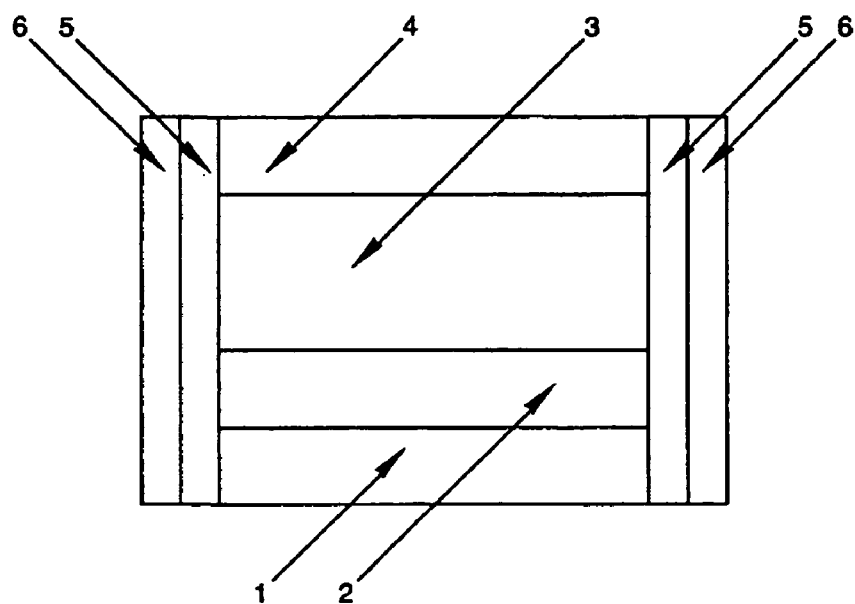
FIG. 14 is a schematic cross section through the layers of one preferred embodiment of the device according to the invention.

Preferential Channel Material (Region 3 in FIG. 14):
 Pure Ge, or strained-layer short period superlattices of GeSiSn/Ge, or GeSi/SeSn or SiSn/Ge.

The criteria for the selection of these materials is related to the absolute magnitude desired for the band-gap of the channel material, and its band offsets with the source material. There are more possibilities to adjust material parameters in the channel material than with the source material. Therefore, it is the composition of the channel material that is adjusted to the source material, rather than the other way around.

It should also be noted that the composition of the channel material can be constant or can be graded from the interface with the source to the interface with the drain. For example, the band offset with the source material is very important to define the threshold voltage, and thus could be adjusted to a certain desired value, perhaps a function of the projected operating voltage for the circuit. The barrier height with the drain material is the most important parameter defining the magnitude of the "Off state" current.

It should also be kept in mind that a certain set of electrical parameters, such as band-gap and band offsets, can be met by different materials, such as a pure elemental semiconductor or a superlattice of alternating different materials.

Preferential Source Material (Region 2 in FIG. 14):
 Ge1-Sn1 strained-layer short period superlattices, strained to <111> Ge substrates.

According to data in the scientific literature [26], this material has a band-gap around 0.1 eV, which at room temperature is about ~4 kBT. This material has symmetric (0.28 eV) conduction- and valence-band offsets with respect to pure germanium [27]. Therefore this material seems to match the ideal characteristics for the source material.

Preferential Source Contact Material (Region 1 in FIG. 14):
 This material should be a conductor, for example a metal or a metal-germamide, whose Fermi-level is aligned with the mid-gap point of the source and channel materials.

Preferential Drain Material (Region 4 in FIG. 14):
 This material should be a conductor, for example a metal or a metal-germanide, whose Fermi-level is aligned with the mid-gap point of the source and channel materials.

Preferential Gate Electrode Material (Region 6 in FIG. 14):
 This material should be a conductor, for example a metal or a metal-germanide, whose Fermi-level is aligned with the mid-gap point of the source and channel materials.

The materials for the Source Contact, Drain, and Gate Electrode can be the same.

At this moment there is a lack of experimental measurements and theoretical predictions about the Schottky barrier height between germanium and metals and/or metal silicides commonly used in silicon microelectronics. However, it is to be expected that some of these metals, metal-silicides or metal-germanides will be found to have work-function values near the mid-gap level of germanium.

Preferential Gate Insulator Material (Region 5 in FIG. 14):

The gate insulator can be chosen from a large number of materials. Recent publications show that GeON (germanium oxynitride) [20, 21], and ZrO2 [20] are good candidates. Other candidates include epitaxial insulators such as BaTiO [22].

References

[1] "Vertical MOS Technology with sub 0.1 um Channel Lengths", H. Gossner, F. Wittman, I. Eisele, T. Grabolla, D. Behammer; Electronics Letters, 3rd of Aug. 1995, Vol. 31, No. 16, pp.1394–1395.

[2] "Novel Transport Simulation of Vertically-Grown MOSFETs, by Cellular Automaton Method", A. Rein, G. Zandler, M. Sarantini, P. Lugli, P. Vogl; IEDM 1994, pp. 351–354.

[3] U.S. Provisional Patent Application No. 60/001,022; Jul. 11, 1995, "Vertical MOSFET Devices, Process of Manufacturing Them", Carlos J. R. P. Augusto.

[4] "Monte Carlo Simulation of a 30 nm Dual-Gate MOSFET: How Short Can Si Go?", D. J. Frank, S. E. Laux, and M. V. Fischetti, IEDM 1992, pp. 553–556.

[5] U.S. Provisional patent application Ser. No. 08/664,874; Jun. 17, 1996 "DRAM Applications using Vertical MISFET Devices", Carlos J. R. P. Augusto

[6] "Impact of a Vertical F-Shape, Transistor (VFT) Cell for 1 Gbit DRAM and Beyond", S. Maeda, S. Maegawa, T. Ipposhi, H. Nishimura, H. Kuriyama, O. Tanina, Y. Inoue, T. Nishimura, N. Tsubouchi; IEEE Transactions on Electron Devices, Vol. 42, No. 12, December 1995.

[7] "ROS: An Extremely High Density Mask ROM Technology Based On Vertical Transistor Cells", E. Bertagnolli, F. Hofmann, J. Willer, R. Maly, F. Lau, P. W. von Basse, M. Bollu, R. Thewes, U. Kollmer, U. Zimmermann, M. Hain, W. H. Krautschneider, A. Rusch, B. Hasler, A. Kohlhase, H. Klose; Symposium on VLSI Technology Digest of Technical Papers, pp. 58–59, 1996.

[8] "SiGeC: Band Gaps, Band Offsets, Optical Properties, and Potential Applications", K. Brunner, O. G. Schmidt, W. Winter, K. Eberl, M. Glück, U. König; J. Vac. Sci. Technol. B 16(3), May/Jun. 1998, pp. 1701–1706.

[9] "Novel Polysilicon/TiN Stacked-Gate Structure for Fully-Depleted SOI/CMOS"; Jeong-Mo Hwang, Gordon Pollack, IEDM 1992, pp. 45–348.

[10] "A New Type of Tunnel-Effect Transistor Employing Interna Field Emission of Schottky Barrier Junction", R. Hattori, A. Nakae, J. Shirafuji; Jpn. J. Appl. Phys., Vol. 31 (1992), pp. L1467–L1469.

[11] "Numerical Simulation of Tunnel Effect Transistors Employing Internal Field Emission of Schottky Barrier Junction", R. Hattori, J. Shirafuji; SSDM 1993, pp. 258–260.

[12] "Pulsed Laser Deposition of Epitaxial Si/TiN/Si (100) Heterostructures"; R. Chowdhury, X. Chen, J. Narayan, Appl. Phys. Lett. 64(10), 7 Mar. 1994.

[13] "Epitaxial TiN Based Contacts for Silicon Devices"; R. D. Vispute, J. Narayan, Journal of Electronics Materials, Vol. 25, No. 11, 1996, pp.1740–1747.

[14] "Epitaxial Growth of TiN (100) on Si (100) by Reactive Magnetron Sputering at Low Temperature"; W-H. Sheu, S-T. Wu, Jpn. J. Appl. Phys. Vol.37, (1998) pp.3446–3449, Part I, No. 6A, June 1998.

[15] "Atomic Layer Epitaxy Growth of TiN Thin Films from TiI4 and NH3"; M. Ritala, M. Leskelä, E. Rauhala, J. Jakinen; J. Electrochem. Soc. Vol. 145, No. 8, August 1998, pp. 29142920.

[16] "Atomic Layer Deposition of TiN Films by Alternate Supply of Tetrakis(ethylmethylamino)-Titanium and Amonia"; J-S. Min, Y-W. Son, W-G. Kang, S-S. Chun, S-W. Kang, Jpn. J. Appl. Phys. Vol. 37, (1998) pp. 4999–5004, Part I, No. 9A, September 1998.

[17] "Study of Dielectric Properties of BaTiO3 Thin Films on Si (100) with TiN Buffer Layer"; N. Shu, A. Kumar, M. R. Alam, H. L. Chan, Q. You, Applied Surface Science 109/10 (1997), pp. 366–370.

[18] "Structural and Dielectric Properties of Epitaxial SrTiO3 Films Grown on Si (100) Substrate with TiN Buffer Layer", M. B. Lee, H. Koinuma, J. Appl. Phys. 81(5), 1 Mar., 1997.

[19] "A Sub-400° C. Germanium MOSFET Technology with High-k Dielectric and Metal Gate", C. O. Chui, H. Kim, D. Chi, B. B. Triplett, P. C. McIntyre, K. C. Saraswat, 2002 IEDM, pp. 437–440.

[20] "High Mobility p-channel Germanium MOSFETs with a Thin Oxynitride Gate Dielectric", H. Shang, S. E. Steen, S. A. Cordes, H.-S. P. Wong, E. C. Jones, W. E. Haensch, 2002 IEDM, pp. 441–444.

[21] "Electrical characterization of germanium p-channel MOSFETs", H. Shang, H. Okorn-Schimdt, J. Ott, P. Kozlowski, S. Steen, E. C. Jones, H.-S. P. Wong, W. Hanesch, IEEE Elect. Dev. Lett., Vol. 24 No. 4, April 2003, Page(s): 242–244.

[22] "Physical Structure and Inversion Charge at a Semiconductor Interface with a Crystalline Oxide", R. A. McKee, F. J. Walker, M. F. Chrisholm, Science Vol. 239, 20 Jul. 2001, pp. 468–471.

[23] "Ultrathin Gate Oxide CMOS on (111) Surface-Oriented Si Substrate", H. S. Momose, T. Ohguro, S. Nakamura, Y. Toyoshima, H. Ishiuchi, H. Iwai, IEEE TED, Vol. 49, No. 9, September 2002, pp. 1597–1605.

[24] "Enhanced Sb segregation in surfactant-mediated-heteroepitaxy: High-mobility, low-doped Ge on Si", D. Reinking, M. Kammler, M. Horn-von Hoegen, K. R. Hofmann, Appl. Phys. Lett. Vol. 71, No. 7, 18 Aug. 1997, pp. 924–926.

[25] "Surfactant-grown low-doped germanium layers on silicon with high electron mobilities", K. R. Hofmann, D. Reinking, M. Kammler, M. Horn-von Hoegen, Thin Solid Films 321, 26 May 1998, pp. 125–130.

[26] See Table V in "Electronic structure of Sn/Ge superlattices", D. Munzar, N. E. Christensen, Phys. Rev. B, Vol. 49, No. 16, 15 Apr., 1994–11, pp. 11238–11247.

[27] See FIG. 5 in "Theoretical study of band-edge states in Sn1Gen strained-layer superlattices", M. willatzen, L. C. Lew Yan Voon, P. V. Santos, M. Cardona, D. Munzar, N. E. Christensen, Phys. Rev. B, Vol. 52, No. 7, 15 Aug., 1995-I, pp. 5070–5081.

What is claimed is:

1. A device comprising a drain, a gate, a channel, and a source, having sufficiently symmetric paths from source to drain for electrons and for holes such that the device acts like a NMOS when drain to source (VDS) and gate to source (VGS) voltages are positive, and acts like a PMOS when drain to source (VDS) and gate to source (VDS) voltages are negative, and wherein a source to channel barrier height can be modulated by a field-effect, and a channel to drain barrier height is not affected by gate bias.

2. The device of claim 1 wherein the device is a metal insulator semiconductor field effect transistor (MISFET) comprising source, drain, and gate regions wherein the electrostatic potential in each of the source, drain, and gate regions is symmetric for electrons and holes, with the source to channel interface being different from the channel to drain interface.

3. The MISFET of claim 2 comprising:
a source layer being made with a material having a source band-gap (EG2) and a source mid-gap value (EGM2), said source layer having a source Fermi-Level (EF2);
a drain layer having a drain Fermi-Level (EF4);
the channel comprising a channel layer between the source layer and the drain layer, said channel layer being made with a material having a channel band-gap (EG3) and a channel mid-gap value (EGM3), said channel layer having a channel Fermi-Level (EF3);
a source contact layer connected to the source layer opposite the channel layer, said source contact layer having a source contact Fermi-Level (EF1); and
a gate electrode having a gate electrode Fermi-Level (EF6) wherein:
said source band-gap (EG2) is substantially narrower than said channel band-gap (EG3);
said source contact Fermi-Level (EF1), said source Fermi-Level (EF2), said channel Fermi-Level (EF3), said drain Fermi-Level (EF4) and said gate electrode Fermi-Level (EF6) are equal to said source mid-gap value (EGM2) and said channel mid-gap value (EGM3), within a predetermined tolerance value, when no voltage is applied to the device such that all electrodes are at the same potential.

4. The MISFET of claim 3 comprising:
a epitaxial titanium nitride (TiN) source contact;
a source layer coupled to the source contact, the source layer comprising Si1-x-yGexCy alloys, or superlattices of alternating Si1-xGex and Si1-yCy;
an un-doped silicon (Si) channel layer coupled to the source layer;
an epitaxial titanium nitride (TiN) drain layer coupled to the channel layer;
a titanium nitride (TiN) gate electrode coupled to at least one of the source layer, undoped silicon channel layer, and drain layer via an insulator.

5. The MISFET of claim 3, wherein the first band-gap is at least 9 to 10 times narrower than said second band-gap.

6. The MISFET of claim 5, wherein the first band-gap (EG2) is in the order of 0.1 to 0.12 electron-volts (eV) and the second band-gap (EG3) is in the order of 1.0 to 1.2 electron-volts (eV).

7. The MISFET of any one of claims 3, 5, and 6, wherein the predetermined tolerance value is lower than 10%, respectively, preferably lower than 5% of the channel band-gap.

8. The MISFET of claim 1 comprising a channel, the channel consisting essentially of Ge or strained-layer short period superlattices of GeSiSn/Ge, or GeSi/SeSn or SiSn/Ge.

9. The MISFET of claim 1 wherein the source consists essentially of Gel-Snl strained-layer short period superlattices, strained to 111 Ge substrates.

10. The MISFET of claim 1 wherein the source comprises a material having a band-gap around 0.1 eV.

11. The MISFET of claim 1 comprising a source contact that is a conductor whose Fermi-level is aligned with the mid-gap point of the source and channel materials.

12. The MISFET of claim 1 wherein the drain comprises a material that is a conductor whose Fermi-level is aligned with the mid-gap point of the source and channel materials.

13. The MISFET of claim 1 comprising a gate electrode, the gate electrode comprising a material that is a conductor whose Fermi-level is aligned with the mid-gap point of the source and channel materials.

14. The MISFET of claim 1 wherein the gate insulator comprises at least one of: GeON (germanium oxynitride), ZrO2 and, BaTiO.

15. The MISFET of claim 1 comprising a source contact and a gate electrode wherein the same materials are used for the source contact, drain, and gate electrode.

16. A device comprising a drain, a source, channel, gate(s), and source, gate, and drain electrodes, wherein:
the source is coupled to the channel at a source to channel interface, wherein a source to channel barrier height can be modulated by a field-effect, and a channel to drain barrier height is not affected by gate bias;
the channel is coupled to the drain at a channel to drain interface;
the source to channel interface differs from the channel to drain interface; and
the electrostatic potential for electrons and holes is symmetric with respect to the mid-gap level, along a cut from source to drain, on a plane near an interface with a gate and on a plane far from an interface with a gate, when zero voltage is applied to the source, drain, and gate electrodes.

17. A device comprising a drain, a source, channel, and gate(s) wherein:
the source is coupled to a channel at a source to channel interface, wherein a source to channel barrier height can be modulated by a field-effect, and a channel to drain barrier height is not affected by gate bias;
the channel is coupled to the drain at a channel to drain interface;
the source to channel interface differs from the channel to drain interface; and
any cut along a line perpendicular to the plane of a gate, through the source layers, or through the channel layers, or the drain layers, exhibits a flat band condition along that line.

* * * * *